(12) United States Patent
Garcia et al.

(10) Patent No.: US 8,424,197 B2
(45) Date of Patent: Apr. 23, 2013

(54) AUTOMATED TWIST PIN ASSEMBLING METHOD FOR INTERCONNECTING STACKED CIRCUIT BOARDS IN A MODULE

(75) Inventors: Steven E. Garcia, Kemah, TX (US); Randall J. Boudreaux, Colorado Springs, CO (US)

(73) Assignee: Medallion Technology, LLC, Houston, TX (US)

( * ) Notice: Subject to any disclaimer, the term of this patent is extended or adjusted under 35 U.S.C. 154(b) by 0 days.

(21) Appl. No.: 13/332,888

(22) Filed: Dec. 21, 2011

(65) Prior Publication Data

US 2012/0117800 A1 May 17, 2012

Related U.S. Application Data

(60) Division of application No. 12/717,050, filed on Mar. 3, 2010, now Pat. No. 8,141,238, which is a continuation-in-part of application No. 11/894,874, filed on Aug. 22, 2007, now Pat. No. 7,797,821.

(51) Int. Cl.
   *B23P 19/00* (2006.01)
(52) U.S. Cl.
   USPC .................... 29/747; 29/844; 29/868; 29/748

(58) Field of Classification Search ............ 29/884–886, 29/868, 844, 857, 729, 739, 33 M; 81/302, 81/421
See application file for complete search history.

(56) References Cited

U.S. PATENT DOCUMENTS

| | | | |
|---|---|---|---|
| 7,797,821 B2* | 9/2010 | Garcia et al. .................... | 29/747 |
| 8,141,238 B2* | 3/2012 | Garcia et al. .................... | 29/747 |
| 2012/0117800 A1* | 5/2012 | Garcia et al. .................... | 29/844 |

\* cited by examiner

*Primary Examiner* — Minh Trinh
(74) *Attorney, Agent, or Firm* — John R. Ley

(57) ABSTRACT

Twist pin z-axis interconnectors are assembled in columns of aligned vias in stacked printed circuit boards of a circuit module in automated assembly cycles. Each assembly cycle involves singulating a single twist pin from a plurality of twist pins, inserting the twist pin into the via column, gripping a leader portion of the twist pin, pulling the gripped leader portion until a connection portion moves into contact with the vias of the column, severing the leader portion from the connection portion, extracting the severed leader portion, and automatically repeating assembly cycles until interconnectors have been assembled into a substantial majority of the via columns of the circuit module.

14 Claims, 26 Drawing Sheets

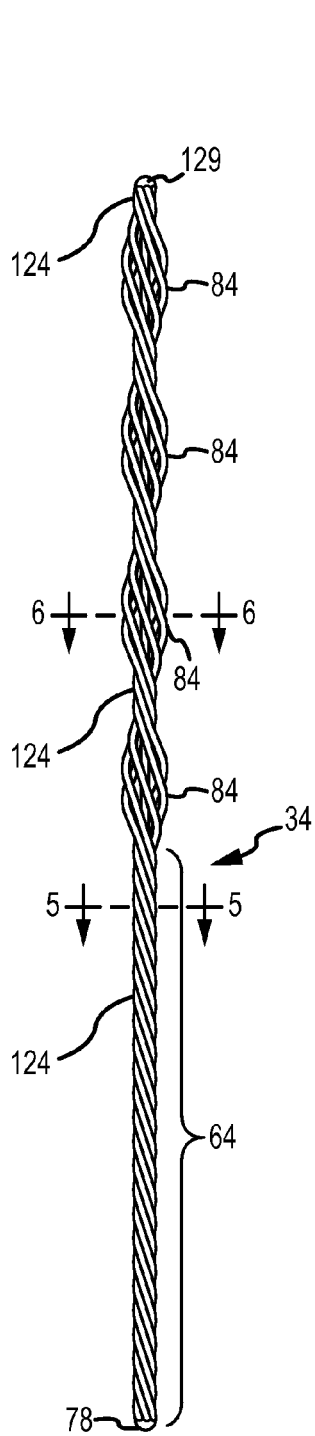
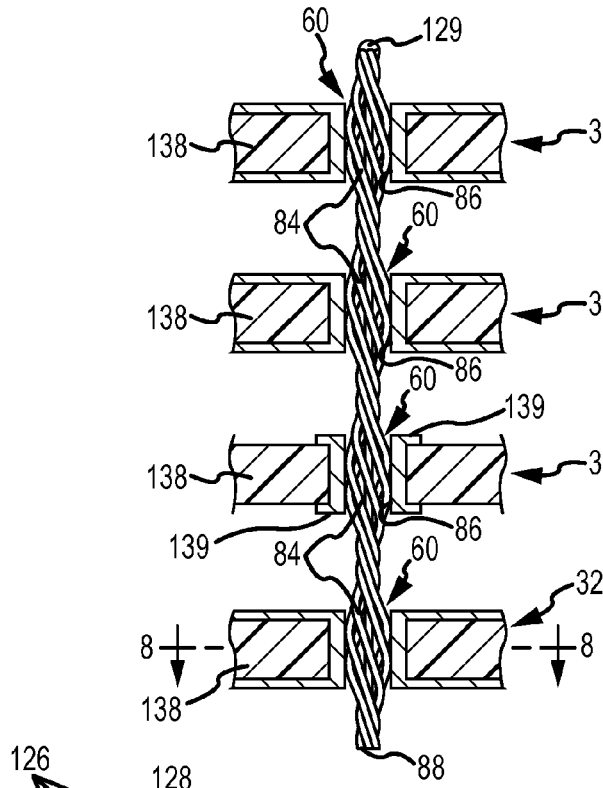
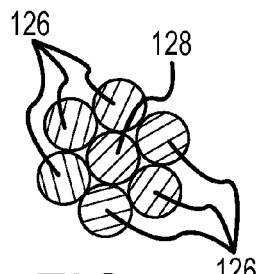
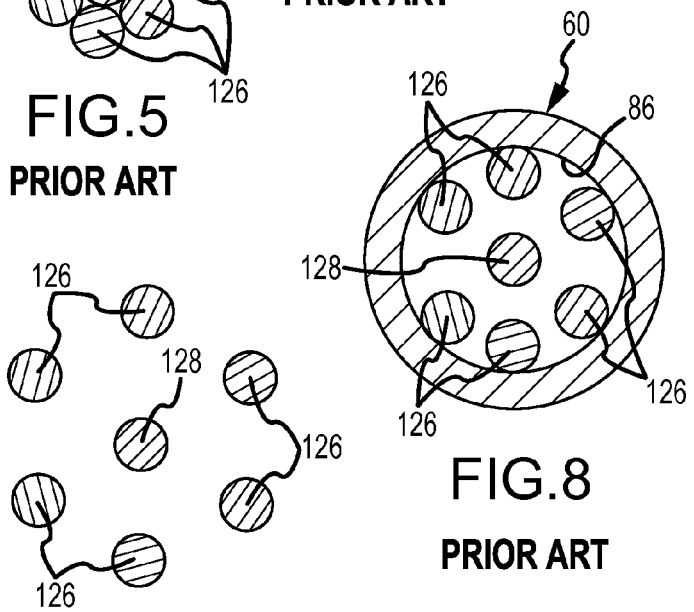
FIG. 4 PRIOR ART
FIG. 5 PRIOR ART
FIG. 6 PRIOR ART
FIG. 7 PRIOR ART
FIG. 8 PRIOR ART

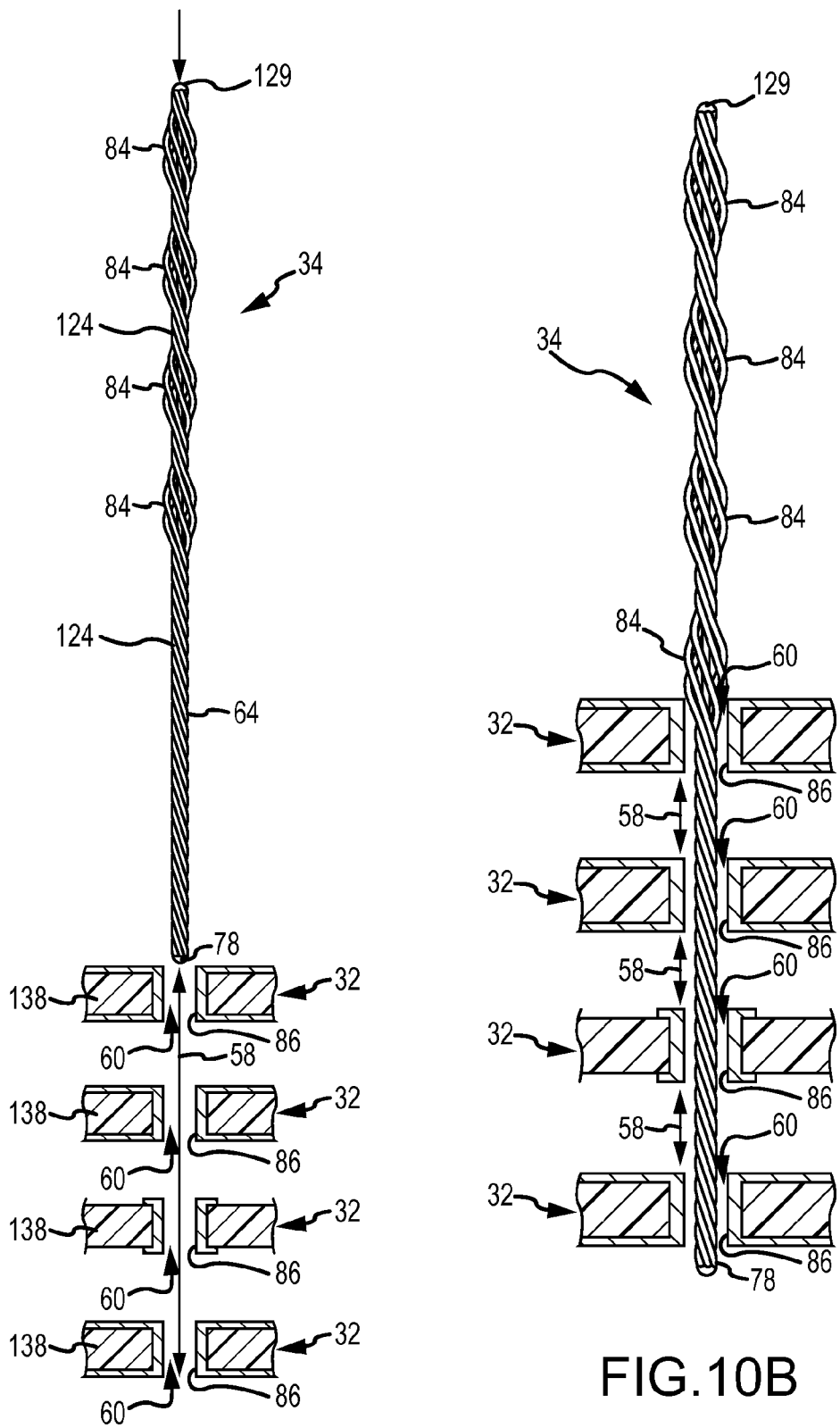

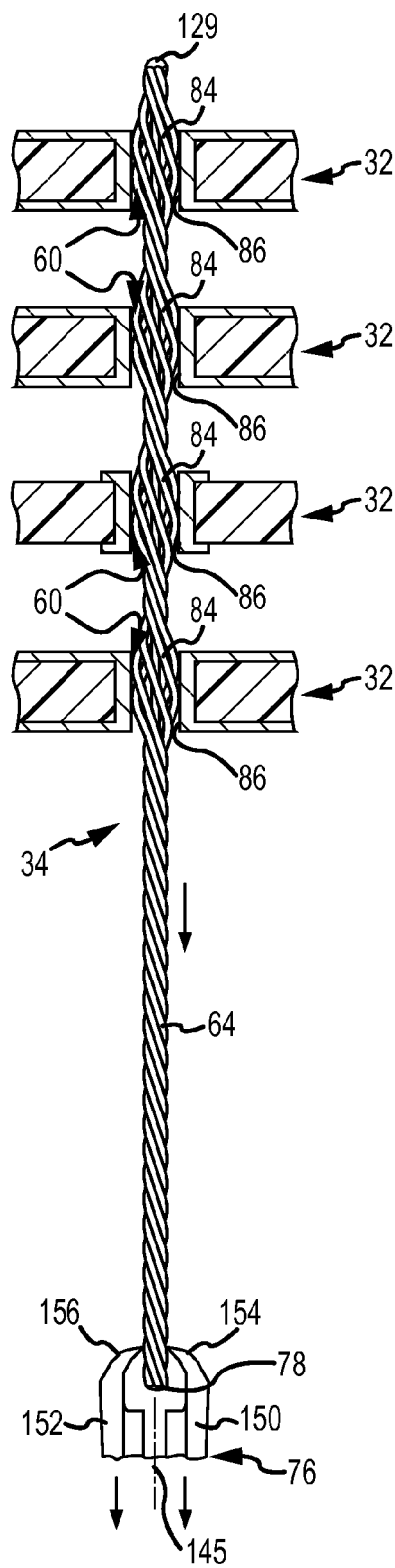
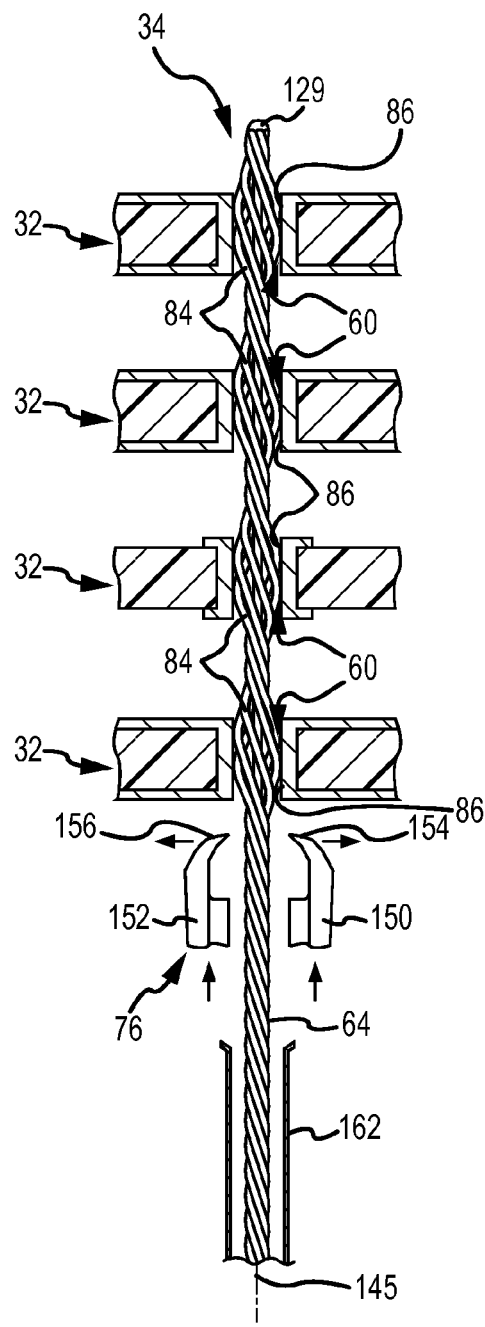
FIG.10E
FIG.10F

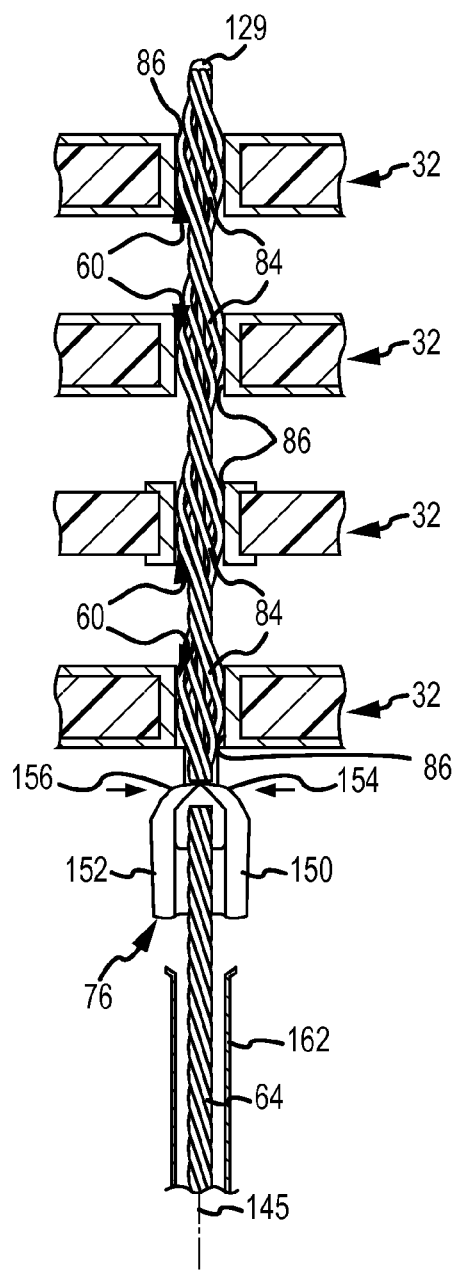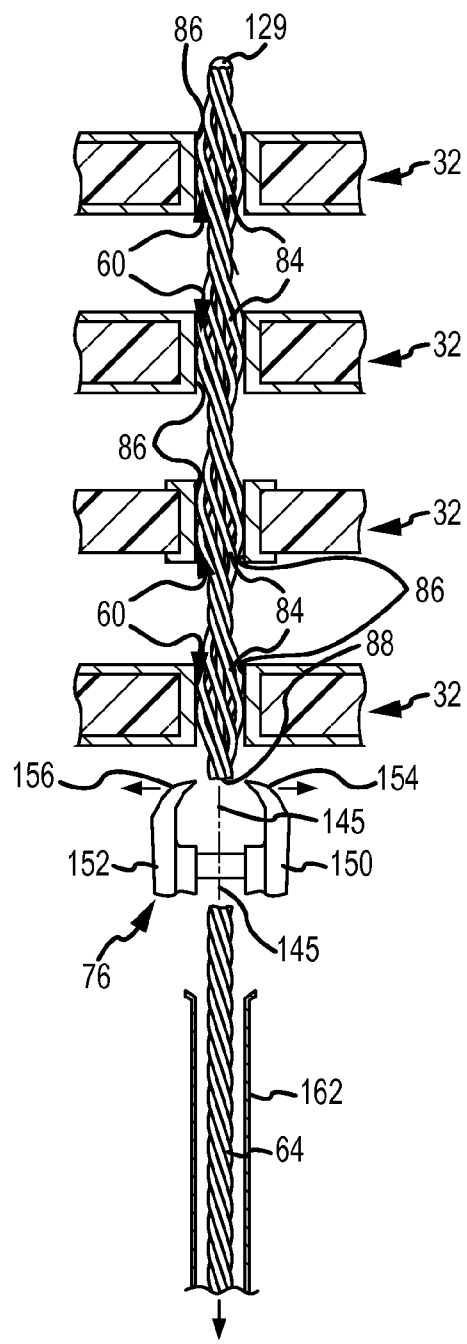
FIG.10G
FIG.10H

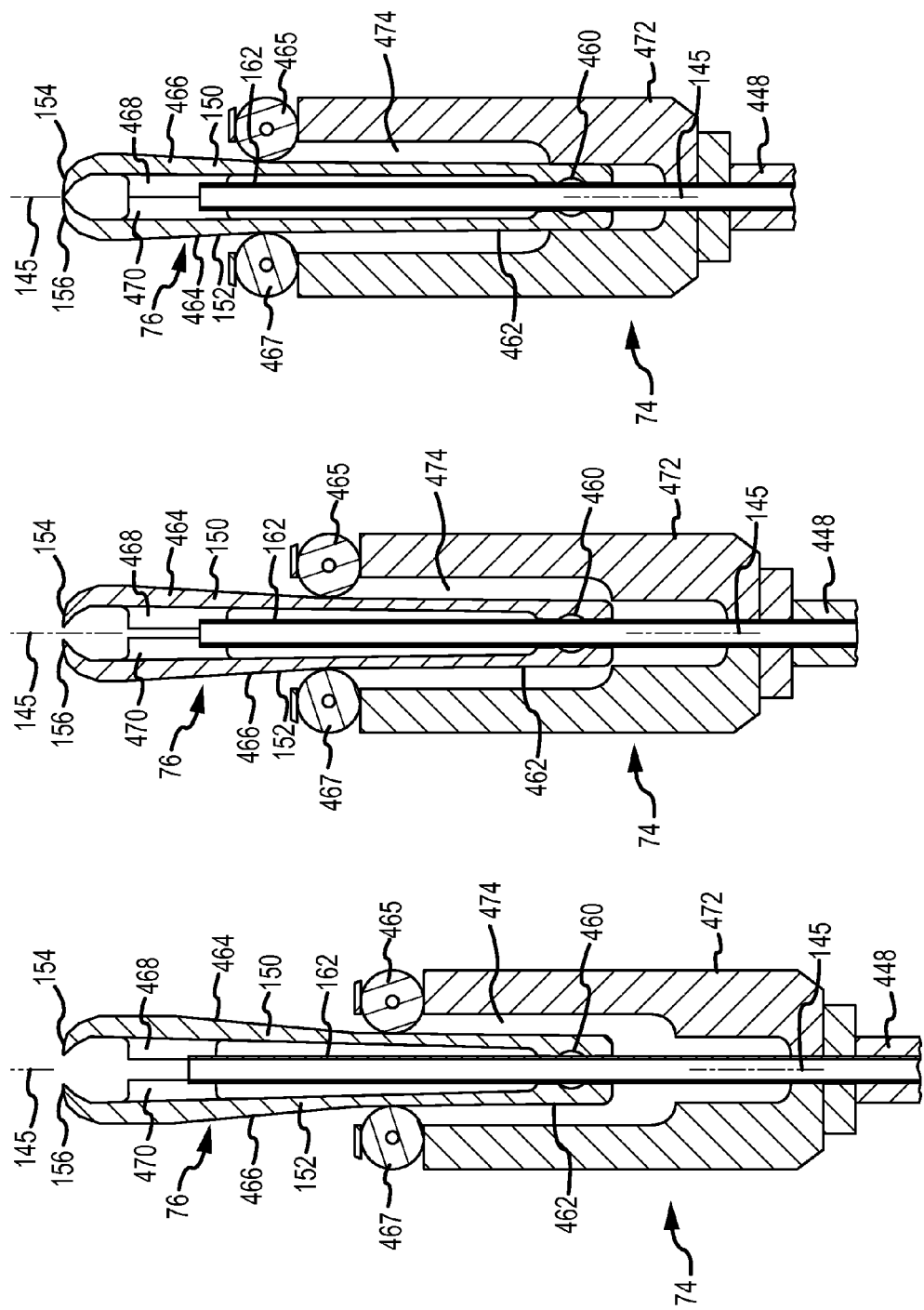

AUTOMATED TWIST PIN ASSEMBLING METHOD FOR INTERCONNECTING STACKED CIRCUIT BOARDS IN A MODULE

CROSS REFERENCE TO RELATED APPLICATION

This invention is a division of the invention described in U.S. application Ser. No. 12/717,050, filed Mar. 3, 2010, now U.S. Pat. No. 8,141,238, which is a continuation in part of the invention described in U.S. application Ser. No. 11/894,874, filed Aug. 22, 2007, now U.S. Pat. No. 7,797,821, by the inventors herein, and assigned to the assignee hereof. The subject matter of these prior applications is fully incorporated herein by this reference.

FIELD OF THE INVENTION

This invention relates to interconnecting and assembling three-dimensional electronic modules from multiple stacked printed circuit boards. More particularly, this invention relates to a new and improved machine and method for assembling z-axis interconnectors, such as twist pins, into columns of aligned plated through holes or vias formed in circuit boards of the module to mechanically and electrically connect the circuit boards and the module in an automated, efficient and rapidly executed manner. The z-axis interconnectors are preferably twist pins, which are of the type, and are used in the manner, described in U.S. Pat. Nos. 4,955,523, 5,014,419, 5,054,192, 5,045,975, 5,112,232, 5,184,400, 5,189,507, 5,195,237, 6,528,759, 6,530,511, 6,584,677, 6,716,038, 6,729,026 and 6,971,415, and in US patent application 2009/0049684, published Feb. 26, 2009, all of which are owned by the assignee of the present invention. The subject matter of these prior patents and patent applications is incorporated herein by this reference.

BACKGROUND OF THE INVENTION

The evolution of computer and electronic systems has demanded ever-increasing levels of performance. In most regards, the increased performance has been achieved by electronic components of ever-decreasing physical size. The diminished size itself has been responsible for some level of increased performance because of the reduced lengths of the paths through which the signals must travel between separate components of the systems. Reduced length signal paths allow the electronic components to switch at higher frequencies and reduce the latency of the signal conduction through relatively longer paths.

One technique of reducing the size of the electronic components is to condense or diminish the space between the electronic components. A diminished size also allows more components to be included in a system, which is another technique of achieving increased performance because of the increased number of components.

A particularly effective approach to condensing the size between electronic components is to attach multiple semiconductor integrated circuits or "chips" on printed circuit boards, and then stack multiple printed circuit boards to form a three-dimensional configuration or module. Interconnectors are extended vertically, in the z-axis dimension, between the vertically stacked printed circuit boards, each of which is oriented in the horizontal x-axis and y-axis dimensions. The interconnectors, in conjunction with conductor traces of each printed circuit board, connect the chips of the module with short signal paths. The relatively high concentration of chips, which are connected by the three-dimensional, relatively short length signal paths, are capable of achieving very high levels of functionality.

The z-axis interconnectors contact and extend through plated through holes or "vias" formed in each of the printed circuit boards. The chips of each printed circuit board are connected to the vias by conductor traces formed on or within each printed circuit board. The vias are formed in each individual printed circuit board of the three-dimensional modules at similar locations, so that when the printed circuit boards are stacked in the three-dimensional module, the vias of all of the printed circuit boards are aligned vertically in columns along the z-axis. The z-axis interconnectors are then inserted in the column of vertically aligned vias to establish an electrical contact and mechanical connection between the circuit boards, thus assembling the module.

A number of different types of z-axis interconnectors have been proposed. One particularly advantageous type of z-axis interconnector is known as a "twist pin." Twist pins are typically of a very small size. The most common sizes are about 0.0050, 0.0100 and 0.0150 in. in diameter. The typical length of a twist pin is about 1 to 1.5 inches. The weight of a typical four-bulge twist pin is about 0.0077 grams, making it so light that handling the twist pin is difficult. It is not unusual that a complex module formed by a 4 in. by 4 in. printed circuit board may require the use of as many as 22,000 twist pins. Thus, the relatively large number of twist pins necessary to assemble each three-dimensional module makes it necessary to insert and interconnect the circuit boards quickly and efficiently.

Assembling large numbers of twist pins or other z-axis interconnectors in three-dimensional circuit modules has previously been accomplished using multiple machines to accomplish part of the assembly required. For example, sorting and aligning the twist pins so that they may be inserted in the column of aligned vias has been performed using one type of machine, but the functionality of the machine still required constant operator attention and frequent operator intervention. Another function accomplished by another machine involved delivering the twist pins pneumatically to the via columns. This machine required the operator to view each column of aligned vias with a microscope to determine whether the twist pin was properly inserted, and when an insertion error was encountered, manually insert the twist pin. Pulling the twist pins from the initially inserted position was accomplished by a third type of machine, and a fourth machine was required to cut the leader portion of the twist pin. Each of these machines had to be controlled separately by specific operator actions.

Coordinating separate machines with one another during an entire twist pin assembly cycle is tedious activity for the machine operator. Furthermore, because the operation of the different machines are independent of one another, the functionality of one machine may adversely influence the ability of the other machine to achieve its desired functionality. Even under the best of circumstances, assembling z-axis interconnects such as twist pins into three-dimensional circuit modules has been relatively slow and time-consuming, and therefore inefficient and expensive. The inefficiencies and costs associated with such actions have created an impediment to using three-dimensional circuit modules with z-axis interconnects.

SUMMARY OF THE INVENTION

The present invention is directed to a single machine and a method which is capable of assembling z-axis interconnectors in columns of aligned vias in stacked circuit boards to form three-dimensional circuit modules, in an automated, rapid, and efficient manner. Very little or no operator supervision or intervention is required. No human control of multiple assembly machines is required. The efficiency achieved from automatic assembly exceeds that available when multiple different machines must be coordinated. The three-dimensional circuit modules are assembled more quickly, are less expensive to assemble, are less likely to experience defects, and are more reliable in construction, among other things. Because of these benefits, the present invention makes compact three-dimensional circuit modules more desirable for use in commercial products. The present invention therefore contributes significantly to the commercial adoption and use of three-dimensional circuit modules.

These and other improvements are achieved by a machine and a method for automatically assembling z-axis interconnectors, such as twist pins, into columns of aligned vias in stacked printed circuit boards of a circuit module. Each interconnector has a leader portion and a connection portion. The interconnectors are assembled in the via columns in assembly cycles, and the assembly cycles are repetitiously executed until interconnectors have been assembled into a substantial plurality of the via columns of the circuit module. Each assembly cycle involves the use of subassemblies of the machine which perform operations that: singulate one interconnector from a plurality of interconnectors, move the circuit module and an insertion nozzle relative to one another to align an unoccupied via column with the insertion nozzle, convey the interconnector through a delivery tube and into the insertion nozzle, insert the interconnector into the aligned via column from the insertion nozzle, seat the interconnector in the aligned via column with the leader portion extending through the via column to a position below a lower circuit board of the circuit module, grip the leader portion extending below the lower printed circuit board, pull the gripped leader portion until the connection portion moves through the via column into contact with the vias of the column, sever the leader portion from the connection portion at a cutoff location adjacent to the lower circuit board, and extract the severed leader portion.

Other desirable aspects of each each assembly cycle involve: sensing the passage of the interconnector and the severed leader portion, sensing proper seating of the interconnector in the aligned via column, gripping and pulling the interconnector to extract it from the via column upon sensing that the interconnector is not properly seated, storing the plurality of interconnectors in a cartridge having a plurality of receptacles with each interconnected in a separate receptacle and aligning a pickup head with a different receptacle upon sensing that one interconnector was not removed from the receptacle previously aligned with the pickup head, sensing the passage of the extracted severed leader through an extraction tube into a collection chamber, perceiving images of an upper via of the via column by which to establish a center position of the upper via to insert the interconnector, using the image of the upper via in conjunction with hole drilling map information which specifies locations of the vias created from holes formed during fabrication of the printed circuit boards to align the via column and insert the interconnector, identifying any obstruction in the via column or any misalignment of the vias in the via column from the perceived image to determine whether or not to execute an assembly cycle on each via column, establishing the height of the upper and lower circuit boards by moving the insertion nozzle vertically to contact the upper circuit board and by vertically moving a blade member used to grip and cut the leader portion to contact the lower circuit board, moving the insertion nozzle vertically relative to the upper circuit board during at least some of the assembly cycles to avoid contact with electronic components connected to the upper circuit board, rotating the blade member during at least some of the assembly cycles to avoid contact with electronic components connected to the lower circuit board, applying intermittent force through the delivery tube and the extraction tube to attempt to respectively dislodge any stuck interconnector or severed leader, and applying intermittent force into the interconnector in the delivery nozzle to attempt to properly seat an improperly seated interconnector, among other things.

A more complete appreciation of the present invention and its scope may be obtained from the accompanying drawings, which are briefly summarized below, from the following detailed descriptions of presently preferred embodiments of the invention, and from the appended claims.

BRIEF DESCRIPTION OF THE DRAWINGS

FIG. 4 is a side elevational view of a prior art twist pin assembled into a circuit module by the machine shown in FIG. 1.

FIG. 5 is an enlarged cross-sectional view of the twist pin shown in FIG. 4, taken substantially in the plane of line 5-5 in FIG. 4.

FIG. 6 is an enlarged cross-sectional view of the twist pin shown in FIG. 4, taken substantially in the plane of line 6-6 in FIG. 4.

FIG. 7 is a partial vertical cross-sectional view of a prior art three-dimensional circuit module shown in FIGS. 9A and 9B, taken substantially in the plane of a column of aligned vias of the circuit module, illustrating a fully assembled twist pin of the type shown in FIG. 4 connected to the vias in the column in printed circuit boards of the module.

FIG. 8 is an enlarged cross-sectional view of the twist pin within a via shown in FIG. 7, taken substantially in the plane of line 8-8 in FIG. 7.

FIGS. 10A, 10B, 10C, 10D, 10E, 10F, 10G and 10H are partial, elevational and cross-sectional views illustrating a sequence of operations performed in assembling the twist pin in a circuit module of the type shown in FIGS. 7, 9A and 9B.

FIGS. 21, 22 and 23 are enlarged vertical section views of an upper portion of a pinch and cut blade and a blade deflecting mechanism of the grip and cut subassembly shown in FIGS. 16-20, taken in a plane substantially parallel to the movement of the pinch and cut blade and showing the pinch and cut blade positioned in an open position, a partially closed position and a fully closed position, respectively.

DETAILED DESCRIPTION

Machine and Method in General

Figure 1:
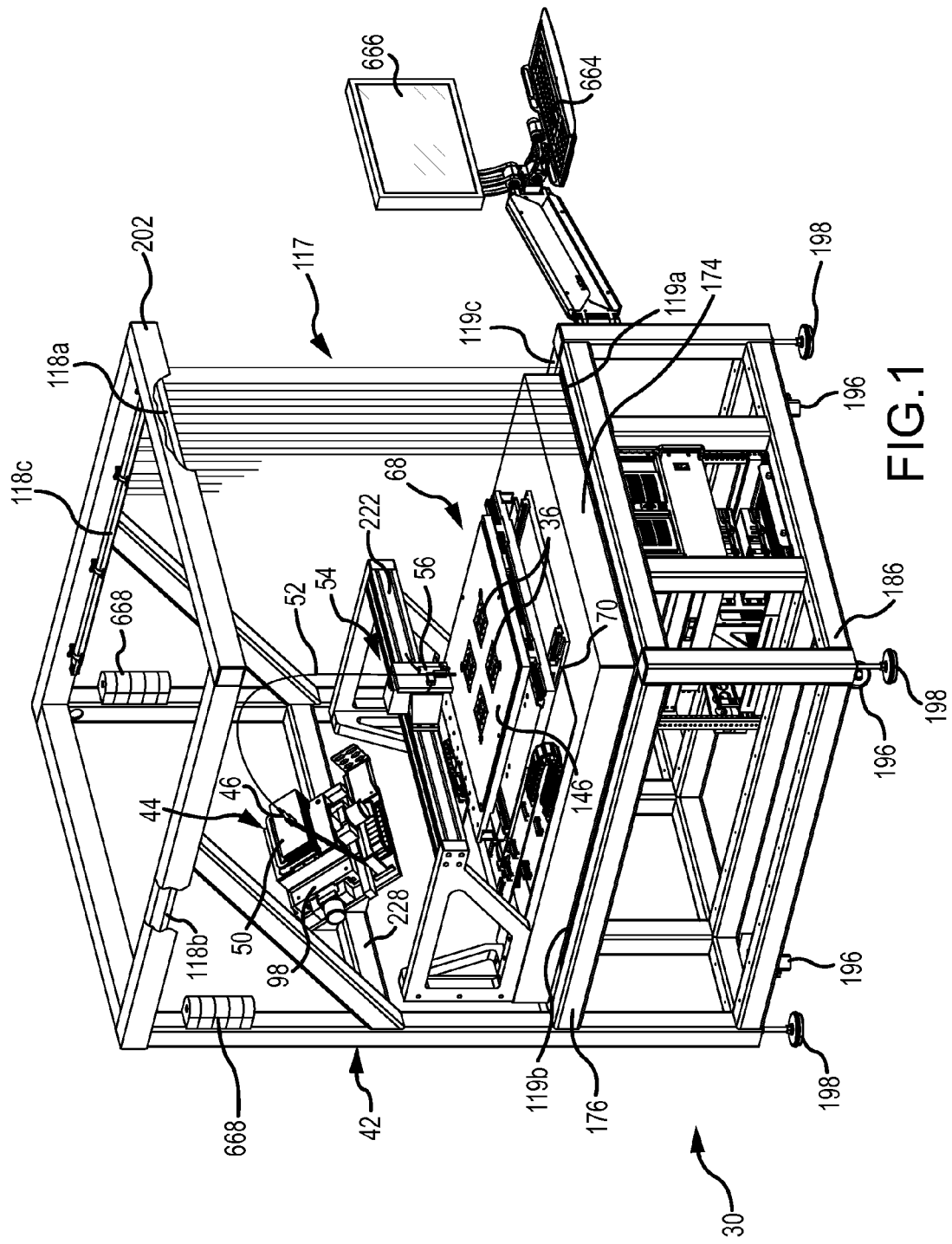
FIG. 1 is a perspective view of an automated machine for assembling z-axis interconnects or twist pins in columns of aligned vias in stacked printed circuit boards, in which the present invention is incorporated.
Figure 9A:
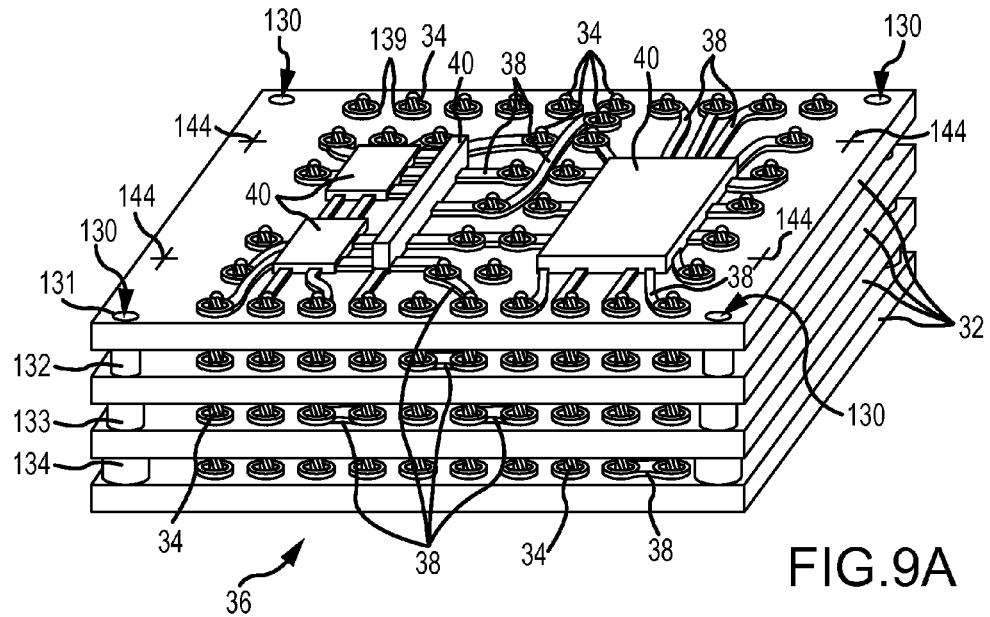
FIGS. 9A and 9B are perspective views of two different types of three-dimensional circuit modules formed by vertically stacked printed circuit boards which are interconnected by twist pins in the manner shown in FIG. 7, and also illustrating electronic circuit components attached to upper ones of the printed circuit boards and also illustrating traces interconnecting some of the vias and circuit components.
Figure 9B:
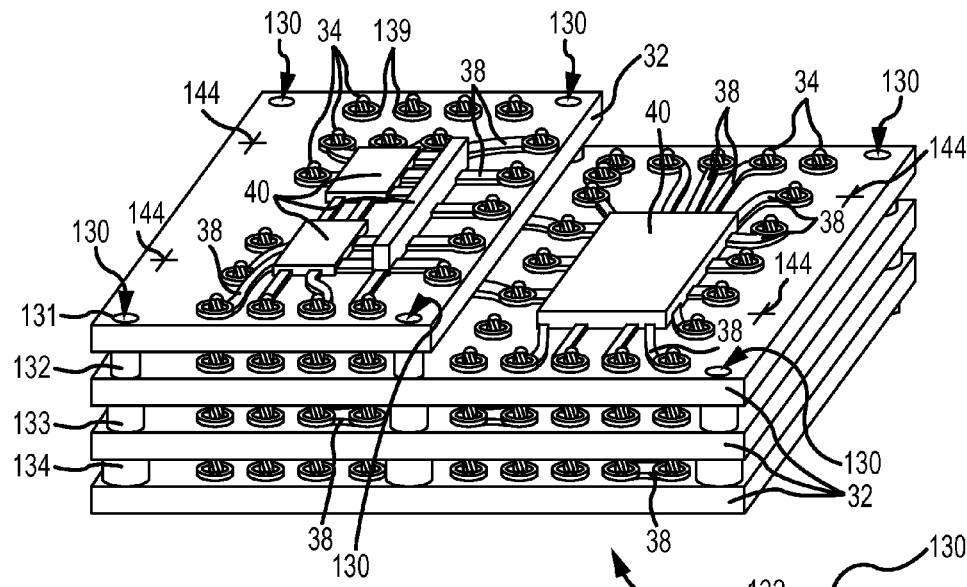

A fully automated machine 30 which embodies the present invention is shown in FIG. 1. The machine 30 assembles twist pins 34 (FIG. 4), or other z-axis interconnectors, into columns 58 of vertically aligned plated through holes or vias 60 (FIGS. 7, 10A-10H) in vertically spaced or stacked printed circuit boards 32 (FIG. 7) to form three-dimensional circuit modules 36 (FIGS. 9A and 9B). The twist pins 34 establish three-dimensional electrical connections between conductors or traces 38 and electronic circuit components 40 on the printed circuit boards 32 of each module 36 (FIGS. 9A and 9B).

Figure 2:
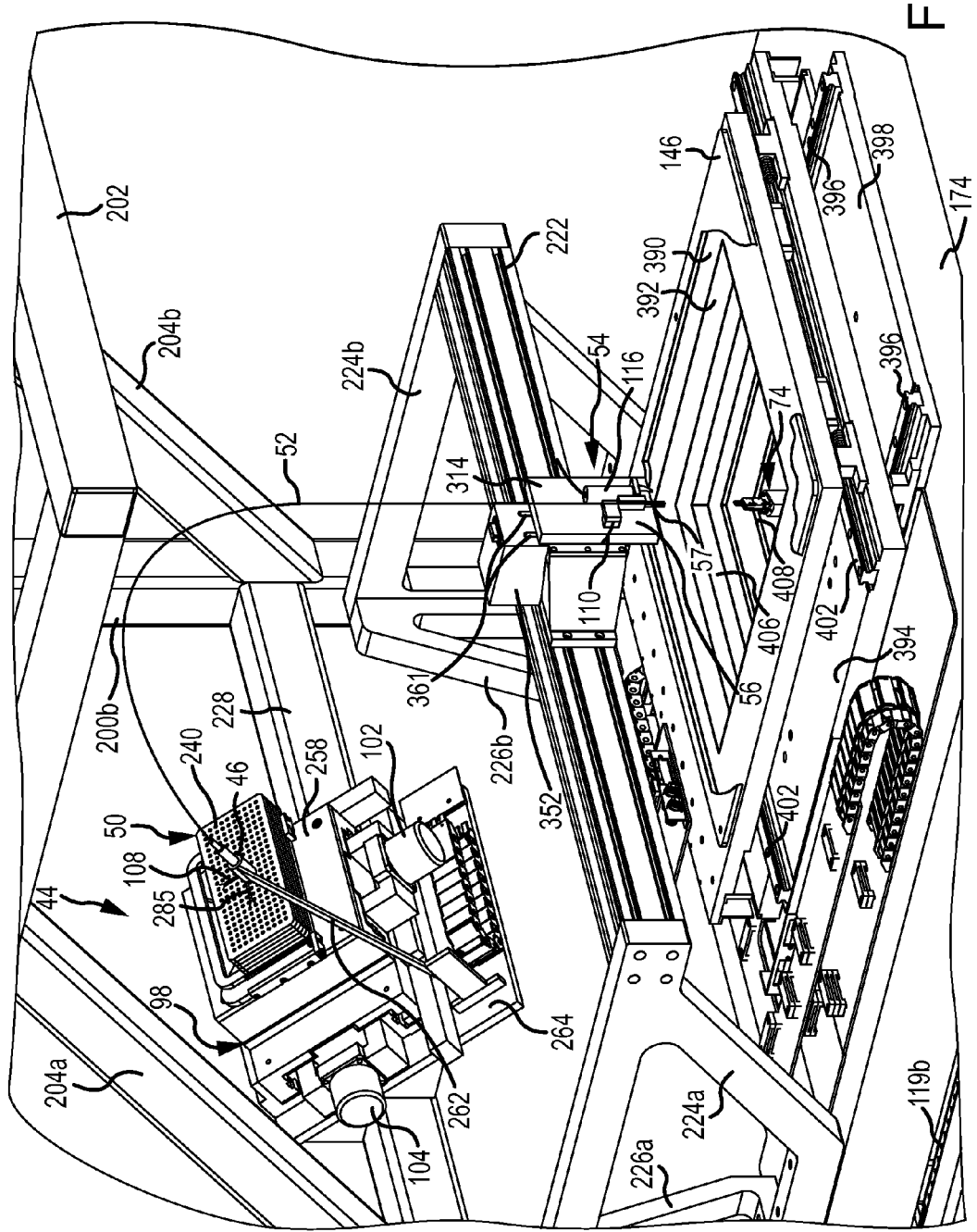
FIG. 2 is an enlarged perspective view of a twist pin pickup subassembly, a twist pin insertion subassembly, a circuit module positioning subassembly, and a portion of a twist pin grip and cut subassembly of the machine shown in FIG. 1.
Figure 3:
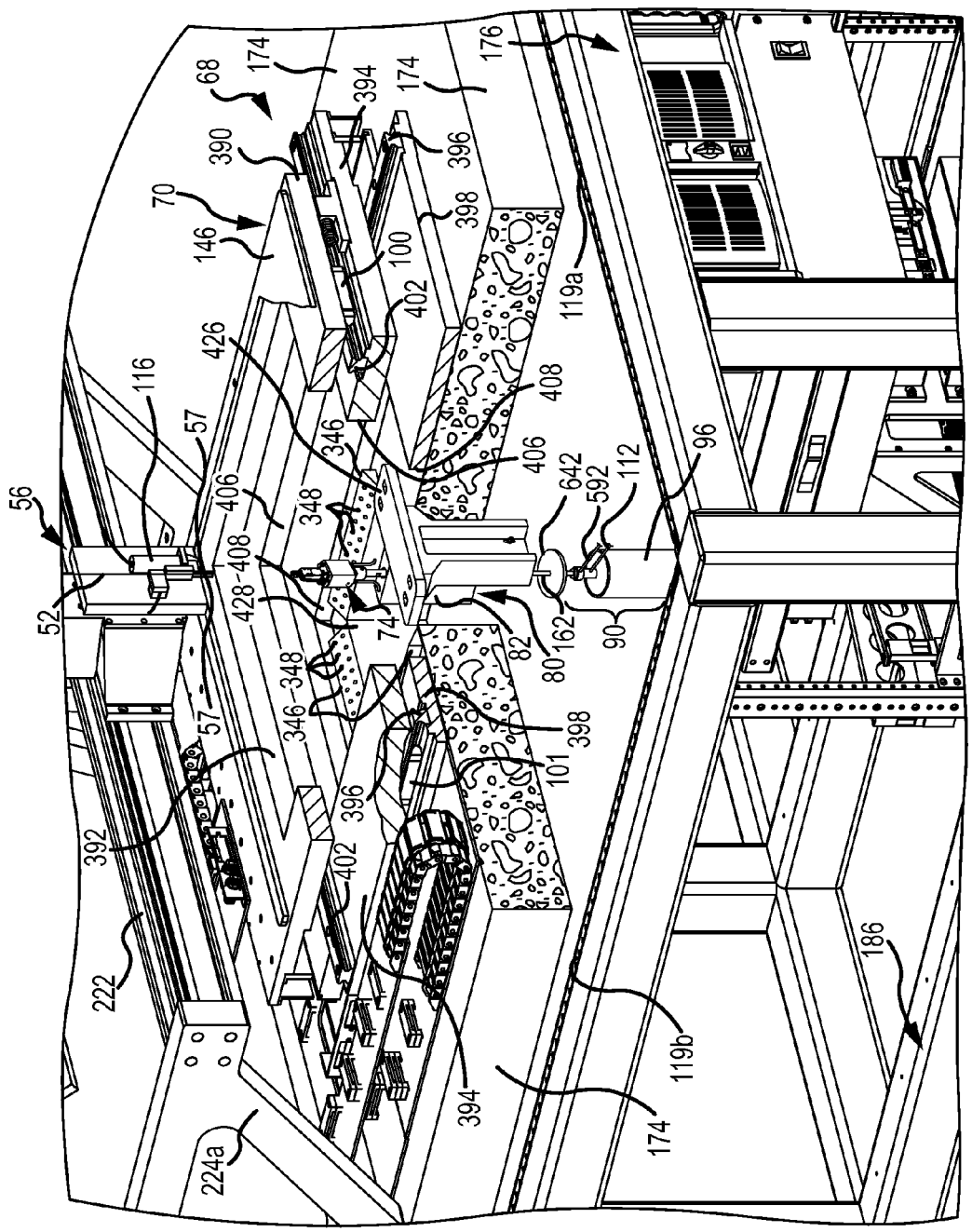
FIG. 3 is an enlarged partial perspective view of the twist pin insertion subassembly, the circuit module positioning subassembly, the grip and cut subassembly, a longitudinal movement subassembly and a leader collection subassembly of the machine shown in FIG. 1.

As shown in more detail in FIGS. 1, 2 and 3, the machine 30 includes a frame 42 (FIG. 11) which supports various subassemblies of the machine 30. A twist pin pickup subassembly 44 uses a twist pin pickup head 46 (FIG. 13) to pneumatically remove a twist pin 34 (FIG. 4) from a cartridge 50 (FIG. 12) and to pneumatically convey the removed twist pin through a delivery tube 52 to a twist pin insertion subassembly 54. The twist pin insertion subassembly 54 uses an insertion head 56 with an insertion nozzle 57 (FIG. 14) to deliver the twist pin 34 into a column 58 of vertically aligned plated through holes or vias 60 of the vertically stacked printed circuit boards 32 (FIG. 10A). Upon insertion, a leader portion 64 of the twist pin 34 extends completely through the column 58 of vias 60 and a leading end of 78 of the leader portion 64 extends below the lower printed circuit board of the module (FIG. 10B).

A circuit module positioning subassembly 68 of the machine 30 includes an XY positioning table 70. The XY positioning table 70 locates the columns 58 of the aligned vias 60 in the printed circuit boards 32 in alignment with the twist pin insertion nozzle 57 to receive the twist pin 34 (FIGS. 10B and 14) when inserted. A linear motor 72 (FIG. 15) of the twist pin insertion subassembly 54 moves the insertion head 56 vertically upward and downward to achieve a desired spacing of the insertion nozzle 57 from a via 60 in the uppermost printed circuit board 32 in the module 36.

Figure 10C:
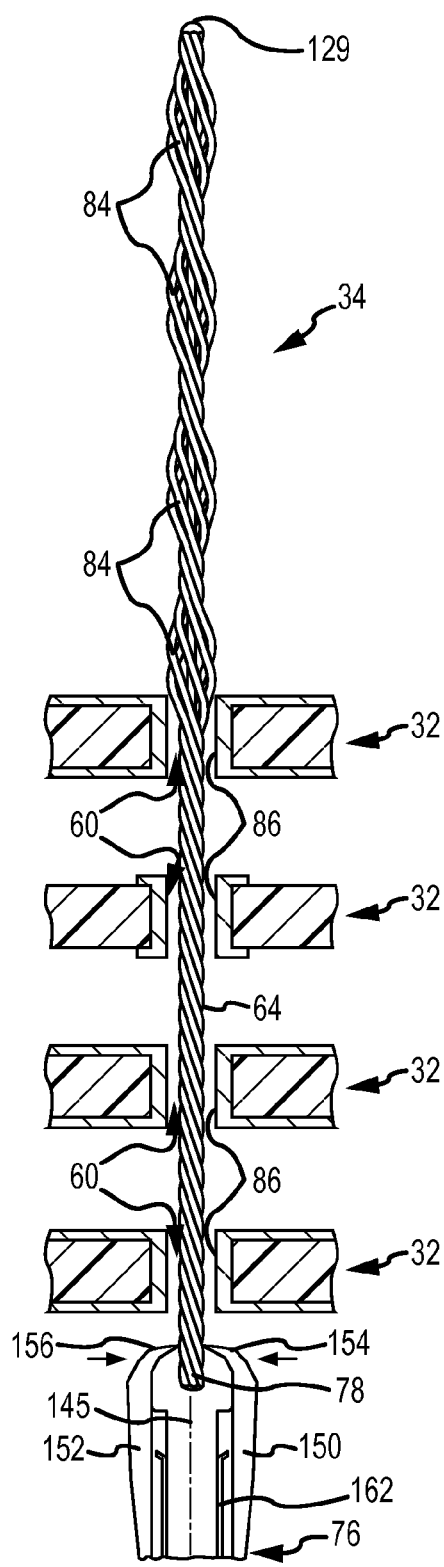
Figure 14:
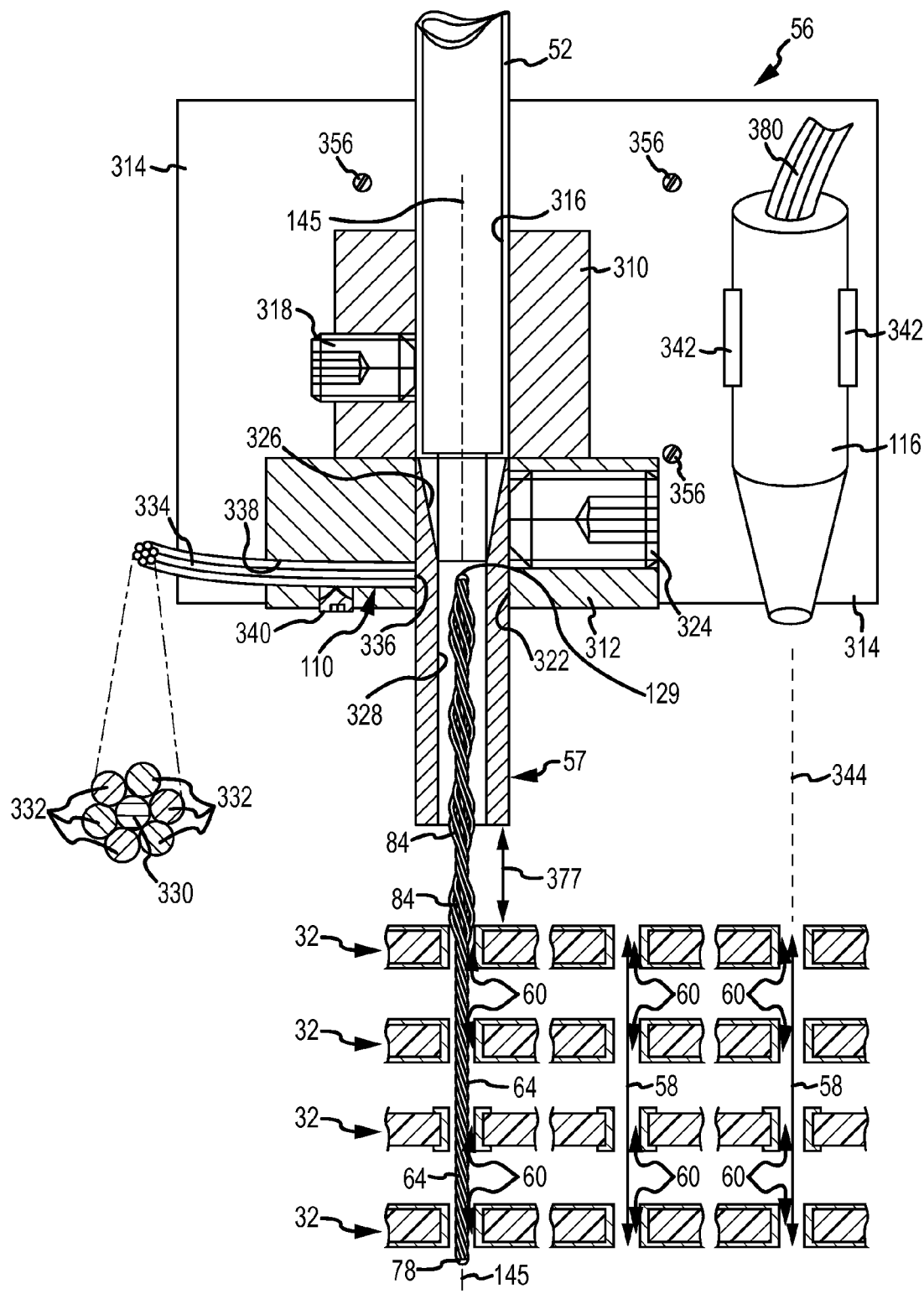
FIG. 14 is an enlarged and partial section and partial perspective view of a twist pin insertion head and optical sensor and a camera of the twist pin insertion subassembly shown in FIGS. 1, 2 and 3, with the section view portion taken substantially in a plane of the path of twist pin movement in the twist pin insertion head, and also showing a partial vertical sectioned portion of a circuit module of the type shown in FIGS. 9A and 9B with a twist pin delivered and seated in a column of vertically aligned vias.

When the twist pin 34 is inserted in the vertical column 58 of aligned vias 60, a grip and cut subassembly 74 of the machine 30 moves a pinch and cut blade 76 to pinch and grip a leading end 78 of the leader portion 64, after the leader portion 64 is inserted through the column 58 of aligned vias 60. The leading end 78 of the leader 64 extends beneath and beyond the lower circuit board 32 of the module 36 (FIGS. 10B, 10C and 14). A longitudinal movement subassembly 80 vertically moves the grip and cut subassembly 74 and its connected pinch and cut blade 76 in a linear path which is coincident with the column 58 of aligned vias and the path through which the insertion head 56 delivers the twist pin 34. A linear/rotational motor 82 of the longitudinal movement subassembly 80 pulls the grip and cut subassembly 74 downward, and the gripped twist pin 34 moves downward through the column 58 of aligned vias 60. The downward movement continues until bulges 84 of the twist pin 34 are located in and are radially compressed against sidewalls 86 of each via 60 (FIGS. 10E and 10F). Thereafter, the grip and cut subassembly 74 moves the pinch and cut blade 76 to release its grip on the leading end 78 of the leader 64, and the linear/rotational motor 82 returns the grip and cut subassembly 74 and the pinch and cut blade 76 to a position adjacent to the lower printed circuit board 32 (FIG. 10F). The grip and cut subassembly 74 then moves the pinch and cut blade 76 to cut or sever the leader 64 of the twist pin 34 at a cutoff end 88, leaving the remaining portion of the twist pin 34 with its bulges 84 in contact with the sidewalls 86 of the vias 60 (FIGS. 7 and 10H). The cutoff end 88 of the twist pin 34 is located slightly beyond the lower printed circuit board 32.

A leader collection subassembly 90 (FIG. 3) uses a venturi device 92 (FIG. 24) to pneumatically extract the severed leader 64 from the grip and cut subassembly 74 and the longitudinal movement subassembly 80. The extracted severed leader 64 is deposited into a collection chamber 96 of the machine 30. Extracting and collecting the severed leaders 64 prevents them from interfering with the operation of the machine 30.

After one twist pin 34 has been extracted from the cartridge 50 by the pickup subassembly 44, the cartridge 50 is moved to a new position by an XY positioning device 98, to provide another twist pin for the next subsequent interconnect assembly cycle. Similarly, the XY positioning table 70 of the circuit module positioning subassembly 68 moves the circuit module 36 to locate another column 58 of aligned vias 60 beneath the insertion nozzle 57 of the insertion head 56 of the insertion subassembly 54. The linear motor 72 of the insertion subassembly 54 moves the insertion head 56 vertically to clear the insertion nozzle 57 from contact with any electronic circuit component 40 that might be attached to the upper circuit board 32 (FIGS. 9A and 9B). Once another twist pin 34 is available from the pickup subassembly 44, and another column 58 of aligned vias 60 is oriented to receive that twist pin by the circuit module positioning subassembly 68, the next twist pin is automatically inserted in the column 58 of aligned vias 60, the leader 64 of the inserted twist pin 34 is pulled to move the twist pin 34 downward until the bulges 84 are located within the vias 60 and the bulges 84 compress against the sidewalls 86 of the vias 60, the leader 64 is cut off at the cutoff end 88, and the severed leader 64 is extracted and transported to the collection chamber 96.

The twist pin 34 is removed from the cartridge 50 pneumatically by low pressure air or gas and is conveyed through the delivery tube 52 pneumatically by high pressure gas. The grip and cut subassembly 74 operates pneumatically by low and high pressure gas to grip and cut the leader 64 with the pinch and cut blade 76. The severed leader 64 is extracted pneumatically by low pressure gas and is conveyed into the collection chamber 96.

Electric linear motors 100 and 101 (FIGS. 3 and 25A) operate the XY positioning table 70 of the circuit module positioning subassembly 68. The linear/rotational motor 82 of the longitudinal movement subassembly 80 and the linear motor 72 of the twist pin insertion subassembly 54 are also electric motors. Linear motors are precisely controllable to achieve highly precise positioning of the XY positioning table 70 very quickly. Electric stepper motors 102 and 104 preferably operate the XY positioning device 98 of the pickup subassembly 44. An electric servo motor 106 (FIG. 16) is used as part of the linear/rotational motor 82 of the longitudinal movement subassembly 80 to rotate the grip and cut subassembly 74 as necessary to avoid contact with electronic circuit components 40 which may be located on the lower printed circuit board 32 of the circuit module 36 (FIG. 17).

An optical sensor 108 (FIG. 13) is employed in the pickup head 46 of the pickup subassembly 44 to verify that the twist pin 34 has been properly removed from the cartridge 50 and conveyed into the delivery tube 52. Another optical sensor 110 (FIG. 14) is used in the insertion head 56 of the insertion subassembly 54 to verify that the twist pin 34 has been delivered from the delivery tube 52 and is properly seated in the column 58 of aligned vias 60 (FIG. 10B). An optical sensor 112 (FIG. 24) is used in the venturi device 92 of the leader collection subassembly 90 to verify that the severed leader portion 64 has been extracted from the grip and cut subassembly 74 and from the longitudinal movement subassembly 80.

An optical camera 116 (FIGS. 14 and 15) is employed as part of the insertion subassembly 54 to verify and establish the precise location of the vertical columns 58 of aligned vias 60, thereby improving the accuracy of inserting the twist pin 34. The optical camera 116 is also used to determine whether the vias 60 are aligned sufficiently vertically in the column 58 to permit the successful insertion of a twist pin. The optical camera 116 is also used to detect any significant obstruction that might be located in any one of the via columns 58 and which might prevent the successful insertion of a twist pin 34 in that via column.

A light curtain 117 (partially shown in FIG. 1) extends around areas of the machine 30 where work is performed. The light curtain 117 is formed by linear light beam receiving arrays 118a, 118b and 118c which receive individually focused and narrow beams of light created by correspondingly-positioned linear light beam emitting arrays 119a, 119b and 119c. The linear light beam emitting and receiving arrays are located around the front and left and right sides of the machine 30 where a machine operator will normally stand and interact with the machine. Should any one of the individual beams be broken by the insertion of an operator's hand or some foreign object, for example, the machine 30 will immediately stop functioning. The light curtain is a safety feature of the machine 30 which is intended to prevent injury to the machine operator or to prevent the continued operation of the machine 30 if some foreign object unexpectedly enters the twist pin assembly area.

Figure 25A:
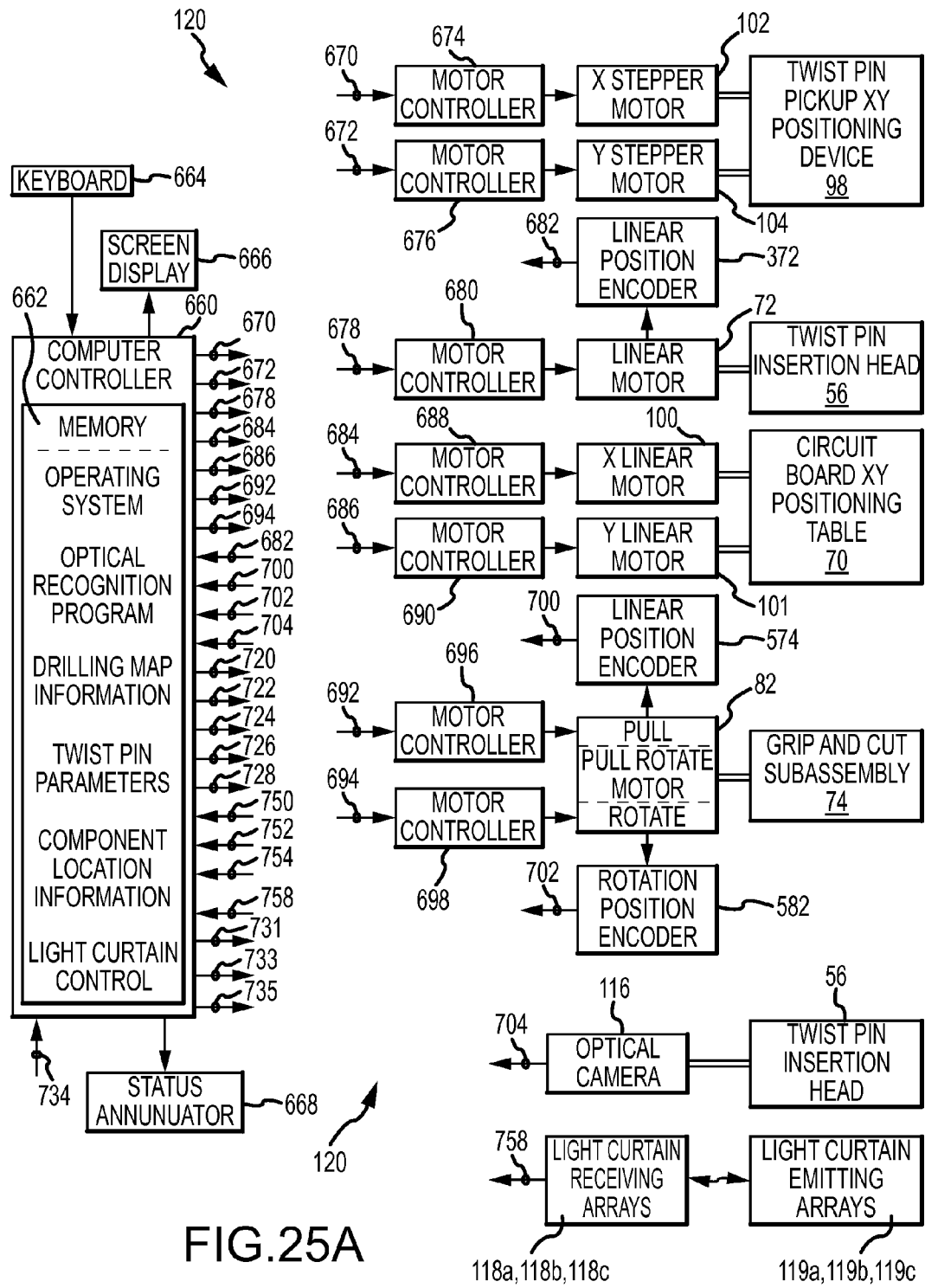
FIGS. 25A and 25B together constitute a block and schematic diagram of a control system of the machine shown in FIG. 1.
Figure 25B:
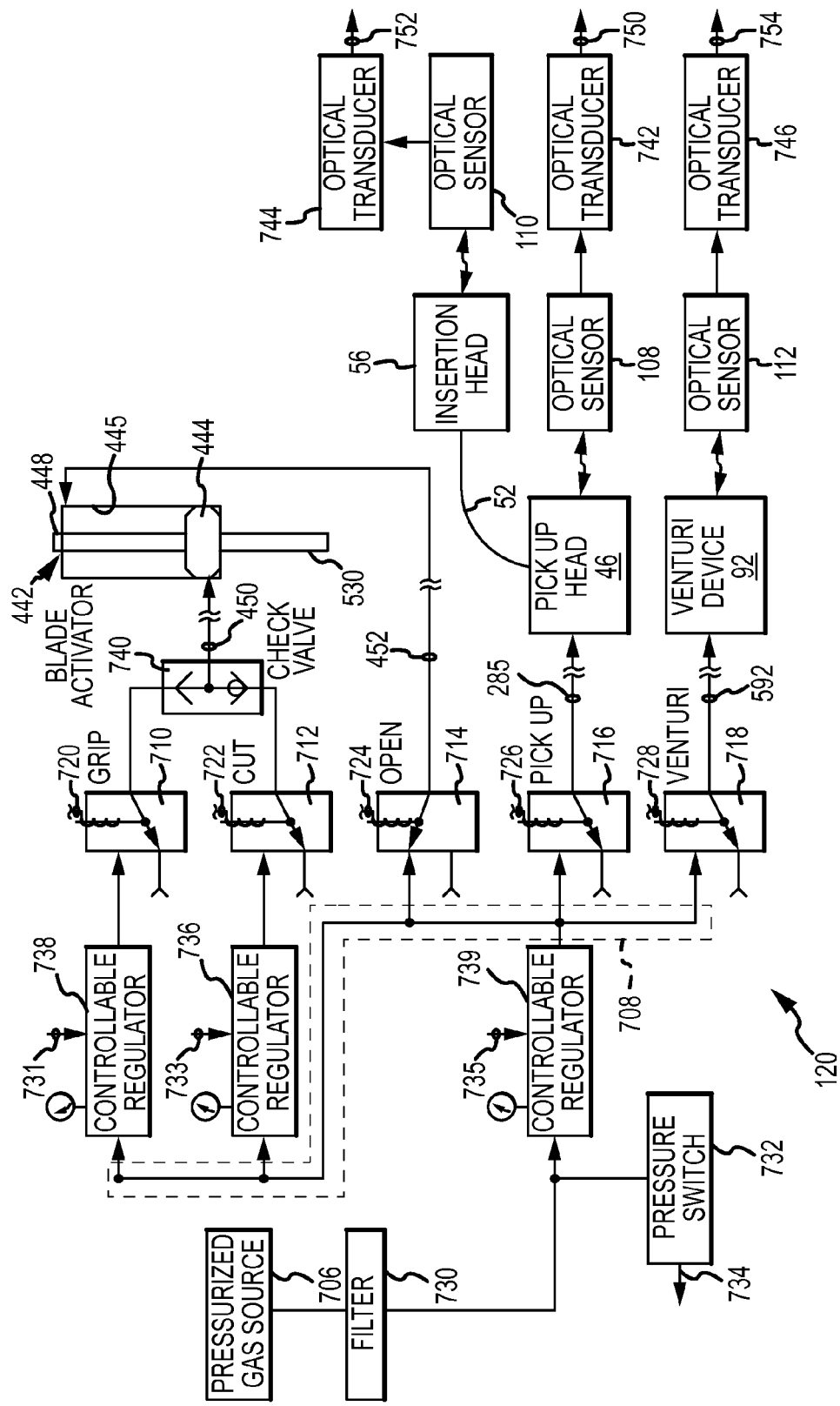
Figure 26A:
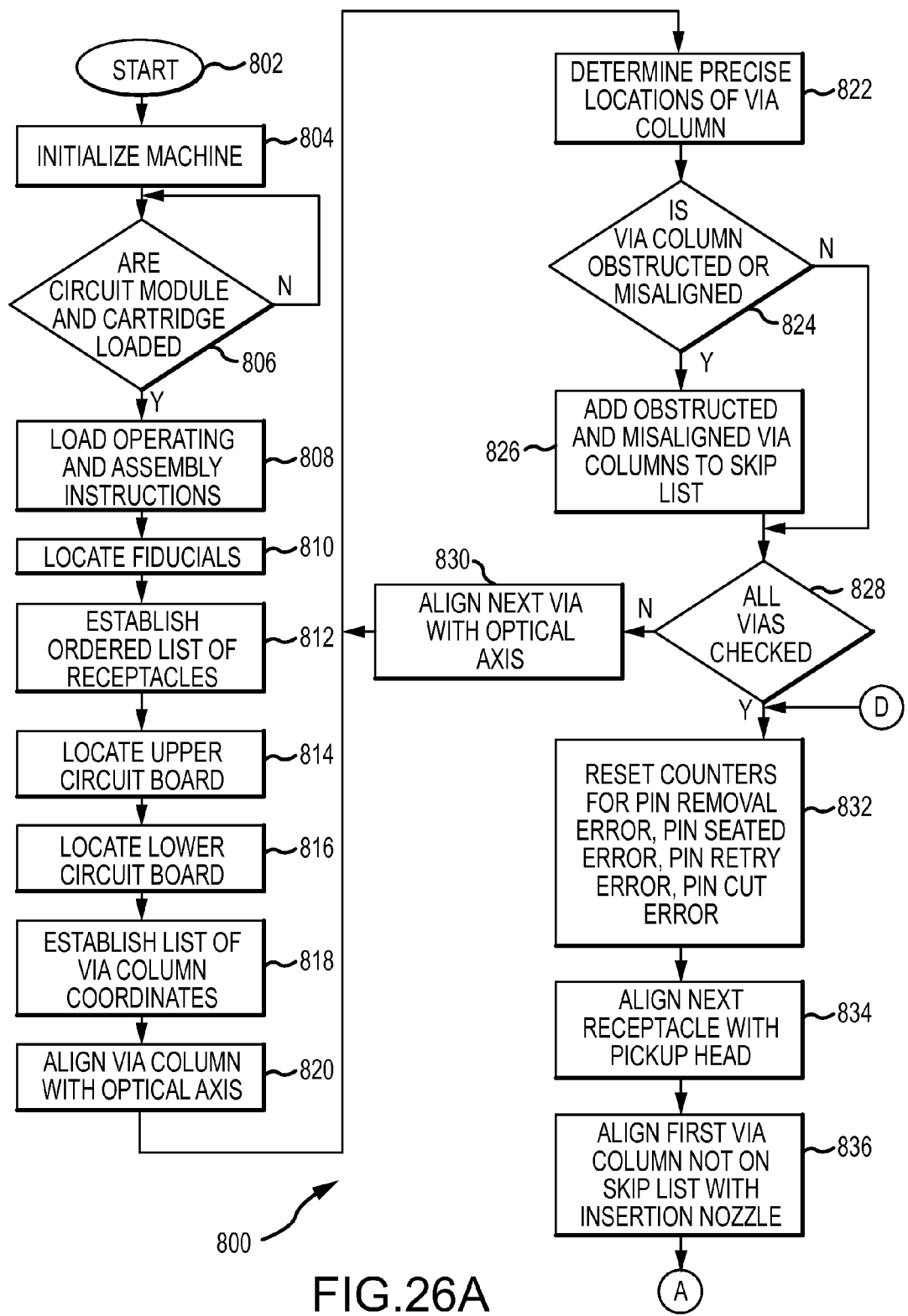
FIGS. 26A, 26B and 26C form a single flow chart of the programmed sequence of operations created by the control system shown in FIGS. 25A and 25B to cause the machine shown in FIG. 1 to operate as described herein.
Figure 26B:
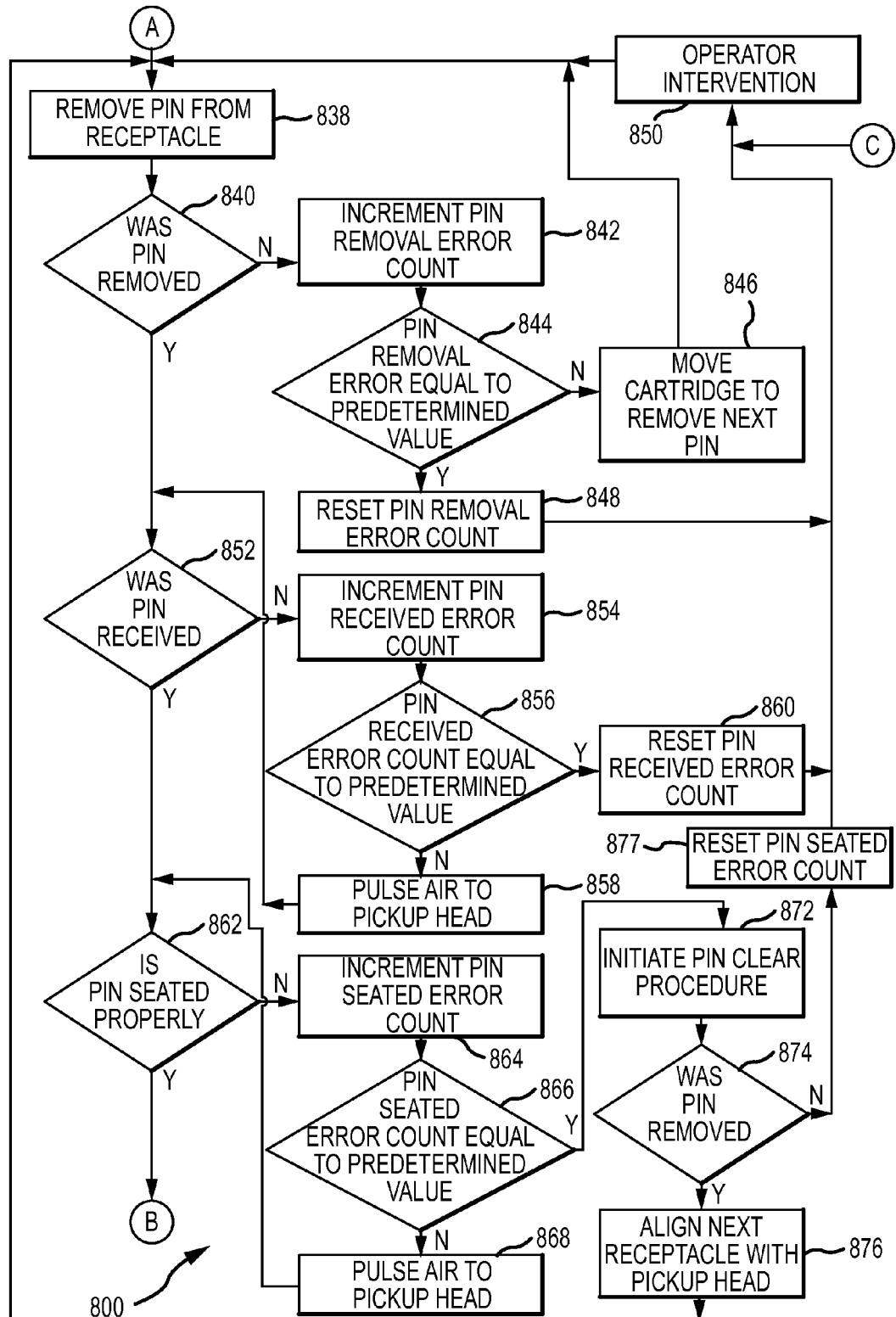
Figure 26C:
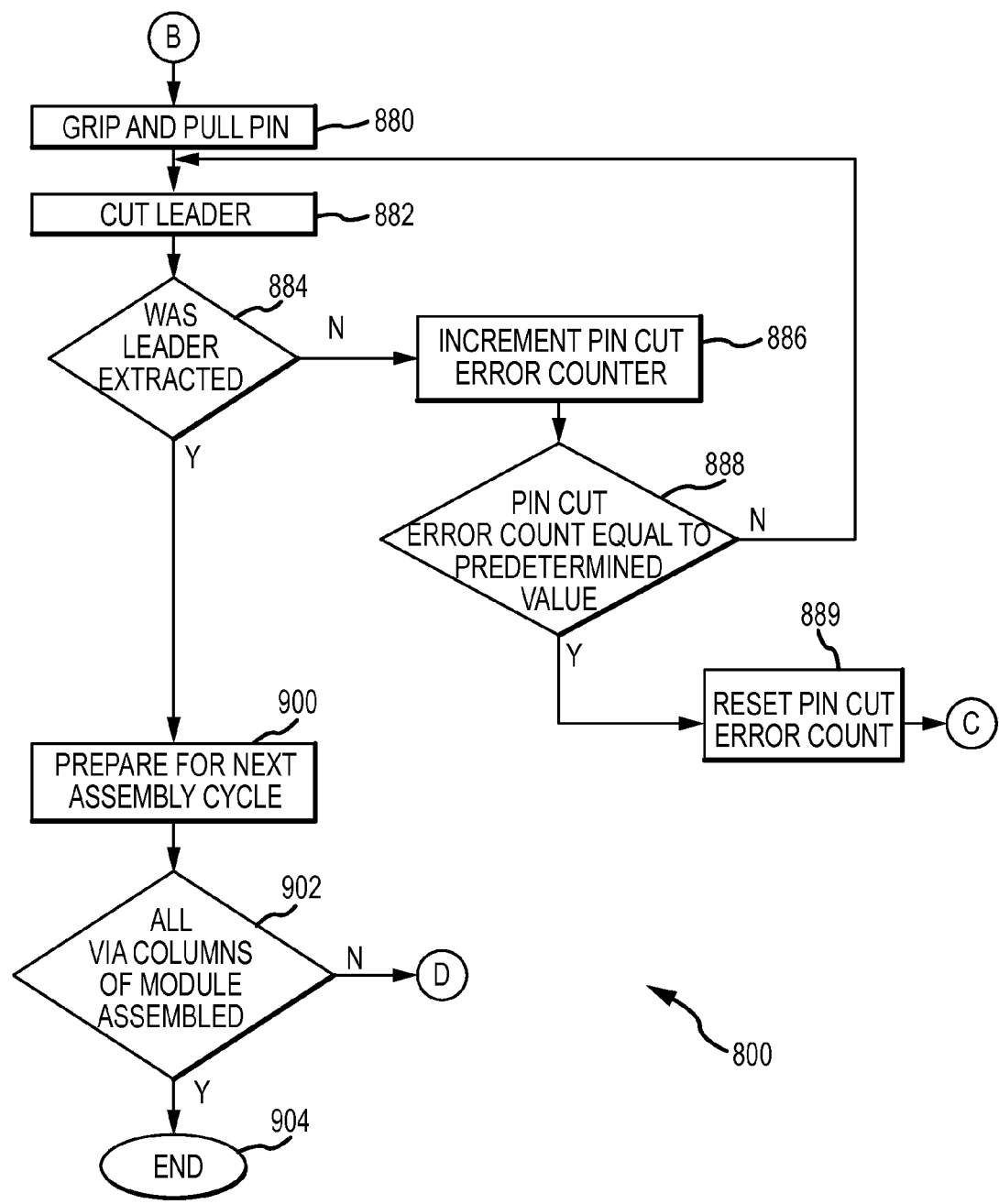

A control system 120, shown in FIGS. 25A and 25B, controls the sequence of automatic operations performed by the machine 30. The control system 120 supplies electrical control signals to the electric motors 72, 82, 100, 101, 102, 104 and 106 to establish the positions of the devices connected to those electric motors; supplies electrical signals to control the application gas pressure to operate the grip and cut subassembly 74 and to perform the twist pin and severed leader removal, extraction and transportation functions; responds to signals from the optical sensors to determine the proper movement of each twist pin 34 and the severed leader 64; receives information from the optical camera 116 to verify and establish the location of the columns 58 of aligned vias 60, to determine whether the vias 60 in the column are aligned sufficiently, and to determine whether obstructions exist in the columns 58 of vias 60; and controls the operation of the machine 30 in relation to whether or not any of the light beams of the light curtain 117 are broken. The control system 120 establishes and controls the sequence of the automated operations performed by the machine 30, as shown in FIGS. 26A, 26B and 26C.

More details concerning the twist pins 34, the three dimensional circuit module 36, the pickup subassembly 44, the twist pin insertion subassembly 54, the circuit module positioning subassembly 68, the grip and cut subassembly 74, the longitudinal movement subassembly 80 and the leader collection subassembly 90, as well as of the pneumatic, electrical and optical aspects of the control system 120 and its sequence of operations are discussed below.

Twist Pins

The twist pins 34 are conventional and an example of one is shown in FIG. 4. The twist pin 34 is fabricated from strands of gold-plated, beryllium-copper wire which have been formed conventionally by helically coiling a number of outer strands 126 around a center core strand 128 in a planetary manner, as shown in FIG. 5. At selected positions along the length of the wire 124, one bulge 84 is formed by untwisting the outer strands 126 in a reverse or anti-helical direction. As a result of untwisting the strands 126 in the anti-helical direction, the space consumed by the outer strands 126 increases, causing the outer strands 126 to bend or expand outward from the core strand 128 and create a larger diameter for the bulge 84 than the diameter of the regular stranded wire 124. The laterally outward extent of the bulge 84 is illustrated in FIG. 6, compared to FIG. 5. The strands 126 and 128 of the wire 124 have the necessary mechanical characteristics to maintain the shape of the wire in the stranded configuration and to allow the outer strands 126 to bend outward at each bulge 84 when untwisted.

The bulges 84 are formed at selected predetermined distances along the length of the wire 124 to contact the sidewalls 86 of the vias 60 in printed circuit boards 32 of the circuit module 36, as shown in FIG. 7. One bulge 84 contacts the sidewall 86 of each via 60 when the twist pin 34 is pulled through the vertical column 58 of aligned vias 60. The outer strands 126 of the bulge 84 have sufficient resilience characteristics to press against an inner surface of the sidewall 86, thereby establishing an electrical and mechanical connection between the twist pin 34 and the via 60, as shown in FIG. 8.

The strands 126 and 128 at the leading end 78 of the leader 64 have been welded or fused together to form a rounded or parabolic configuration to facilitate insertion of the leader 64 through the column 58 of vias 60. The leader 64 has sufficient length to extend through the entire column 58 when the bulge 84 which adjoins the leader 64 makes contact with the upper via 60 of the upper printed circuit board 32 in the column 58. Under these conditions, the leading end 78 of the leader 64 extends below the lower via of the lower printed circuit board 32.

The leading end 78 of the leader 64 is gripped from below and is pulled downwardly, causing the bulges 84 to move downwardly through the vertically aligned vias 60 until the bulges 84 are all aligned and in contact with the sidewalls 86 of the vias 60 of the stacked printed circuit boards 32. To position the bulges 84 in contact with the vias 60, all but the uppermost bulge 84 of the twist pin 34 is pulled into and out of at least one via 60 in the column 58 until the twist pin 34 arrives at its final position. The resiliency of the bulges 84 allows them to move in and out of the vias 60 without losing their ability to make firm contact with the sidewalls 86 of the vias 60 in the final assembled position. Once the twist pin 34 is in the final assembled position, the leader 64 is cut off at the cutoff end 88. The cutoff end 88 may be located flush with the lower circuit board 32, or more typically is located to extend no greater than 0.015 inch beyond the lower circuit board 32.

At the other end of the twist pin 34, the strands 126 and 128 are fused or welded together at a tail end 129 of the twist pin. In the assembled position, the tail end 129 can extend a short distance above the upper surface of the upper printed circuit board 32, but more typically the tail end 129 is located at a flush or sub-flush position relative to the upper surface of the upper circuit board 32. Allowing the cut-off end 88 to extend slightly below the lower printed circuit board of the module 36 facilitates gripping the twist pin 34 at the cutoff end 88 if it becomes necessary to remove the twist pins to disassemble the module 36 to repair or replace any defective components.

Twist pins 34 are typically of a very small size and weight. The most common diameters of the coiled strands 126 and 128 in the twist pin 34 are about 0.0016, 0.0033 and 0.0050 in. The diameters of the coiled strands of the wire 124 formed from the these sizes of strands 126 and 128 are 0.005, 0.0100, and 0.0015 in., respectively. The typical length of a twist pin 34 having four to six bulges is about 1 to 1.5 inches, with the leader 64 constituting about half of this length. The outer diameter of each bulge 84 is approximately two times the diameter of the stranded wire 124. The typical weight of a four-bulge twist pin is about 0.0077 grams.

Circuit Module

Figure 9C:
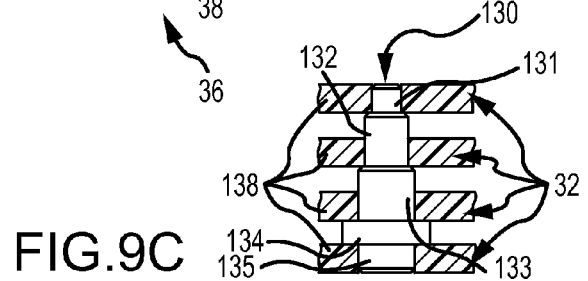
FIG. 9C is a partial vertical section view taken through an axis of a spacer pin used for establishing a vertically stacked or separated relationship of the printed circuit boards in the modules shown in FIGS. 9A and 9C.

The circuit module 36 shown in FIG. 9A is formed by four printed circuit boards 32. A similar circuit module 36 could be formed by more or less printed circuit boards 32. The circuit boards 32 are physically and mechanically separated from one another by spacer pins 130 which are preferably located in holes formed at each corner of the circuit boards 32. The details of one spacer pin 130 is shown in FIG. 9C.

Each spacer pin 130 includes multiple coaxially oriented segments 131, 132 133, and 134 of increasing diameter extending from top to bottom (as shown) along the length of the pin 130. A segment 135 having a smaller diameter than the larger diameter segment 134 above it is also in a coaxial relationship with the other segments of the pin 130. Transitions between the segments 131, 132 and 132, 133 and 133, 134 and 134, 135 create shoulders which contact the upper and lower surfaces of insulating substrates 138 of the printed circuit boards 32. The holes formed in the insulating substrates 138 receive the segments 131, 132, 133 and 135. With the spacer pin 130 inserted into the holes in the insulating substrates, the shoulders between the transitions define the spaced apart relationship of the printed circuit boards as established by the distance between the shoulders. The holes formed in the insulating substrates have a slightly smaller diameter than the diameters of the segments which fit within those holes. The printed circuit boards must be firmly pushed into the segments, thereby creating significant frictional retention between the segments of the pin 130 and the insulating substrates 138. The frictional retention holds the printed circuit boards 32 firmly in position to allow the twist pins to be inserted in the via columns.

Once the twist pins are inserted in all of the via columns of the circuit module 32, a substantially greater additional retention force between the circuit boards 32 results from the additional retention and rigidity created by assembling the twist pins in the via columns. The compression of the bulges 84 against the sidewalls 86 (FIG. 7) establishes additional restraint on the circuit boards, to resist vertical separation and lateral skewing. The spacer pins 130 and the twist pins 34 thereby mechanically retain the circuit boards in the vertically separated or vertically spaced relationship. Although not shown, interior spacer pins 130 could also be employed to physically and mechanically separate and connect the circuit boards 32 at selected interior locations spaced inward from the edges of the circuit boards.

Each of the circuit boards 32 uses an electrically insulating substrate 138 (FIG. 7), through which holes have been drilled. Metallic conductive material, such as copper, is deposited into the drilled holes and over the upper and lower surfaces of the insulating substrate 138 using conventional printed circuit board plating techniques. The deposition of the conductive material on the inside cylindrical surfaces of the holes results in the formation of the metallic sidewalls 86 (FIG. 8) of the vias 60. The layer of deposited conductive material on the upper and lower planar surfaces of the insulating substrate 138 is thereafter etched away in selected patterns using conventional printed circuit board lithographic etching techniques. An annular ring 139 (FIG. 7) surrounding and integrally connected to the sidewalls 86 on opposite surfaces of the insulating substrate 138 is left in place (not etched away) to complete each via 60. Connective portions of the layer of deposited conductive material are also retained (not etched away) on the upper and lower planar surfaces of the insulating substrate 138, and these connective portions of conductive material form the traces 38. The traces 38 connect selected annular rings 139 of the vias 60, and thereby establish an electrical connection between the selected vias 60. It is through the vias 60 and the traces 38 that electrical signals, electrical power and electrical ground reference potential are distributed throughout each printed circuit board 32.

All of the printed circuit boards 32 which form the circuit module 36 need not be of the same size, as is illustrated by the circuit module shown in FIG. 9B. In this circuit module 36, the upper printed circuit board 32 is smaller in size than the other three printed circuit boards. Spacer pins 130 extend between the corners of the upper circuit board 32 located in the middle of the circuit module and between the other circuit boards. All of the circuit boards 32, even though of different sizes, are connected together firmly in the module using the spacer pins 130. Bolts and nuts and spacing devices (none shown) may be used as alternatives to the spacer pins 130.

The twist pins 34 which extend through the vias 60 of the four-board portion of the circuit module on the left as shown in FIG. 9B require the use of four bulges 84. The twist pins 34 which extend through the vias 60 of the three-board portion of the circuit module on the right as shown in FIG. 9B require the use of three bulges 84. Under circumstances where twist pins 34 of different lengths will be inserted in columns 58 of vias 60 at different locations in the circuit module 36, due to different numbers of printed circuit boards used in assembling the circuit modules 36, as exemplified by FIG. 9B, multiple lengths of twist pins 34 will be contained in the cartridge 50, and the proper length twist pin will be selected by the twist pin pickup subassembly 44 according to the location of the column 58 of vias 60 into which the pins will be inserted. The height of the insertion nozzle 57 above the upper circuit board 32 of the module 36 will also be adjusted by the motor 72 of the insertion subassembly 54 (FIG. 15), to insert different length twist pins in via columns of circuit modules having different height upper circuit boards.

Although each printed circuit board 32 is shown in FIGS. 9A and 9B as having deposited conductive material only on the upper and lower surfaces of the insulating substrate 138, multilayer printed circuit boards may also be used in the present invention. Multilayer printed circuit boards are formed by laminating together a plurality of two-sided circuit boards, using a layer of insulating adhesive between each two-sided circuit board. The resulting multilayer printed circuit board includes interior traces embedded within the center of the multilayer printed circuit boards, in addition to those traces 38 located on the exterior surfaces of the multilayer circuit boards.

Electrical circuit components 40, such as integrated circuits and discrete electrical components, are typically attached to at least some of the printed circuit boards 32 of the circuit module 36. The components 40 may be connected directly to the vias 60 or traces 38. The components may also be connected by sockets or other conventional interconnect interface devices that are connected to the vias 60 or traces 38, and then the components 40 are connected to those interface devices in a conventional manner. Electrical components 40 are shown attached to the upper printed circuit boards 32 in FIGS. 9A and 9B, and to both the upper and lower printed circuit boards 32 in FIG. 17. Circuit components 40 could also be connected to the middle printed circuit boards between the upper and lower circuit boards of the circuit module 36, provided that those circuit components have a sufficiently short height to fit within the space between adjacent circuit boards 32 in the module 36.

The arrangement of the vias 60 in each circuit board 32 and the interconnection of those vias with the traces 38 establishes the signal paths for the electrical signals conducted by each circuit board 32. The twist pins 34 establish the electrical signal paths for the electrical signals conducted between the circuit boards 32 in the module 36. The twist pins 34 are fully conductive along their entire length, allowing the signals to be distributed from the vias 60 to the traces 38 of each circuit board 32 of the module 36. In those cases where it is not desired to distribute a signal conducted by a twist pin to a via 60 of one circuit board 32, the via 60 through which the twist pin extends is not connected by a trace 38 to any other component on that printed circuit board.

A relatively large number of three-dimensional signal paths can be created in each circuit module 36, due to the very small spacing between vias 60 and a relatively large number of narrow traces 38 of each printed circuit board 32. The spacing shown in FIGS. 9A and 9B is exaggerated for purposes of illustration. In actuality, a very high density of traces 38 and vias 60 can be formed in a small amount of space. Such high density three-dimensional signal paths shorten the conductive paths and allow the circuit components 40 to function at higher switching rates and with more dense signal conductivity, among other things, thereby improving performance.

The large number of three-dimensional signal paths can become very complex. A complete and accurate understanding of the layout of the vias 60 and traces 38 in the circuit boards 32 of the circuit module 36 is required to establish the desired signal paths. Typically, the vias 60 and the traces 38 are laid out using computer controlled circuit design and layout software programs to create precise placement and connection of the signal paths on each printed circuit board 32. Such computer circuit design and layout programs establish the physical location and dimension of the traces 38, and the connection of the traces with the vias 60 in each of the circuit boards 32 of the module 36.

To ensure precision in the location of the holes drilled into the insulating substrate 138 (FIG. 7) before the conductive material is deposited on the substrate 138, computer controlled hole drilling maps are derived from the computer circuit design and layout programs used in fabricating the printed circuit boards. The hole drilling map specifies the location where each of the holes is drilled in the substrate 138 that becomes a via 60 once the conductive metal is deposited in the hole. Computer numerically controlled drilling machines drill the holes in the substrate 138 in the locations specified by the drilling map. Each circuit board 32 includes registration markings called "fiducials" which are used by the drilling map software to orient the layout of the printed circuit board and thereby define the positions where the holes are drilled in the insulating substrate 138.

Fiducials 144 are formed on the upper circuit board of the circuit modules, as shown in FIGS. 9A and 9B. The fiducials 144 are exemplified by marks or plated registration points formed on each of the circuit boards 32. The fiducials 144 are optically identified by the camera 116 (FIGS. 14 and 15) before any twist pins are assembled into each circuit module 36. The control system 120 (FIGS. 25A and 25B) uses the information from the hole drilling map, the optical registration information obtained from the camera 116, and other information obtained from the camera 116 to move the XY positioning table 70 of the circuit module positioning subassembly 68 and thereby locate each column 58 of vias 60 coincident with an axis 145 through the insertion nozzle 57 (FIG. 14) along which the twist pins are delivered. Such automated positioning ensures that each column 58 of the aligned vias 60 is in the best position to receive the leader 64 of the twist pin 34 when it is inserted (FIGS. 10A and 10B).

To move each column 58 of vias 60 so that its center location is coincident with the axis 145 through an insertion nozzle 57 of the insertion head 56 (FIG. 14), each circuit module 36 must be held in a fixed position on the XY positioning table 70 of the circuit module positioning subassembly 68. Each circuit module 36 is immovably attached to a pallet 146, shown in FIGS. 1-3 and 17, and the pallet 146 is immovably connected to the XY positioning table 70 by conventional registration devices (not shown) which interact between the positioning table 70 and the pallet 146. The pallet 146 includes at least one open receptacle 148 (FIG. 17) into which one three-dimensional circuit module 36 is received and locked in place by use of a conventional retention device (not shown) associated with each receptacle 148. The circuit module 36 is placed within the open receptacle 148 and immovably connected to the pallet 146 before any twist pins are inserted in the vias of that circuit module 36. The immovable connection of the circuit module 36 to the pallet 146 and the immovable connection of the pallet 146 to the XY positioning table 70 assure that the XY positioning table 70 can precisely align the columns 58 of vias 60 with the axis 145 through the insertion nozzle 57 of the insertion head 56 (FIG. 14).

As shown in FIG. 1, a plurality of circuit modules 36 can be connected to the pallet 146 in a corresponding number of receptacles 148. The twist pins 34 are assembled into all the circuit modules without the need to assemble the twist pins into one circuit module and then unload it from the XY positioning table before another module is assembled with twist pins. The fiducials 144 of each circuit module 36 are optically identified by the camera 116. The location information of the fiducials 144 is correlated to the hole drilling map information, and the location of each column 58 of vias in each circuit module 36 is then established from the hole drilling map information. In addition, the optical camera 116 is then used to evaluate the upper via 60 of each column 58 to determine whether it is centered in the location specified by the hole drilling map information. Optical recognition software used by the control system 120 (FIGS. 25A and 25B) responds to an optical pattern of light projecting upwardly through the column 58 of vias 60 to precisely identify the center of each via column 58. Adjustment information is applied to the hole drilling map information to precisely locate the center of each column 58. By using the precise center of each column 58 of the vias 60, the control system 120 moves the XY positioning table 70 to locate the center or axis of column 58 with the axis 145 through the insertion nozzle 57 (FIG. 14). The precise positions of the hole locations greatly facilitates the successful insertion of a twist pin in the column 58 (FIG. 10B). One twist pin is assembled in each column 58 of vias 60 in one interconnect assembly cycle, until twist pins 34 occupy all of the columns 58 of vias in the circuit module 36.

Assembly Cycle

Each interconnect or twist pin assembly cycle is automatically executed by the machine 30. Each assembly cycle includes inserting the twist pin 34 in the column 58 of aligned vias 60, pulling the twist pin to the location where the bulges 84 are compressed against the sidewalls 86 of the vias 60, severing the leader portion 64 while leaving the portion of the twist pin 34 with the bulges 84 in contact with the vias, and extracting the severed leader 64. The movement of a twist pin 34 during an assembly cycle is illustrated in FIGS. 10A-10H.

The twist pin 34 is delivered to the column 58 of aligned vias in a leader-first manner, as shown in FIG. 10A. The rounded leading end 78 of the twist pin 34, which may advantageously assume a parabolic shape, facilitates entry into the column 58. Once properly inserted, the leader 64 is of sufficient length to position the leading end 78 below and beyond the lower circuit board 32, as shown in FIG. 10B. Locating the leading end 78 of the leader 64 beyond the lower circuit board 32 permits it to be gripped by the pinch and cut blade 76, as shown in FIG. 10C.

The pinch and cut blade 76 includes two flexible jaw members 150 and 152 which move toward and away from one another as a result of movement imparted to the pinch and cut blade 76 by the grip and cut subassembly 74 (FIGS. 21-23). The terminal ends of the jaw members 150 and 152 are formed as sharp cutting wedges 154 and 156, respectively. The cutting wedges 154 and 156 face one another across an open space between the jaw members 150 and 152. As shown in FIG. 10C, the jaw members 150 and 152 move together sufficiently in a partially closed position to pinch the cutting wedges 154 and 156 into the sides of the leader 64 at its leading end 78. The cutting wedges 154 and 156 pinch into the sides of the leader 64 to the extent necessary to firmly grip the leader 64 without severing it, so that the twist pin 34 can be pulled. The cutting wedges 154 and 156 are positioned adjacent to the lower circuit board 32 by the movement of the linear/rotational motor 82 of the longitudinal movement subassembly 80, before the jaw members 150 and 152 are moved toward one another to pinch the cutting wedges 154 and 156 into the sides of the leader 64.

Figure 10D:
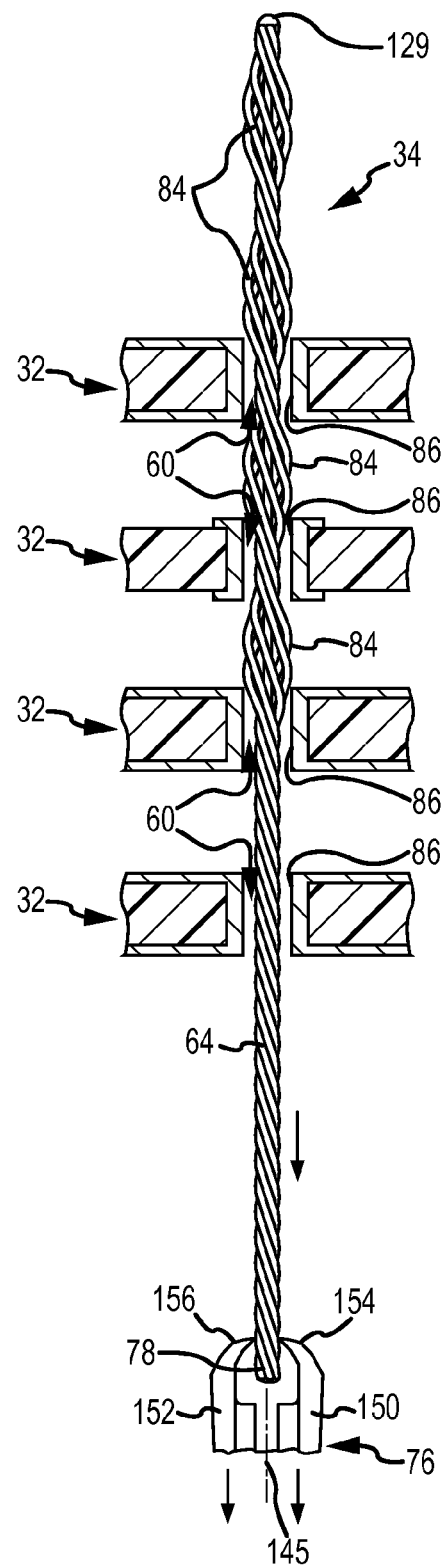

Next, as shown in FIG. 10D, the pinch and cut blade 76 is moved downward relative to the circuit boards 32 of the module 64 by the longitudinal movement subassembly 80, while the grip and cut subassembly 74 biases the jaw members 150 and 152 to maintain the cutting wedges 154 and 156 pinched into the sides of the leader 64. The linear/rotational motor 82 of the longitudinal movement subassembly 80 pulls the twist pin 34 downward the correct distance to position the bulges 84 in contact with the sidewalls 86 of the vias 60 in the column 58. The lower bulges 84 (as shown) move into and out of the upper vias 60 until the twist pin achieves its final assembled position.

As shown in FIG. 10E, the pinch and cut blade 76 pulls the twist pin 34 downward to its predetermined final position where the bulges 84 are located in contact with the sidewalls 86 of the vias 60 of the via column 58. The extent of downward movement represented in FIG. 10E is established by the amount of longitudinal movement of the longitudinal movement subassembly 80. With the twist pin 34 pulled into place, the jaw members 150 and 152 move apart to an open position to release the leader 64. The bulges 84 remain resiliently compressed against the sidewalls 86 of the vias 60 to hold the twist pin 34 in place in the assembled position.

Next, as shown in FIG. 10F, the pinch and cut blade 76 is moved to an upper cutting position, at which the cutting wedges 154 and 156 are slightly spaced below the lower circuit board 32. The linear/rotational motor 82 of the longitudinal movement subassembly 80 moves the grip and cut subassembly 74 and the pinch and cut blade 76 upward to this desired position. To permit the movement represented in FIG. 10F, the jaw members 150 and 152 move to an open position and separate transversely away from the position shown in FIG. 10E, thereby spacing the cutting wedges 154 and 156 laterally away from the outside surface of the leader 64. In this open position, the jaw members 150 and 152 and the cutting wedges 154 and 156 do not interfere with the upward movement of the pinch and cut blade 76 from the position shown in FIG. 10E to the position shown in FIG. 10F. The open position of the jaw members 150 and 152 allows the leader 64 to pass between the cutting wedges 154 and 156.

The longitudinal movement subassembly 80 moves the pinch and cut blade 76 along an axis which is vertically coincident with the axis 145 of the insertion nozzle 57 where the leader 64 is located. The leader 64 enters a conduction tube 162 of the grip and cut subassembly 74. The conduction tube 162 is positioned concentrically about the central axis 145.

The leader 64 is next severed by lateral inward movement of the jaw members 150 and 152 to the fully closed position, as shown in FIG. 10G. The cutting wedges 154 and 156 move together and sever the leader 64 from the bulged portion of the twist pin 34 which remains in the final assembled position within the module 64. The leader 64 is severed from the twist pin 34 at the cut-off end 88. Movement of the grip and cut subassembly 84 causes the jaw members 150 and 152 to move toward one another and force the cutting wedges 154 and 156 completely through the leader 64, thereby severing the leader.

Figure 24:
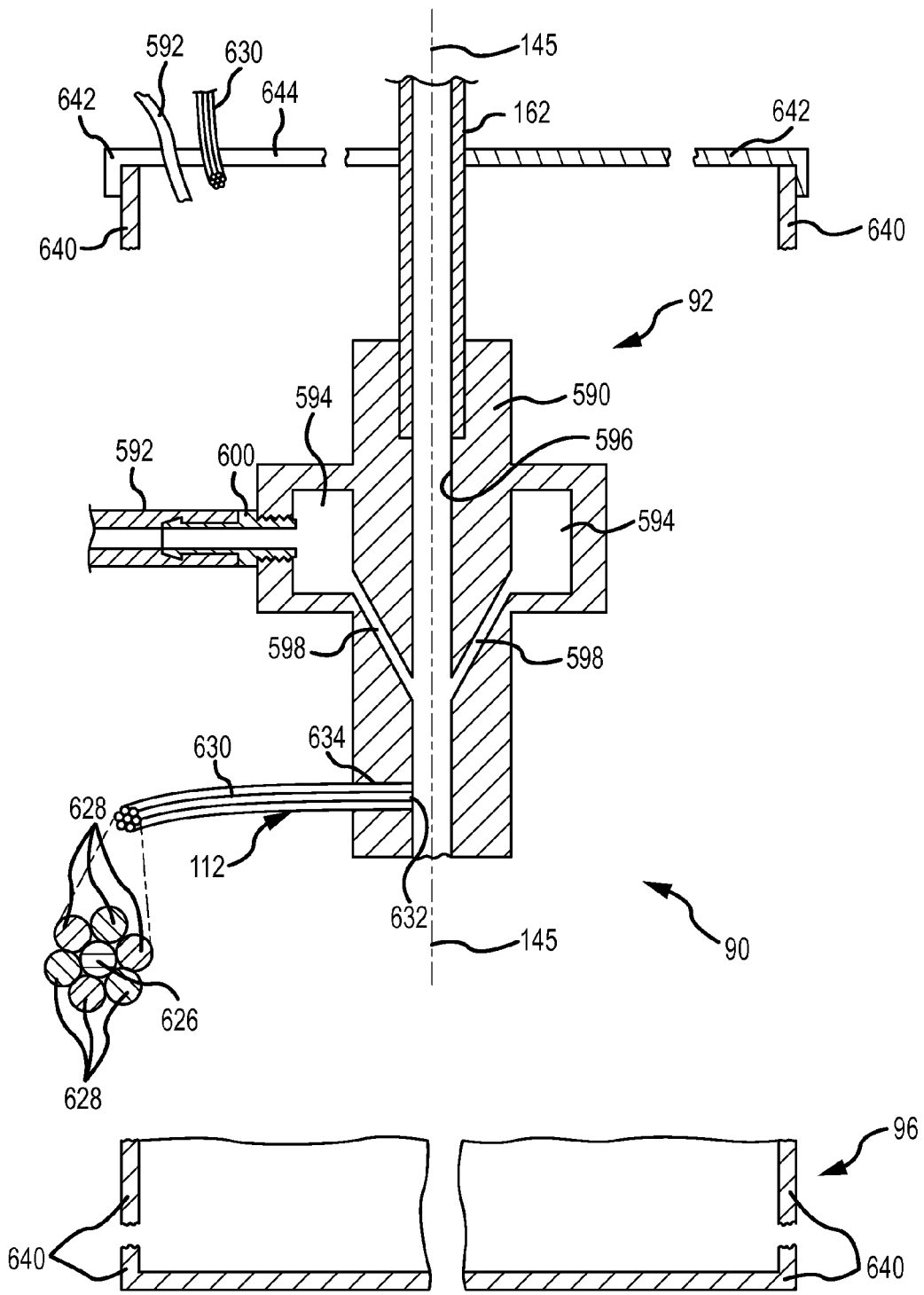
FIG. 24 is an enlarged, vertical section view of an venturi device and an optical sensor of the leader collection subassembly shown in FIGS. 1, 3, 16 and 17.

Finally, as shown in FIG. 10H, the severed leader 64 is extracted and transported away by the application of low air pressure or vacuum within the conduction tube 162 created by the venturi device 92 (FIGS. 3 and 24). The conduction tube 162 transports the severed leader 64 from the grip and cut subassembly 74 to prevent the severed leader 64 from interfering with the operations of the machine 30 in the next subsequent interconnect assembly cycle. The severed portion of the leader is transported away from the grip and cut subassembly 74 and the longitudinal movement subassembly 80 through the conduction tube 162 and is delivered to and collected in the collection chamber 96 (FIGS. 3 and 24) of the leader collection subassembly 90. Simultaneously with removing the severed leader 64, the jaw members 150 and 152 are moved away from one another to the open position to be ready to execute the next subsequent assembly cycle.

The subassemblies of the machine 30 automatically execute the following operations of assembling the twist pin in a via column (FIGS. 10A-10H): removing and singulating the twist pin, delivering the singulated twist pin to the column of vias, inserting the twist pin in the column of vias, gripping the twist pin, pulling the twist pin into the final position, severing the leader from the bulged portion of the twist pin remaining in the column 58, extracting the severed twist pin, and moving the circuit module 36 to align another column of vias for insertion of the twist pin. The automatic execution of these operations is coordinated among the subassemblies, and the overall assembly cycle is performed in a rapid continuous sequence which is continuously repeated. Operating in this manner, the machine 30 is capable of automatically assembling many twist pins in many via columns to complete circuit modules very quickly, efficiently and cost-effectively.

More details of the mechanical nature and specific operational aspects of the various components and subassemblies of the machine 30 are described below.

Frame and Component Support

Figure 11:
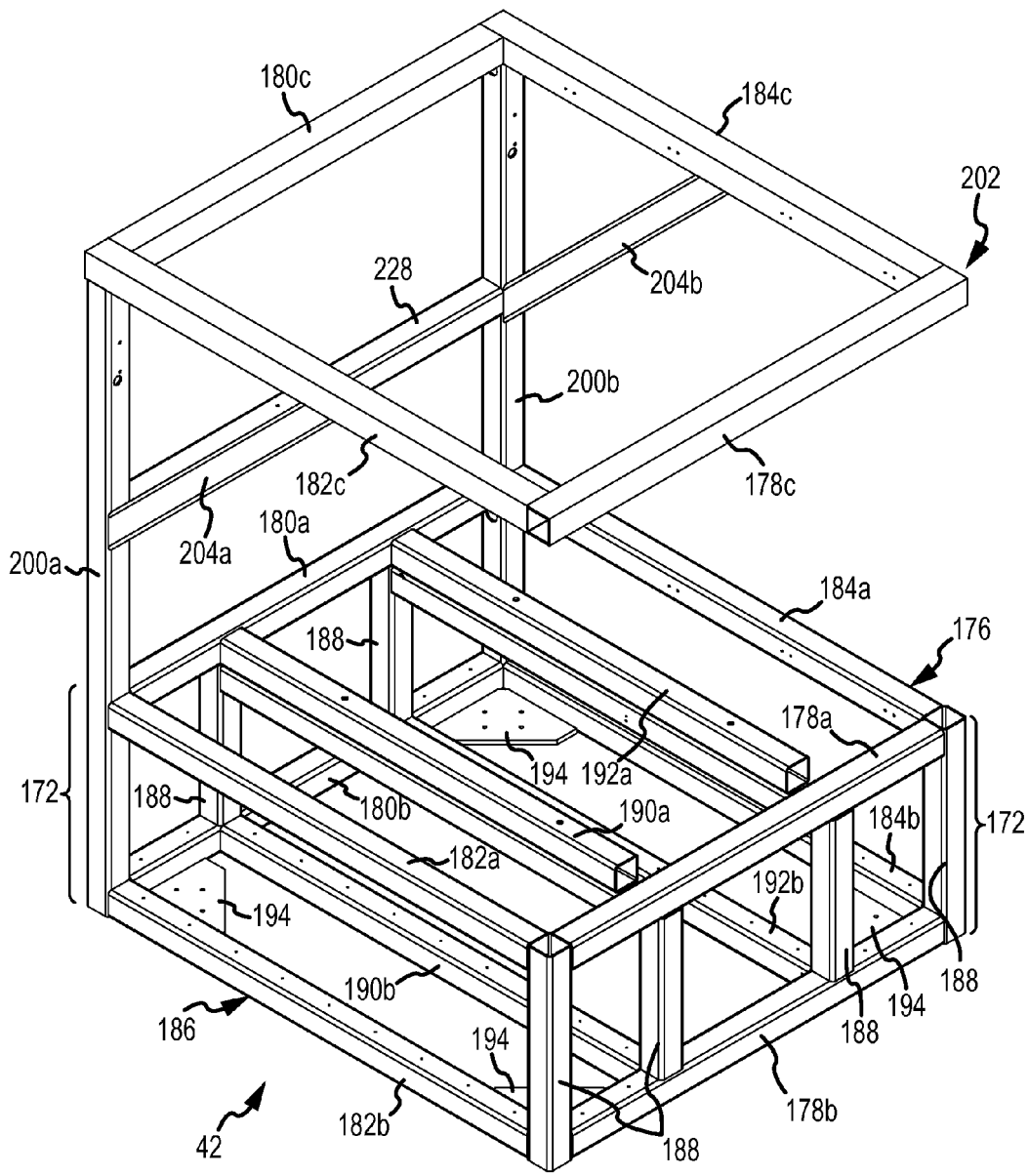
FIG. 11 is a perspective view of a frame of the machine shown in FIG. 1.

The subassemblies of the machine 30 are all connected to and supported by the frame 42 shown in FIG. 11 (also FIG. 1). The frame 42 is preferably formed by pieces of rectangular rigid steel tubing which have been welded or otherwise fastened together in the configuration shown. The frame 42 includes a lower, three-dimensionally-shaped rectangular base support structure 172. The base support structure 172 supports a slab of granite 174 (FIGS. 1-3 and 17), creating a table-like configuration to which the circuit module positioning subassembly 68, the grip and cut subassembly 74, the longitudinal movement subassembly 80 and portions of the leader collection subassembly 90 are all connected. The granite slab 174 is of substantial weight and inertia, and the inertia of the granite slab 174 substantially diminishes and dampens the reactive effects of the moving components of the subassemblies, thereby eliminating mechanical disturbances which would adversely affect the alignment and positioning necessary to achieve reliable twist pin insertion.

The base support structure 172 has an intermediate level rectangular configuration 176 formed by a front intermediate transverse piece 178a, a rear intermediate transverse piece 180a, and left and right intermediate longitudinal pieces 182a and 184a. A similarly shaped lower level rectangular configuration 186 is formed by similarly-shaped front lower transverse piece 178b, a rear lower transverse piece 180b, and left and right lower longitudinal pieces 182b and 184b. The pieces 178b, 180b, 182b and 184b are located directly below and oriented similarly to the corresponding pieces 178a, 180a, 182a and 184a which form the intermediate level configuration 176. The intermediate and lower level configurations 176 and 186 are separated by vertical separation pieces 188. The intermediate and lower level configurations 176 and 186, along with the vertical separation pieces 188, form the base support structure 172.

Two center support beams 190a and 192a are located within the intermediate-level configuration 176. The upper center beams 190a and 192a extend parallel to the longitudinal pieces 182a and 184a, and are connected to the vertical separation pieces 188 which extend between the intermediate and lower configurations 176 and 186. The lower configuration 186 also includes similarly shaped lower center beams 190b and 192b which are located directly below and oriented similarly to the corresponding center support pieces 190a and 192a.

The center support beams 190a and 192a support the granite slab 174. A layer of elastomeric material (not shown) is placed on top of the pieces 190a and 192a before the granite slab 174 is attached to the center beams 190a and 192a. The layer of elastomeric material further dampens and isolates the inertia of the granite slab 174 from external environmental influences transferred to the frame 42.

Plates 194 extend across the corners of the lower level rectangular configuration 176, at the inside of the intersections of the pieces 178b, 182b and 178b, 184b and 180b, 182b and 180b, 184b. Conventional casters 196 (FIG. 1) are connected to the plates 194 to allow the machine 30 to be rolled to a desired use position. Thereafter, conventional vibration isolators 198 (FIG. 1) are extended downward to support the machine 30 from a floor or other support surface and eliminate weight on the casters 196. The vibration isolators 198 (FIG. 1) are connected at the corners of the lower level rectangular configuration 186 at the intersection of the pieces 178b, 182b and 178b, 184b and 180b, 182b and 180b, 184b. The vibration isolators 198 reduce or avoid the transmission of physical vibration or other influences from the floor to the machine 30, further isolating such disturbances from adversely influencing the operation of the machine 30.

The vertical space between the lower configuration 186 and the intermediate configuration 176 of the base support structure 172 is available to receive some of the components of the control system 120 (FIGS. 25A and 25B), as well as the collection chamber 96 of the leader collection subassembly 90 (FIGS. 1 and 3). Doors or panels (not shown) are attached to the pieces 178a, 178b, 182a, 182b, 184a, 184b and the vertical supports 188 for the purpose of shielding the components on the left, right and front sides of the base support structure 172 of the machine 30.

Left and right vertically extending upright beams 200*a* and 200*b* extend vertically at opposite rear corners at the intersections of pieces 180*a*, 182*a* and 180*a*, 184*a* and 180*b*, 182*b* and 180*b*, 184*b*. The upright beams 200*a* and 200*b* extend considerably above the intermediate level configuration 176 of the base support structure 172. A rectangular halo structure 202 extends forward from the upper ends of the upright beams 200*a* and 200*b*. The halo structure 202 is formed by a front upper transverse piece 178*c*, a rear upper transverse piece 180*c*, and left and right upper longitudinal pieces 182*c* and 184*c*, which are located directly above and oriented similarly to the corresponding pieces 178*a*, 180*a*, 182*a* and 184*a* which form the intermediate-level configuration 176. Braces 204*a* and 204*b* extend at an angle between the intersection of the upright beam 200*a* and the longitudinal piece 182*c* and between the intersection of the upright beam 200*b* and the longitudinal piece 184*c*, respectively. The braces 200*a* and 200*b* support the halo structure 202 directly above the intermediate-level configuration 176.

As is shown in FIG. 1 and as understood from FIG. 11, the halo structure 202 of the frame 42 supports linear arrays 118*a*, 118*b* and 118*c* of light receivers respectively attached to the front upper transverse piece 178*c* and each of the left and right upper longitudinal pieces 182*c* and 184*c*. Each linear receiver array 118*a*, 118*b* and 118*c* receives a multiplicity of individual aligned, parallel and closely spaced beams of light which form the light curtain 117 (FIG. 1). The beams are created and focused upward by individual light emitters, such as LEDs, of linear arrays 119*a*, 119*b* and 119*c* of light emitters. The linear light emitter arrays 119*a*, 119*b* and 119*c* are attached to the intermediate pieces 178*a*, 182*a* and 184*a* at positions spaced closely adjacent to the front, left and right edges of the granite slab 174 (FIGS. 1-3).

The linear light receiving arrays 118*a*, 118*b* and 118*c* and the linear light emitting arrays 119*a*, 119*b* and 119*c* create the conventional light curtain 117 (FIG. 1) between the front, left and right edges of the granite slab 74 and the halo structure 202. Should any one of the individual beams be broken by the insertion of a human hand, for example, the machine 30 will immediately stop functioning. The light curtain 117 (FIG. 1) is a safety feature which prevents human injury and which prevents a foreign object from interfering with the operations of the subassemblies of the machine 30. The spacing between individual beams of light curtain 117 is less than the size of a human hand, or a finger on a hand, or the anticipated size of an interfering foreign object. Suitable light receiving and emitting arrays 118*a*-119*c*, and programmed instructions by which to create the light curtain 117, are available from Keyence Corporation of America, of Woodcliff Lake, N.J., USA.

The twist pin insertion subassembly 54 (FIGS. 2, 3 and 15) is not directly connected to the frame 42, but instead is connected to a transverse support beam 222. The transfer support beam 222 is connected to the granite slab 174 by transversely spaced suspension brackets 224*a*, 226*a* and 224*b*, 226*b* (FIG. 2). The suspension brackets 224*a* and 226*a* are connected to one and of the support beam 222, and the suspension brackets 224*b* and 226*b* are connected to the other ends of the support beam 222. The suspension brackets 224*a*, 226*a* and 224*b*, 226*b* are connected on their bottom surfaces to the top surface of the granite slab 174. In this manner, the beneficial inertial characteristics of the granite slab 174 are transferred to and from the support beam 222 and the twist pin insertion subassembly 54.

Figure 15:
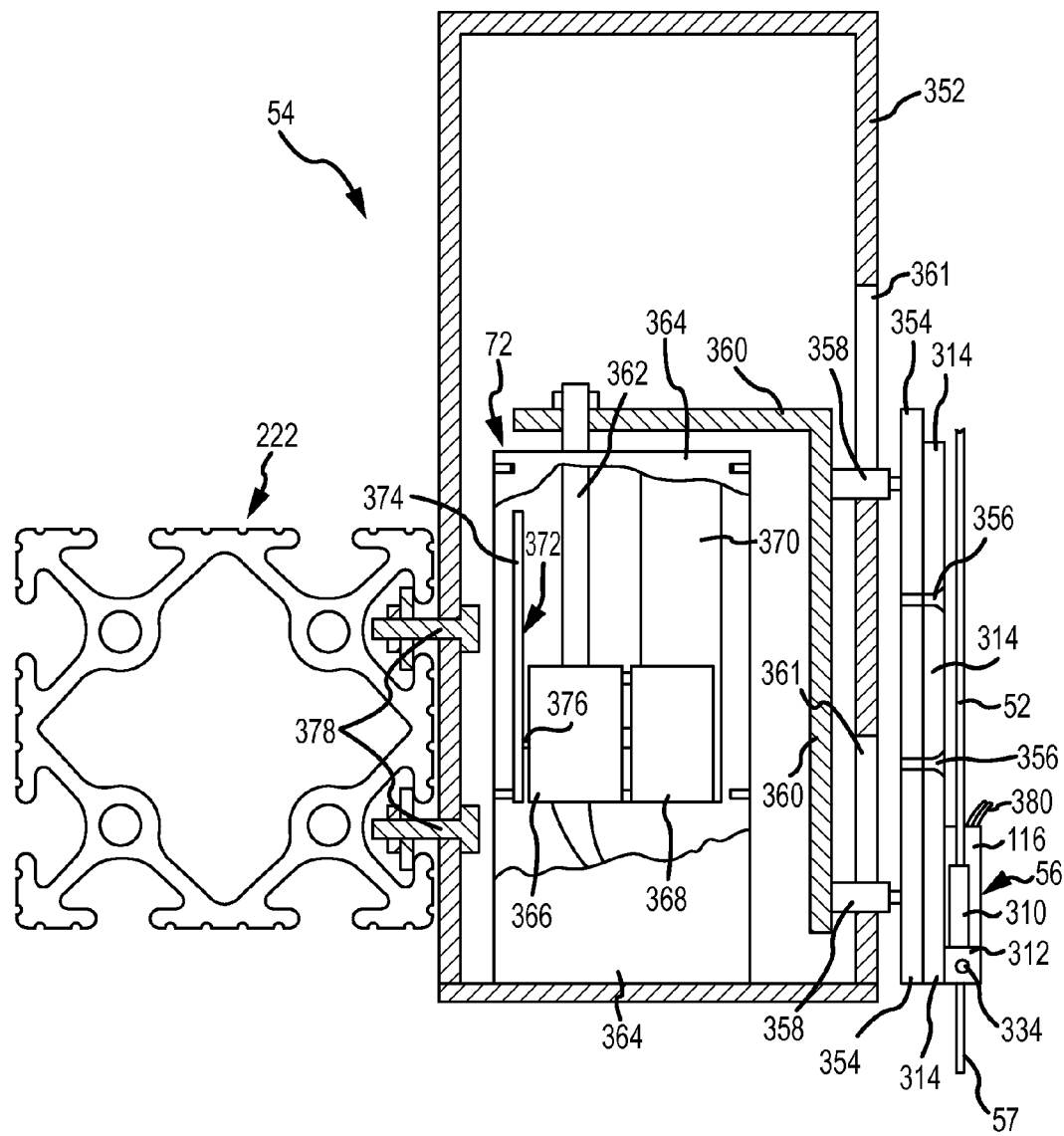
FIG. 15 is an enlarged vertical section view of the twist pin insertion subassembly shown in FIGS. 1-3 and a transfer support beam shown in FIGS. 1-3, in which a portion of a linear motor of the twist pin insertion subassembly is broken away to reveal certain internal components.

Preferably, the support beam 222 is formed of rigid extruded aluminum having the shape shown in FIG. 15 to avoid and minimize upward, downward, forward and backward reactive deflection in response to movement of the twist pin insertion subassembly 54. Any movement of the insertion head 56 (FIGS. 14 and 15) of the insertion subassembly 54 is transferred through the support beam 222 and the suspension brackets 224*a*, 226*a* and 224*b*, 226*b* to the granite slab 174.

A transverse beam 228 extends between the vertically extending upright beams 200*a* and 200*b*, at a point located above the intermediate piece 180*a* and the upper piece 180*c*. The transverse beam 228 supports the twist pin pickup subassembly 44, as shown in FIGS. 1 and 2. The orientation of the twist pin pickup subassembly 44 is generally inclined at approximately a 45° angle from the horizontal, to facilitate extraction of the twist pins from the cartridge 50.

Twist Pin Pickup Subassembly

Figure 12:
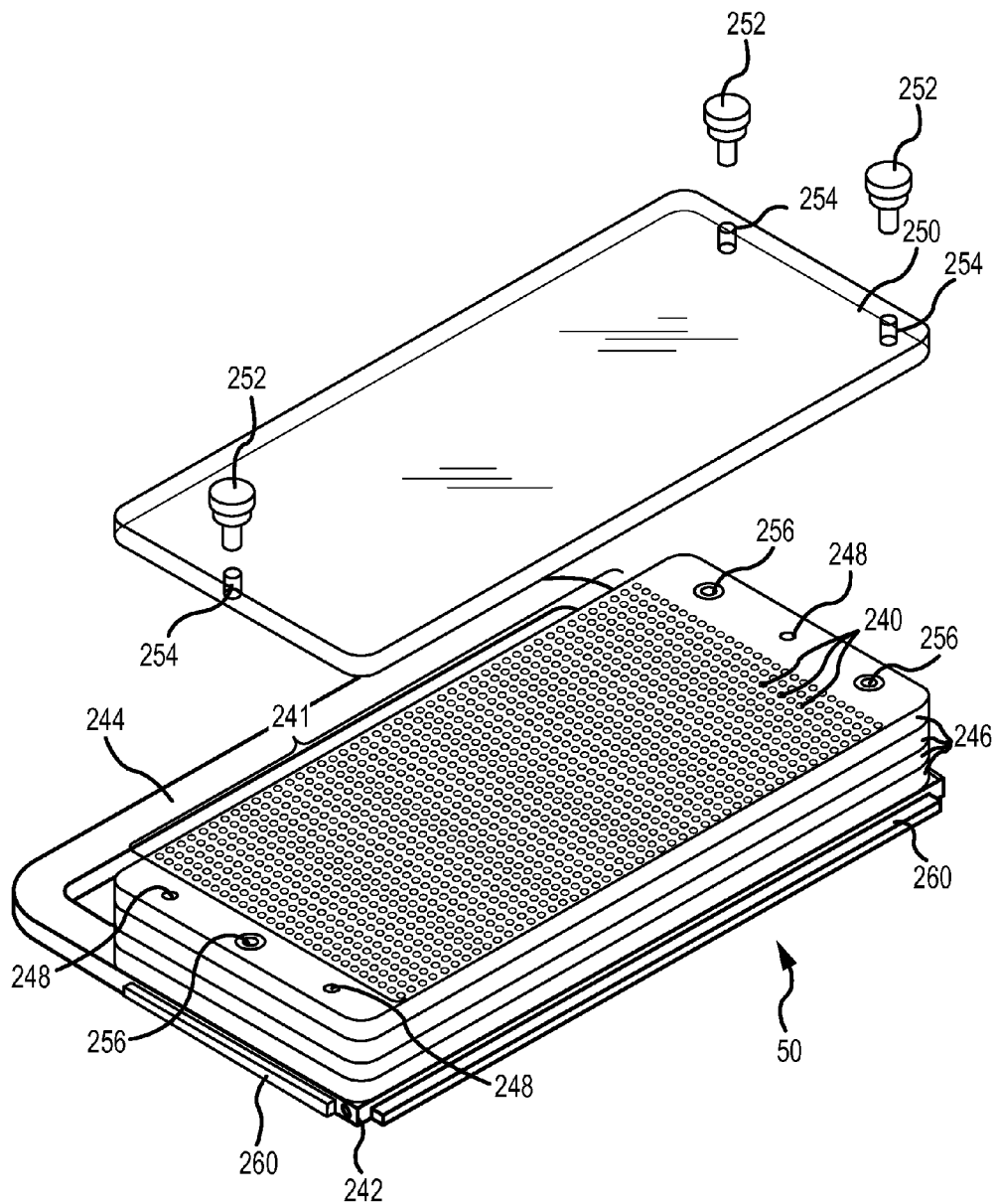
FIG. 12 is an enlarged perspective view of a twist pin cartridge used with the twist pin pickup subassembly shown in FIGS. 1 and 2, and also illustrating a cover plate shown in exploded relation to the twist pin cartridge.

The cartridge 50 of the twist pin pickup subassembly 44 has a relatively large number of receptacles 240 formed over a receptacle area 241, as shown in FIG. 12. Each receptacle 240 is formed at a predetermined and established location. Each receptacle 240 contains one twist pin 34 (FIG. 4). The cartridge 50 is connected to the XY positioning device 98 in a predetermined and fixed location, thereby allowing the XY positioning device 98 to move the cartridge 50 and place one receptacle 240 at a time below the pickup head 46. Gas pressure is applied to the pickup head 46 to create a partial vacuum within the receptacle 240 to remove the twist pin from the receptacle 240. The gas pressure also conveys the twist pin removed from the receptacle 240 through the delivery tube 52 to the twist pin insertion subassembly 54.

After the twist pin has been removed from the receptacle 240, the control system 120 (FIGS. 25A and 25B) controls the XY positioning device 98 to move the cartridge 50 to locate another receptacle 240 occupied by a twist pin 34 below the pickup head 46. After the prior twist pin has been assembled into the column of vias, the next twist pin is removed from the next receptacle 240 and is transported through the delivery tube 52 to the insertion head 46 in the same manner. The XY positioning device 98 continues moving the cartridge 50 in this manner until all of the twist pins necessary to assemble a circuit module have been removed from receptacles 240, or until all of the twist pins from the receptacles 240 of one cartridge 50 have been removed. When all of the twist pins from one cartridge have been used, the operation of the machine 30 ceases and the machine operator must then replace the empty cartridge 50 with a new cartridge 50 that is loaded with twist pins. Thereafter, the automated operation of the machine 30 continues to assemble the circuit module.

The cartridge 50 is shown in greater detail in FIG. 12. The cartridge 50 includes a pallet plate 242 from which a handle 244 extends. By grasping the handle 244, the entire cartridge 50 is manipulated. For example, the handle 244 is used to place the cartridge 50 on the XY positioning device 98, and to remove the cartridge 50 from the XY positioning device 98. The cartridge 50 is used to supply the twist pins to the twist pin pickup subassembly 44 and to store the twist pins until they are used.

The cartridge 50 is formed by at least one receptacle plate 246 connected to and supported from the pallet plate 242. Four receptacle plates 246 are shown in FIG. 12 as forming the cartridge 50. All of the receptacle plates 246 are basically identical in structure and configuration. All of the receptacle plates 246 include conventional registration and alignment posts 248 which hold the plates 246 in stacked alignment with one another. The registration posts 248 also extend into the pallet plate 242, allowing the stacked receptacle plates 246 to be held in a fixed relationship to the pallet plate 242. The registration posts 248 assure that the receptacle plates 246 and the pallet plate 242 maintain fixed relationships with one another.

Figure 13:
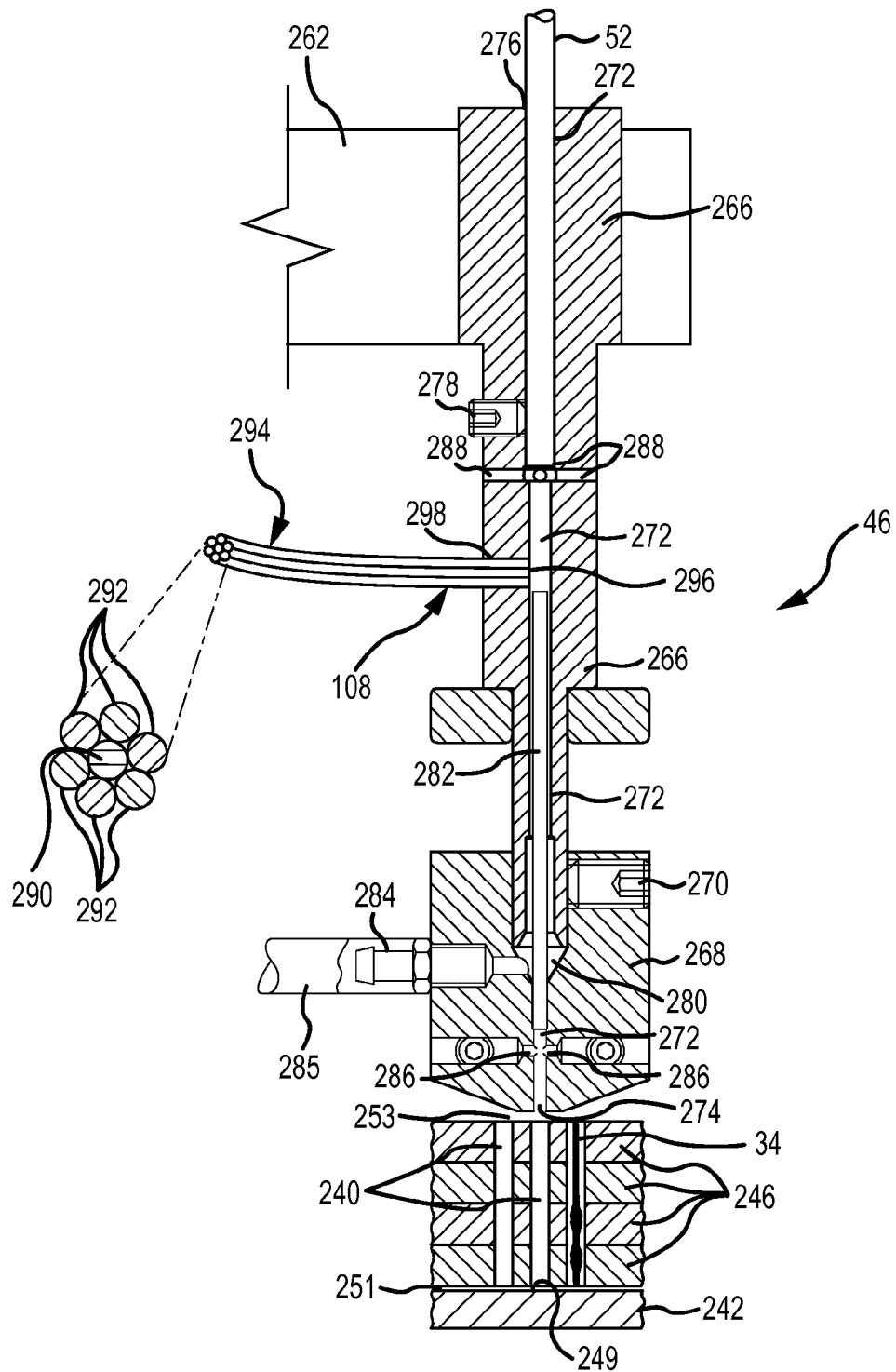
FIG. 13 is an enlarged vertical section view of a twist pin pickup head and optical sensor of the twist pin pickup subassembly shown in FIGS. 1 and 2, and a partial and large vertical section view of a portion of the cartridge shown in FIG. 12, taken substantially in a plane of the path of twist pin movement from a receptacle in the cartridge through the pickup head.

Each receptacle 240 is formed by a vertically aligned series of receptacle holes formed in the receptacle plates 246. The receptacle holes are formed at the same predetermined locations in each receptacle plate 246. With the receptacle plates stacked and held in registered alignment with one another by the registration posts 248, the receptacle holes in the receptacle plates 246 align with one another and create one twist pin receptacle 240 which extends continuously through the receptacle plates 246 from the upper surface (as shown) of the upper receptacle plate 246 to the lower surface of the lower receptacle plate 246. Each receptacle 240, like the receptacle holes which constitute each receptacle 240, is formed at a predetermined and precisely defined location on the cartridge 50. The information defining the position of each individual receptacle 240 in the receptacle area 241 is used by the control system 120 (FIGS. 25A and 25B) to move the XY positioning device 98 and establish the location of each receptacle 240 below the pickup head 46 (FIG. 13).

A relatively large number of receptacles 240 are typically located in the receptacle area 241. The close spacing between the receptacles 240 may result in as many as 10,000 receptacles in a receptacle area 241 of approximately 4 inches by 8 inches in size, under circumstances where each receptacle is 0.028 inches in diameter, for example. Different twist pin diameters may require different sizes of receptacles, and the sizes of the receptacles may adjust the number of those receptacles in the receptacle area 241. Each of the receptacle plates 246 is preferably formed of an aluminum alloy material having a vertical thickness of approximately 0.25 in. The number of receptacle plates 246 used in the cartridge 50 establishes the length of the receptacle. A fabricated twist pin having a length of approximately 0.5 in. will usually be about the shortest length twist pin used. More typically, the length of the fabricated twist pin will be approximately 1.0, 1.5 or 2.0 inches in length. Making each receptacle plate 246 with a thickness of 0.25 inches allows two to eight receptacle plates to be stacked and registered by the posts 248 on the pallet plate 242 to accommodate fabricated twist pins of the most-common lengths of 0.5-2.0 inches.

The receptacle holes formed in each receptacle plate 246 are best formed by drilling. Other types of hole formation techniques, such as laser drilling, are usually incapable of penetrating a sufficient depth, and the sidewalls are usually not as smooth and continuous as those sidewalls formed by drilling. Limiting the vertical thickness of each receptacle plate 246 to approximately 0.25 in. facilitates drilling. A shorter drill length offers a lesser risk of the drill deviating transversely from a desired axial path, and also permits the receptacle holes to be more quickly formed.

The pallet plate 242 is also preferably formed from an aluminum alloy material. A center area 249 (FIG. 3) of the pallet plate 242 underlying the receptacle area 241 is recessed below the lower surface of the lowermost receptacle plate 246. Because of the center recessed area 249 of the pallet plate 246, a space 251 (FIG. 13) exists at the lower end of each receptacle 240, between the lower surface of the lowermost receptacle plate 246 and the upper pallet plate 242. The space 251 permits each receptacle 240 to vent from its bottom end as the twist pin is removed from the receptacle 240 by partial vacuum at the top end of the receptacle 240. This venting capability permits more effective removal of each twist pin from its receptacle 240 by the pickup head 46 (FIG. 13), as well as the transportation of the twist pin through the delivery tube 52 to the pickup head 46 (FIGS. 1 and 2). This venting capability also allows the pickup head 46 (FIG. 13) to be vertically positioned closely adjacent to the upper surface of the upper receptacle plate 246. A smaller space 253 (FIG. 13) between the pickup head 46 and the upper receptacle plate 246 enhances the effectiveness of removing the twist pin from the receptacle 240 using low pressure or partial vacuum.

The recessed center area 249 (FIG. 13) in the pallet plate 242 beneath the receptacle area 241 also positions the twist pins in the receptacles 240 with their leading ends 278 (FIG. 4) located slightly below the upper surface of the upper receptacle plate 246. Consequently, any slight variation in length of the fabricated twist pins does not cause the leading end 78 of the leader 64 of the twist pin 34 (FIG. 4) to protrude slightly above the cartridge 50. Because the twist pins 34 are inserted leader-first into the column 58 of vias 60, the twist pin must be inserted in each receptacle 240 with the leading end 78 of its leader 64 located adjacent to the upper end of the receptacle 240 at the upper surface of the upper receptacle plate 246. If the leading end 78 was to project slightly above the upper surface of the upper receptacle plate 246, the end of the twist pin might be inadvertently contacted and the twist pin might be bent or distorted from its symmetrical configuration along its axis (FIG. 4), when a cover 250 is attached to the upper receptacle plate 246.

The cover 250 is attached to the upper receptacle plate 246 by thumb screws 252. Holes 254 are formed in the cover 250 through which a threaded shaft of each thumb screw 252 extends. Threaded holes 256 are formed in the upper receptacle plate 246 in a position to align with the holes 254 in the cover 250. The threaded shaft of each thumb screw 252 is threaded into the threaded hole 256 to hold the cover 250 in place on top of the upper receptacle plate 246. Placing the cover 250 on top of the cartridge 50 after the receptacles 240 have been loaded with twist pins keeps the twist pins in the loaded position within the cartridge and prevents dust and other foreign material from entering into the receptacles 240 and adversely influencing the capability of removing and delivering twist pins. When it is desired use the cartridge 50 in the machine 30, the cover 250 is removed.

In some circumstances, it is desirable to heat treat the twist pins after they are fabricated and before they are inserted in the columns of aligned vias. Heat treating induces desirable mechanical characteristics in the beryllium copper or other metal from which the twist pins are formed. By fabricating the pallet and receptacle plates 242 and 246 from aluminum or other metal or ceramic material, the twist pins may be heat treated while residing in the cartridge 50. The cartridge 50 with loaded twist pins is placed in an oven where the heat treatment occurs. Of course, the cover 250 is removed during heat treatment.

For the XY positioning device 98 to position the receptacles 240 precisely below the pickup head 46, the cartridge 50 must be retained in a fixed and predetermined location on an upper platform 258 of the XY positioning device 98 (FIG. 2). To fix the cartridge 50 in position, guide rails 260 are attached to three sides of the pallet plate 242. The guide rails 260 slide into correspondingly-shaped guide slots (not shown) formed on the upper platform 258 of the XY positioning device 98. The reception of the guide rails 260 into the guide slots (not shown) confines the cartridge 50 against movement in the plane of the upper platform 258 of the XY positioning device 98. In addition, the upper surface of the cartridge 50 is located at a predetermined and consistent height relative to the upper platform 258. The position of the pickup head 46 or the position of the upper platform 258 of the XY positioning device 98 is adjustable to accommodate different thicknesses of the cartridge 50 formed by different numbers of stacked receptacle plates 246. The upper surface of the upper receptacle plate 46 over the receptacle area 241 must also be coplanar with the plane of the upper platform 258. Such a coplanar relationship maintains the same desired vertical height of the pickup head 46 above the upper surface of the upper receptacle plate 246 over the receptacle area 241 as the XY positioning device 98 positions each receptacle 240 for removal of a twist pin.

In addition to the upper platform 258 shown in FIG. 2, the XY positioning device 98 includes the stepper motors 102 and 104 which move the platform 258 in the front and back and the side to side directions. The stepper motors 102 and 104 are connected to conventional mechanical movement mechanisms (not shown) which transfer the rotational movement of the motors 102 and 104 into linear movement, thereby creating the front and back and side to side movements of the upper platform 258 necessary to position each receptacle 240 beneath with the pickup head 46 (FIG. 13). The stepper motors 102 and 104 are rotated into precise positions in response to control signals supplied by the control system 120 (FIGS. 25A and 25B). In general, the XY positioning device 98 is conventional.

The stepper motors 102 and 104 achieve a high degree of precision in moving the mechanical mechanisms of the XY positioning table 98. Consequently, a high degree of precision in both the X and the Y dimensions is available from the XY positioning device 98. This high degree of precision allows each receptacle 240 of the cartridge 50 to be placed directly below the pickup head 46 (FIG. 13), to extract a twist pin from each receptacle. As a twist pin is removed from each receptacle 240, the control system 120 (FIGS. 25A and 25B) controls the motors 102 and 104 to position another receptacle 240 containing a twist pin below the pickup head 46 to allow the next twist pin to be removed from that receptacle during the next assembly cycle.

The XY positioning device 98 and the cartridge 50 retained on the platform 258 are oriented at a 45° angle to the horizontal, as shown in FIG. 2. The 45° angular orientation moves each twist pin to the lower curved surface of each receptacle 240 due to the effects of gravity. Consequently, the twist pins are located in all of the receptacles 240 at approximately the same location relative to an axis through each receptacle. The same positioning of the twist pins in the receptacles facilitates precise positioning of the pickup head 46 relative to the receptacle to achieve the best removal effect. The 45° angle is also effective in keeping the twist pins in the fully depressed position in each receptacle 240, with the tail end 129 of each twist pin 34 (FIG. 4) located in contact with the recessed center area 249 of the pallet plate 242 (FIG. 13). The downward gravity force on each twist pin in its receptacle prevents the leading ends 78 (FIG. 4) from extending beyond the upper surface of the cartridge 50 and from interfering with the pickup head 46 during movement of the cartridge 50.

The pickup head 46 is supported over the receptacle area 241 by an arm 262, as shown in FIGS. 2 and 13. One end of the arm 262 is rigidly connected to the pickup head 46 by use of a conventional clamp (not shown but understood from FIG. 13), and the other end of the arm 262 is connected to a support plate 264 connected to the transverse beam 228 of the frame 42 (FIG. 11). The XY positioning device 98 is attached to the support plate 264. The arm 262 and the support plate 264 establish a fixed position for the pickup head 46, and it is with respect to this fixed position that the XY positioning device 98 moves the platform 258 with the attached cartridge 50 to locate each receptacle 240 beneath the pickup head 46 (FIG. 13).

As shown in FIG. 13, the pickup head 46 includes a main body 266 and a nozzle 268. The nozzle 268 is connected to the lower end of the main body 266 by a set screw 270. When connected together, the nozzle 268 and the main body 266 defined a continuous, elongated and axially positioned passageway 272 which extends from a pickup end 274 of the nozzle 268 through an upper end 276 of the main body 266. The delivery tube 52 is connected into the upper end 276 of the passageway 272 in the main body 266 by a set screw 278.

The passageway 272 at the pickup end 274 has a diameter which is approximately the same or slightly smaller than the diameter of a receptacle 240 in the cartridge. The passageway 272 at the pickup end 274 is located in the most advantageous position relative to the receptacle 240 to extract the twist pin. The most advantageous pickup position can be slightly laterally offset from a coaxial relationship of the passageway 272 with the receptacle 240, because each twist pin will reside on the bottom curved side of the receptacle due to the 45° angular orientation of the cartridge 50, as described above.

The passageway 272 extends into a venturi chamber 280. A middle tube 282 extends through the venturi chamber 282 and into the passageway 272 at the lower (as shown) portion of the main body 266. The middle tube 282 conveys the twist pins from the pickup end 274 of the passageway 272 into the passageway 272 in the main body 266. The interior surface of the middle tube 282 smoothly continues the surface of the passageway 272 extending from the pickup end 274, to avoid any discontinuity which might inhibit the upward movement of twist pins from the pickup end 274 through the passageway 272.

Pressurized gas, typically air, is delivered from a gas source (706, FIG. 25B) to the venturi chamber 280 through a hose 285 connected to an input fitting 284. The gas entering the venturi chamber 280 flows upward around the outside of the middle tube 282 due to the slightly larger inside diameter of the passageway 272 compared to the larger outside diameter of the middle tube 282. The gas flow rate increases as it flows around the middle tube 282 due to a reduced cross-sectional size of the space between the middle tube 282 and the passageway 272. When the gas exits from the space between the middle tube 282 and the passageway 272 at the upper end (as shown) of the middle tube 282, a low pressure area is created adjacent to the upper end of the middle tube 282. This low pressure is communicated downward through the middle tube 282 to create low pressure or partial vacuum at the lower end of the middle tube at the pickup end 274.

The low pressure at the pickup end 274 removes the twist pin from the receptacle 240 of the cartridge 50, by lifting the twist pin through the pickup end 274 of the nozzle 268 and into the middle tube 282. The momentum of the upward movement (as shown) of the twist pin through the middle tube 282 propels it beyond the upper end of the middle tube 282, where the upward flowing gas at that location continues to transport the twist pin upward in the passageway 272 and into the delivery tube 52. The gas flow continues through the delivery tube 252 while carrying the twist pin, and the gas delivers the twist pin from the delivery tube 52 into the insertion nozzle 57 of the insertion subassembly 54 (FIG. 14).

Vent holes 286 are formed transversely into the lower portion of the passageway 272 in the nozzle 268 at the pickup end 274. The vent holes 286 are formed with a predetermined configuration to vent some of the low pressure to the ambient environment, thereby controlling the amount of force applied to remove the twist pins from the receptacles. Vent holes 288 are also formed in the main body 266 to intersect the middle portion of the passageway 272. The vent holes 288 vent some of the pressurized gas to the ambient environment. The venting through the holes 288 reduces back pressure at that location which has the effect of increasing the partial vacuum within the middle tube 282, thereby enhancing the capability of the partial vacuum to remove the twist pin from the receptacle.

The gas flow rate through the delivery tube 52 should be sufficient to assure that the twist pins are carried into the insertion nozzle 57. An appropriate arrival speed of the twist pins at the via column 58 assists in inserting the twist pins in the properly seated position (FIG. 10B). An excessively high delivery speed increases the possibility that the twist pin will impact the upper via 60 of the column 58 with such force that the twist pins rebound out of the column 58. A relatively high rate of speed enhances the possibility of an occasional undesired deflection of the twist pin from the column 58 or from a properly seated position, if the leading end 78 of the twist pin 34 inadvertently contacts the edge of an intermediate via in the column 58. The appropriate delivery speed of the twist pin facilitates the twist pin projecting cleanly into the column 58.

The optical sensor 108 is incorporated in the pickup head 46. The optical sensor 108 is formed by a plurality of individual light conducting optical fibers 290 and 292. The optical fibers 290 and 292 form a conventional optic fiber bundle 294. The optical fibers 290 and 292 are formed of conventional light transmissive material which has an index of refraction that confines light within each of those fibers as the light passes along the length of those fibers. The optical fiber 290 is a center fiber in the bundle 294, and the other optical fibers 292 are exterior fibers which surround the center fiber 290. An end 296 of the fiber bundle 294 is inserted into a receptacle 298 which has been formed transversely into the main body 266 to intersect the passageway 272. The end of 296 of the bundle 294 is held in the receptacle 260 by a retainer (not shown).

The optical fibers 290 and 292 are exposed at the end 296, and are therefore capable of transmitting and receiving light from their exposed ends. Light from a light source (not shown) is transmitted through the center optical fiber 290, and that light exits from the center optical fiber 292 at the end 296 to illuminate the passageway 272. Light is reflected within the passageway 272 and is picked up and transmitted back to an optical transducer (742, FIG. 25B) connected to the exterior optical fibers 292.

When a twist pin moves past the end 296 of the fiber bundle 294, the light received by the exterior light fibers 292 at the end 296 is changed by the passage of the twist pin. The changed characteristics of the light are sensed by the optical transducer, and the changed light characteristics are detected as representing the passage of a twist pin. It is in this manner that the control system 120 (FIGS. 25A and 25B) uses the optical sensor 108 to detect the passage of a twist pin through the pickup head 46.

The delivery tubing 52 is formed from conventional metal hypodermic tubing, which provides a uniform and smooth continuous interior surface to avoid creating obstructions or restrictions to the movement of the twist pin.

Twist Pin Insertion Subassembly

The delivery tube 52 transports the twist pin 34 to the insertion head 56 of the twist pin insertion subassembly 54, as shown in FIG. 14. The XY positioning table 70 of the circuit module positioning subassembly 68 (FIGS. 1-3) has previously located the circuit module 36 with a column 58 of aligned vias 60 in a position to receive the twist pin 34 (FIG. 10A). The twist pin 34 is conveyed from the delivery tube 52 into the insertion nozzle 57, and the insertion nozzle 57 directs the twist pin 34 along its axis 145 into the column 58 of aligned vias.

The insertion head 56 employs a delivery tube retention block 310 and a nozzle retention block 312, both of which are connected to a mounting plate 314. The delivery tube 52 is retained in a bore 316 formed in the retention block 312 by a set screw 318. The nozzle 57, preferably formed from borosilicate glass, is retained in a bore 322 formed in the nozzle retention block 312, and is held in position by a set screw 324. An entry end 326 of the nozzle 57 abuts the delivery end of the delivery tube 52. The entry end 326 of the nozzle 57 is angled divergently outward to facilitate receiving the twist pin 34 as it travels from the delivery tube 52 into the nozzle 57.

A center passage 328 of the nozzle 57 is smaller in diameter than the inside diameter of the delivery tube 52, so the angled entry end 326 is important in aligning the twist pin 34 with the axis 145 of the center passage 328. The diameter of the center passage 328 is slightly greater than the diameter of the bulges 84 of the twist pin 34 (FIG. 4), and the length of the center passage 328 is longer than the distance between two adjoining bulges 84. As a consequence of these relationships, the leader 64 of the twist pin 34 becomes aligned coaxially with the axis 145 when the twist pin passes through the insertion nozzle 57. This coaxial alignment of the leader 64 facilitates inserting that leader into the column 58 of aligned vias (FIG. 10B).

One of the benefits of forming the nozzle 57 from glass is that the glass resists wear caused by the friction of the twist pins moving through the nozzle 57. Glass also presents low friction to the movement of the twist pins. A glass nozzle 57 also allows the optical sensor 110 to sense the passage of a twist pin through the insertion head 56 and to determine whether the twist pin has been properly inserted in the column 58 of aligned vias 60.

The optical sensor 110, like the optical sensor 108 described previously in connection with the pickup head 46 (FIG. 13), is also formed by a plurality of individual light conducting optical fibers 330 and 332. The optical fibers 330 and 332 form a conventional optic fiber bundle 334. The optical fibers 330 and 332 are formed of conventional light transmissive material with an index of refraction which confines light within those fibers. The optical fiber 330 is a center fiber in the bundle 334, and the other optical fibers 332 become exterior fibers which surround the center fiber 330. An end 336 of the fiber bundle 334 is inserted into a receptacle 338 which has been formed transversely into the nozzle retention block 312 to intersect the bore 322. The end 336 is held in place in the receptacle 338 by a set screw 340. The optical fibers 330 and 332 are exposed at the end 336, and are therefore capable of transmitting and receiving light from their exposed ends.

Light from a light source (not shown) is transmitted through the center optical fiber 330, and the light exits from the center optical fiber 330 at the end 336 and projects through the glass insertion nozzle 57 to illuminate the center passage 328. Light is reflected within the center passage 328 and is picked up and transmitted back to an optical transducer (744, FIG. 25B) connected to the exterior optical fibers 332. The optical sensor 110 is located just below the position where the tapered entry end 326 transitions into the center passage 328 in the glass insertion nozzle 57.

When a twist pin moves through the glass insertion nozzle 57, the light received by the exterior light fibers 332 at the end 336 is changed as a result of the passage of the twist pin. The changed characteristics of the light are sensed and detected as representing the passage of a twist pin. In this manner, the control system 120 uses the optical sensor 110 to detect the passage of a twist pin through the insertion head 56 and into the column 58 of aligned vias.

The complete insertion of the twist pin 34 into a properly seated position in the column 58 of aligned vias (FIG. 10B) is further detected by the optical sensor 110. When properly seated, the tail end 129 of the twist pin 34 is located approximately transversely with respect to the end 336 of the fiber bundle 332, as shown in FIG. 14. The presence of the tail end 129 of the twist pin 34 at this location modifies the amount of light reflected to the optical fibers 332, compared to the amount of light reflected when the twist pin is not present at all in the center passage 328 or when the twist pin is fully present in the center passage 328 as the twist pin passes through the insertion nozzle 57. The light characteristics resulting from the presence of the tail end 129 of the twist pin 34 across from the end 336 of the optical fibers 332 is detected to establish that the twist pin is properly seated.

Although not shown in FIG. 14, the height of the optical sensor 110 may be made adjustable in the retention block 312 to accommodate different lengths of twist pins. Different length twist pins will result in the tail end 129 having a different height above the upper circuit board and within the center passage 328 when the twist pin is properly seated in the via column 58. Alternatively, a different length insertion nozzle 57 can be used for each different length of twist pin, with the length of the insertion nozzle correlated to the position of the optical sensor 110 and the position of the tail end 129. In those circumstances where different length twist pins are assembled into a single circuit module, the height of the insertion head 56 can be moved vertically a predetermined amount after each longer twist pin is inserted to position the optical sensor 110 across from the tail end 129 of the longer inserted twist pin and thereby determine the seating condition of the twist pin. After determining that the twist pin is properly seated, the insertion head 56 may move the insertion nozzle 57 closer to the upper circuit board of the module to insert the next twist pin in the next via column in the next assembly cycle. This technique requires the insertion head 56 to move up and down with each assembly cycle to determine the properly seated position.

The optical sensor 110 is also capable of detecting the unusual circumstance of a twist pin bouncing upward and out of its properly seated position. The detection of the twist pin moving through the insertion nozzle 57 occurs in the manner described. Thereafter, if the twist pin is properly seated for a short time instant, the light reflected from the tail end 129 of the twist pin 34 will indicate that fact, for that short time instant. Then, if the twist pin rebounds or bounces from its properly seated position, the light reflected will be similar to that of the twist pin passing through the nozzle 57 during initial insertion. This difference in light characteristics and the timing or sequence of those characteristics indicates that the twist pin has bounced from its properly seated position.

A similar situation exists if the twist pin 34 does not seat properly, as might occur if the leading end 78 happens to hang up on one of the vias 60 in the column 58, rather than passing completely through the column 58 (not shown but understood from FIGS. 10A and 10B). Under this circumstance, the tail end 129 of the twist pin stops above the location of the end 336 of the fiber bundle 334, and the resulting optical signal will present light conditions similar to the continuous presence of the twist pin in front of the optical sensor 110. This condition is recognized as an improper insertion condition of the twist pin.

Under conditions of an improperly seated twist pin, one or more attempts to automatically seat the initially improperly seated twist pin are performed. These attempts involve delivering pulses or short blasts of pressurized gas through the delivery tube 52. The pulses of pressurized gas are introduced at the pickup head 46 of the pickup subassembly 44, in the manner previously described in connection with FIG. 13. As understood from this previous description, the pressurized gas flows through the delivery tube 52 and into the insertion gas nozzle 57. The passage of the pulse of gas may be successful in disturbing or moving the improperly seated twist pin, and causing it to move into a properly seated position. The optical sensor 110 determines if and when the twist pin 34 becomes properly seated by sensing the light characteristics when the tail end 129 of the twist pin 34 is directly across from the end 336 of the optical fiber bundle 334. If the delivery of gas in this manner does not establish the proper seating of the twist pin after a number of such attempts, the control system 120 (FIGS. 25A and 25B) ceases operation of the machine 30 and the machine operator is notified of the necessity to remedy the problem.

The optical camera 116 is connected to the mounting plate 314 of the insertion head 56 with an attachment bracket 342, as shown in FIG. 14. The optical camera 116 views images along an optical axis 344. The optical axis 344 is oriented parallel to, and is offset a predetermined distance from, the axis 145 of the insertion nozzle 57. The optical axis 344 is precisely defined and used to establish the location of the fiducials 144 on the circuit modules 36 (FIGS. 9A and 9B). Using the fiducials 144 allows the expected locations of the vias 60 of the columns 58 to be established. The hole drilling map information is correlated to the location of the fiducials 144. Locating the fiducials 144 on the circuit module allows the hole drilling map information to be coordinated with the expected location of the upper via 60 in each column 58 in the circuit module, as established by the movement of the XY positioning table 70 relative to the axis 145 through the insertion nozzle 57.

The optical camera 116 is used with a conventional optical recognition software program to determine whether the actual location of the column 58 of vias 60 on the circuit module 36 deviates from the expected location defined by the hole drilling map information. Such a deviation could occur during the process of manufacturing each printed circuit board 32 if the holes drilled during manufacturing of the printed circuit boards 32 were not precisely in the positions defined by the hole drilling map information. To evaluate the actual position of each via column 58, the XY positioning table 70 moves the circuit module to locate the via column in the expected position of the upper via 60 relative to the optical axis 344. The optical recognition software then determines the optical center of the via column 58 based on the intensity and pattern of light received by the camera 116. Upon detecting that the optical center of the upper via 60 is not precisely at the location expected from the hole drilling map information, the optically determined actual center location of the via column is used to modify the hole location coordinates obtained from the hole drilling map information. This modified hole location is used when inserting a twist pin in the via column 58; the XY positioning table 70 moves the circuit module to locate the actual center of the via column 58 in alignment with the axis 145 of the insertion nozzle 57. The modified hole position obtained in this manner facilitates the successful insertion of each twist pin.

In addition to the capability of determining the actual center of each via column 58, the camera 116 and its associated optical recognition software have the capability of identifying any obstructions that might be present in the column 58 of aligned vias. Obstructions present in the column 58 are recognized by the pattern and intensity of the light passing through the column 58 and viewed by the camera 116. Further still, the camera 116 and its associated optical recognition software have the capability of determining whether the vias 60 in the via column 58 are aligned sufficiently to allow a twist pin to be successfully inserted. The alignment is also evaluated from the pattern and intensity of light viewed by the camera 116.

Any column 58 of vias 60 which is obstructed or which is sufficiently misaligned so that a twist pin is unlikely to be successfully inserted is identified, the coordinates of that column are added to a skip list, and no twist pin is attempted to be inserted in the column. The control system 120 (FIGS. 25A and 25B) uses the skip list to not insert twist pins in those columns. After assembling twist pins in all of the columns 58 other than those obstructed or misaligned columns, the machine operator is provided with the skip list information. This information will allow the operator to determine whether a twist pin can be inserted manually, or whether the circuit module must be discarded. Alternatively, the columns on the skip list could be identified to the machine operator before assembly cycles are performed, to allow the machine operator to evaluate and override determinations of those columns on the skip list.

Optically determining the position, obstruction and alignment of each column of vias is preferably executed as a continuous process in which all of the columns 58 of aligned vias are scanned by moving each column 58 beneath the optical axis 344 of the camera 116 before any twist pins are inserted. Alternatively, the same information may be obtained simultaneously while performing assembly cycles. The precise relationship of the optical axis 344 of the camera 116 and the axis 145 of the insertion nozzle 57 allows the camera 116 to scan and evaluate columns 58 of vias for position, obstructions and alignment in advance of inserting the twist pins. A look-forward type of scanning is required under these circumstances, and information concerning each column 58 is determined one or more assembly cycles in advance of assembling the twist pin in that column 58.

Depending upon the relative locations of the axes 145 and 344, it may be necessary for the XY position table 70 to move and stop intermittently between each optical scanning position and each twist pin insertion position, when the via columns are evaluated simultaneously with assembling the twist pins in the via columns 58. Moving directly from one insertion position to another insertion position may not be possible, without stopping at or backtracking to an optical scanning position. Such movement could slow the assembly process, and it is for this reason that optically scanning all of the columns 58 of vias before commencing the insertion of the twist pins is beneficial in most circumstances. If all of via columns 58 are optically scanned for position, obstructions and alignment beforehand, the optical camera 116 is not used during the twist pin insertion process, because all of the information obtained from previously scanning all of the columns of vias will have already created the skip list and established the coordinates of the actual centers of the via columns 58.

To ensure that sufficient light is projected upwardly through the columns 58 of vias 60, three racks 346 of high intensity lights 348 are located on the upper surface of the granite slab 174 beneath the circuit module 36 and surrounding the grip and cut subassembly 74 and the longitudinal movement subassembly 80, as shown in FIGS. 3 and 17. The lights 348 are preferably light emitting diodes (LEDs), and those LEDs are directed to project a substantial amount of their light upward toward the circuit module 36 connected to the pallet 146 (FIG. 17). The amount of upward projected light from the light racks 346 assures that enough light will pass upward through each column 58 of vias to allow the optical camera 116 and its associated optical recognition software to determine the actual center position of the via column 58, to determine the presence of an obstruction in the column 58, and to determine whether the column 58 is sufficiently aligned to automatically accept a twist pin.

Conventional optical recognition software is used to evaluate the columns 58 of vias 60 for position, obstruction and alignment. One suitable optical recognition software package usable for these purposes is a Visionscape® GigE Machine Vision System which is commercially available from Microscan Solutions, Inc. of Renton, Wash., USA. A camera 116 suitable for use with this optical recognition software is a Visionscape® GigE CameraUXGA Mono CCD, also available from Microscan Solutions, Inc. of Renton, Wash., USA.

The twist pin insertion subassembly 54 provides the capability to vertically move the insertion head 56 relative to the circuit module 36, as is shown in FIG. 15. The insertion subassembly 54 includes the linear motor 72 located in a housing 352 which is connected to the transverse support beam 228 (FIGS. 2 and 15). The linear motor 72 is connected within the housing 352 to raise and lower a mounting pad 354 located on the exterior of the housing. The mounting plate 314 of the insertion head 56 is connected to the mounting pad 354. Movement created by the linear motor 72 therefore raises and lowers the insertion head 56. Among other things, the ability to raise and lower the insertion head 56 allows the insertion nozzle 57 to be moved vertically to avoid contact with circuit components 40 located on the upper surface of the upper circuit board 32 of the module (FIGS. 9A and 9B) during movement of the circuit module 36 by the circuit module positioning subassembly 68, if the twist pins are inserted after the components 40 are connected to the circuit board.

As shown in FIG. 15, the mounting plate 314 is connected to the mounting pad 354 by fasteners such as screws 356. The mounting pad 354 is located at the exterior of the housing 352. One illustrative and exemplary connection of the mounting pad 354 to the linear motor 72 is shown in FIG. 15. The mounting pad 354 is connected by posts 358 to an L-shaped bracket 360 which is located within the interior of the housing 352. The posts 358 extend through and move along vertical slots 361 in the housing 352. The L-shaped bracket 360 is connected to a shaft 362 of the linear motor 72. Operation of the linear motor 72 extends or retracts the shaft 362 relative to a casing 364 of the motor 72. A linear slide (not shown) in a casing 364 of the motor 72 supports the shaft 362 so that it moves precisely linearly without significant transverse deflection. Extension of the shaft 362 lifts the L-shaped bracket 360 within the housing 352, and causes the posts 358 to move along the vertical slots 361 in the housing 352 while simultaneously transferring the vertical upward movement to the mounting pad 354 and the attached insertion head 56. Retraction of the shaft 362 of the motor 72 causes the opposite downward movement.

The linear motor 72 and its associated internal connection mechanisms within the housing 352 are conventional and available commercially from SMAC of Carlsbad, Calif., USA. Its basic functions are summarized as follows. Inside the motor casing 364, a main body 366 is connected to the shaft 362. A moving electromagnetic coil 368 is attached to the main body 366, and the coil 368 surrounds a linear permanent magnet 370. Current conducted through the moving coil 368 creates a magnetic field which interacts with the magnetic field of the permanent magnet 370. This interaction creates a movement force which is transferred from the moving coil 368 to the main body 366 to move the shaft 362. The degree and extent of movement is directly related to the current conducted by the moving coil 368. It is in this manner that electrical signals applied to the linear motor 72 cause the shaft 362 to extend and retract and the mounting pad 354 to move vertically.

The extent of movement of the shaft 362 is measured by a linear encoder 372. The linear encoder 372 includes a linear measurement track 374 and a sensor 376. The linear measurement track 374 has markings or indications formed at precise and definite intervals along its length. The markings or indications of the track 374 are sensed by the sensor 376, and the signals from the sensor 376 indicate the position of the shaft 362. The position of the sensor 376 relative to the track 374 establishes the position of the shaft 362. The position of the shaft 362 is correlated to the position of the insertion head 56, and specifically the lower end of the insertion nozzle 57. In this manner, the vertical position of the insertion nozzle 57 is controlled.

Based on the information available from the linear encoder 372, the upward and downward movement of the insertion head 56 allows the insertion nozzle 57 to be positioned relative to the upper printed circuit board 32 of the circuit module 36, as shown in FIG. 14. Locating the lower end of the insertion nozzle 57 at a predetermined spacing 377 relative to the upper printed circuit board 32 establishes the best conditions for conveying the twist pin from the pickup head of the pickup subassembly through the delivery tube 52 to the insertion head 56. If the spacing 377 between the lower end of the insertion nozzle 57 and the upper printed circuit board 32 is too small, enough back pressure to the gas flow through the delivery tube 52 is created to impede the delivery of the twist pin. If the spacing 377 between the lower end of the insertion nozzle 57 and the upper printed circuit board 32 is too large, there is an increased possibility that the leading end 78 of the twist pin 34 will deviate from a direct projection into the column 58, but will instead deflect laterally from an edge of the upper via 60 in the column and create an impediment to the successful insertion of the twist pin and to the continued automated operation of the machine 30.

The vertical height of the upper printed circuit board 32 of the circuit module 36 is established for use by the movement of the linear motor 72 by the control system 120 (FIGS. 25A and 25B). This position is established with each circuit module 36 into which twist pins are inserted because there may be slight differences in height among different circuit modules 36 of the same type, due to manufacturing differences or slight differences in the connection position of each circuit module 36 on the pallet 146 (FIG. 1). Signals supplied to the linear motor 72 cause it to raise the insertion head 56 to an uppermost position, where it is assured that the lower end of the insertion nozzle 57 will clear any electronic circuit components 40 connected to the upper printed circuit board 32 of the module 36 (FIGS. 9A and 9B). Thereafter, the linear motor retracts the shaft 362 causing the insertion head 56 to move downward. The downward movement commences at a more rapid rate and then diminishes. When the lower end of the insertion nozzle 57 contacts the upper via 60 of a column 58, the current drawn by the moving coil 368 of the motor 72 increases due to the added mechanical resistance to the continued movement of the motor shaft 352. The increase in current is recognized by a current sensor (not shown) associated with the moving coil 368 and the position sensed by the linear encoder 372 is correlated to this increase in current. This position defines the upper surface of the upper circuit board of the circuit module.

To position the nozzle 57 for the most effective delivery of the twist pins, the linear motor 72 elevates the lower end of the insertion nozzle 57 above the printed circuit board by the predetermined spacing 377 which achieves the best transfer and insertion characteristics of the twist pins into the column 58 of aligned vias 60. To raise the insertion head 56 and the nozzle 57 to a greater height which will avoid electronic components 40 on the upper circuit board of the module, component parameter information is used by the control system 120 (FIGS. 25A and 25B). The component parameter information defines the height, location and orientation of circuit components relative to the upper surface of the upper circuit board of the circuit module. This height parameter information is thereafter used to lift the insertion nozzle 57 sufficiently to avoid the circuit components 40 as the XY positioning table 70 moves the circuit module for the insertion of twist pins in each column 58 of aligned vias.

The delivery tube 52, the optical bundle 334, and electrical conductors 380 connected to the camera 116, are sufficiently flexible to permit the upward and downward movement of the insertion head 56 without binding or creating a significant restriction. The cross-sectional configuration of the transverse support beam 222 resists deflection in response to the reaction forces arising from rapid vertical movement of the linear motor 72. The resistance from the transverse support beam 222 keeps the lower end of the insertion nozzle 57 at the desired spacing from the upper circuit board of the circuit module. The linear motor 72 is connected in the housing 352 by fasteners (not shown), and the housing 352 is connected to the beam 222 by suitable fasteners, such as screws 378. The beam 222 is connected to the granite slab 174 by the suspension brackets 224a, 226a and 224b, 226b (FIGS. 1-3), so the reactive forces transferred to the beam 222 by the movement of the insertion head 56 are resisted by the inertia of the granite slab 174.

The insertion head 56 moves the insertion nozzle 57 and the optical camera 116 vertically along their axes 145 and 344, respectively. No lateral or transverse movement of the insertion nozzle 57 and the camera 116 occurs with respect to their axes 145 and 344. The circuit module positioning subassembly 68 achieves the lateral or transverse movement of the circuit module in the horizontal plane relative to the axes 145 and 344.

Circuit Module Positioning Subassembly

The XY positioning table 70 of the circuit module positioning subassembly 68 moves the circuit module 36 to locate a column 58 of vias 60 coaxially with the twist pin insertion axis 145 and the optical axis 344. Each circuit module 36 is attached in a rigid position relative to the pallet 146, and the pallet 146 is connected rigidly to the XY positioning table 70. Signals from the control system 120 (FIGS. 25A and 25B) cause the XY positioning table 70 to move in both the X and Y horizontal directions.

The XY positioning table 70 is shown in FIGS. 2 and 3. The XY positioning table 70 includes an upper table structure 390 which moves in the X and Y horizontal directions. The upper table structure 390 has an open aperture 392 through which the grip and cut subassembly 74 moves upward relative to the lower printed circuit board of the circuit module, when the leader 64 of the twist pin 34 is gripped, pulled and cut and the severed leader 64 is extracted (FIGS. 10C-10H). The upper surface of the upper table structure 390 is planar. Conventional registration devices (not shown), such as registration pins, hold the pallet 146 in a fixed predetermined position on the upper table structure 390.

The XY positioning table 70 also includes an intermediate table structure 394 which moves in only one of the X or Y directions. As shown in FIGS. 2 and 3, the intermediate table structure 394 moves only in the forward and backward direction. The upper table structure 390 is operatively connected to the intermediate table structure 394 and moves laterally left and right relative to the intermediate table structure 394.

The intermediate table structure 394 moves on a pair of spaced apart linear tracks 396. The tracks 396 are attached to a bottom plate 398, and the bottom plate 398 is attached to the upper surface of the granite slab 174. The upper surface of the granite slab 174 is ground to a high precision planar surface. The upper and lower surfaces of the bottom plate 398 are planar surfaces which are precisely coplanar with one another. The tracks 396 are identical in cross-sectional configuration to one another, and are attached to the upper planar surface of the bottom plate 398 so that the tracks 396 extend precisely parallel with one another. Bearings (not shown) are attached to the bottom surface of the intermediate table structure 394 to contact and move along each of the tracks 396, and to support the intermediate table structure 394 from the tracks 396. The top and bottom surfaces of the intermediate table structure are planar surfaces which are precisely coplanar with one another. A precision linear motor 100 (also see FIG. 25A) is associated with each track 396. The motor 100 is responsive to signals from the control system 120 (FIG. 25A) to move the intermediate table structure 394 in precise forward and backward directions relative to the stationary bottom plate 398 and granite slab 174.

The upper table structure 390 moves on a pair of spaced apart linear tracks 402. The tracks 402 are attached to the intermediate table structure 394. The upper and lower surfaces of the upper table structure 304 are planar surfaces which are precisely coplanar with one another. The tracks 402 are identical in cross-sectional configuration to one another, and are attached to the upper planar surface of the intermediate table structure 394 so that the tracks 402 extend precisely parallel with one another. Bearings (not shown) are attached to the bottom surface of the upper table structure 390 to contact and move along each of the tracks 402 and to support the upper table structure 390 from the intermediate table structure 394.

A precision linear motor 101 (also see FIG. 25A) is associated with each track 402. The motor 101 is responsive to signals from the control system 120 (FIG. 25A) to move the upper table structure 390 in precise left and right lateral directions relative to the intermediate table structure 394 as well as with respect to the stationary bottom plate 398 and granite slab 174.

The intermediate table structure 394 and the bottom plate 398 also include center apertures 406 and 408 similar to the aperture 392 in the upper table structure 390. The center apertures 392 and 406 are sufficiently large to remain clear of contact with the grip and cut subassembly 74 during movement of the upper and intermediate table structures 390 and 394. Signals supplied to the motors 100 and 101 cause the precise movement of the intermediate and upper table structures 394 and 390, respectively, thereby moving the pallet 146 and the attached circuit module 36 into precise positions in which the centers of the columns 58 of vias 60 are located substantially coaxially with the axis 145 of the insertion nozzle 57 and the optical axis 334 of the camera 116 (FIG. 14), as previously described.

The XY positioning table 70 and the software programs for operating its motors are commercially available from Aerotech, Inc. of Pittsburgh, Pa., USA.

Grip and Cut Subassembly

Figure 16:
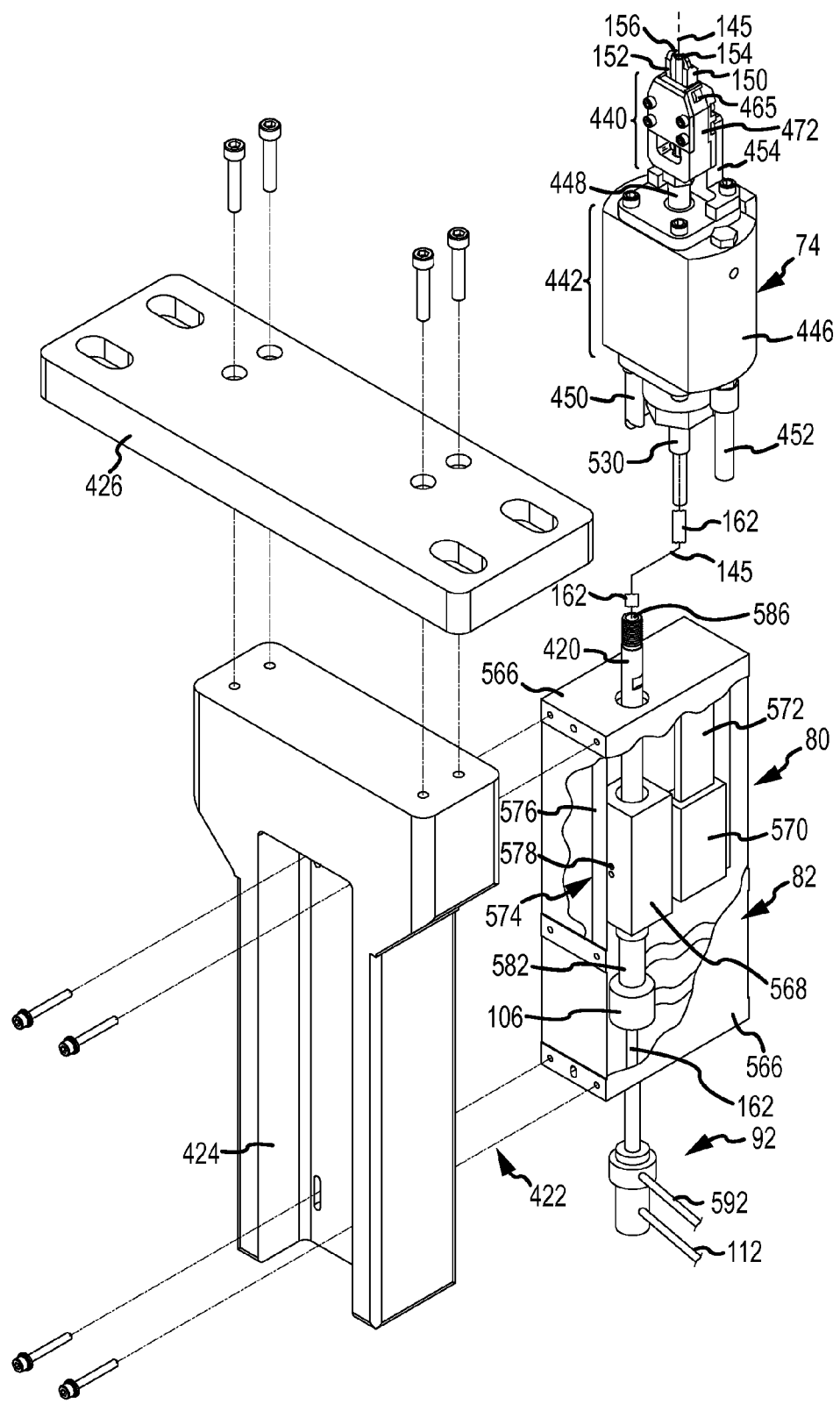
FIG. 16 is an enlarged and exploded view of the longitudinal movement subassembly and a more enlarged perspective view of the grip and cut subassembly shown in FIGS. 2 and 3, in which a portion of a linear/rotational motor of the longitudinal movement subassembly is broken away to reveal certain internal components.
Figure 17:
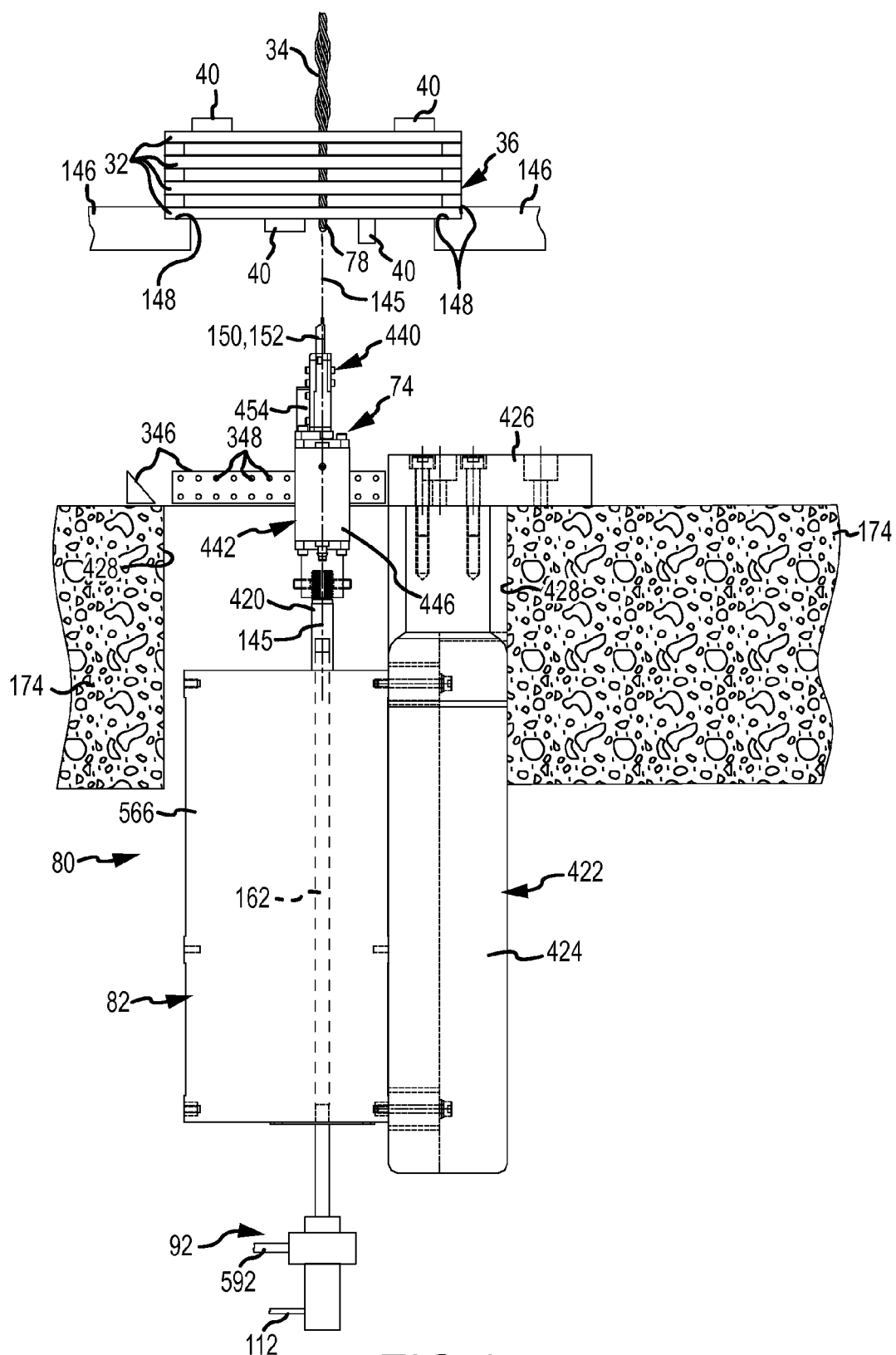
FIG. 17 is a side elevational view of the components shown in FIG. 16, which are assembled and attached to a granite slab and positioned with respect to a circuit module retained by the circuit module positioning subassembly of the machine shown in FIGS. 1, 2 and 3.

The grip and cut subassembly 74, shown in FIGS. 16-23, operates relative to the axis 145 through the insertion nozzle 57 (FIG. 14). The grip and cut subassembly 74 is connected to a shaft 420 of the linear/rotational motor 82 of the longitudinal movement subassembly 80. The linear/rotational motor 82 is connected to a bracket 422, as shown in FIGS. 16 and 17. An upright piece 424 of the bracket 422 is connected to the linear/rotational motor 82. A transverse piece 426 is connected to the upright piece 424. The transverse piece 426 is connected to the granite slab 174, at one edge of the center opening 428 formed in the granite slab 174. The position of the linear motor where connected to the bracket 422, and the position of the bracket 422 square connected to the granite slab 174, locates the shaft 420 of the motor 82 coaxially with the axis 145. Consequently, the linear extension and retraction of the shaft 420, and the rotation of the shaft 420, maintains the cutting wedges 154 and 156 (FIGS. 10C-10H) of the pinch and cut blade 76 coaxial with respect to the axis 145.

The principal function of the grip and cut subassembly 74 is to move the pinch and cut blade 76 so that its cutting wedges 154 and 156 grip the leader 64 by pinching it so that the leader 64 can be pulled and thereafter cut or severed (FIGS. 10C-10H). To accomplish these operations, the grip and cut subassembly 74 includes the pinch and cut blade 76, a blade deflecting mechanism 440 which interacts with the pinch and cut blade 76 to move the jaw members 150 and 152 and cutting wedges 154 and 156 toward and away from one another, and a blade activator 442 which moves the blade deflecting mechanism 440 relative to the pinch and cut blade 76 to move the jaw members 150 and 152 toward and away from one another, as shown in FIGS. 16, 18 and 19.

Figure 18:
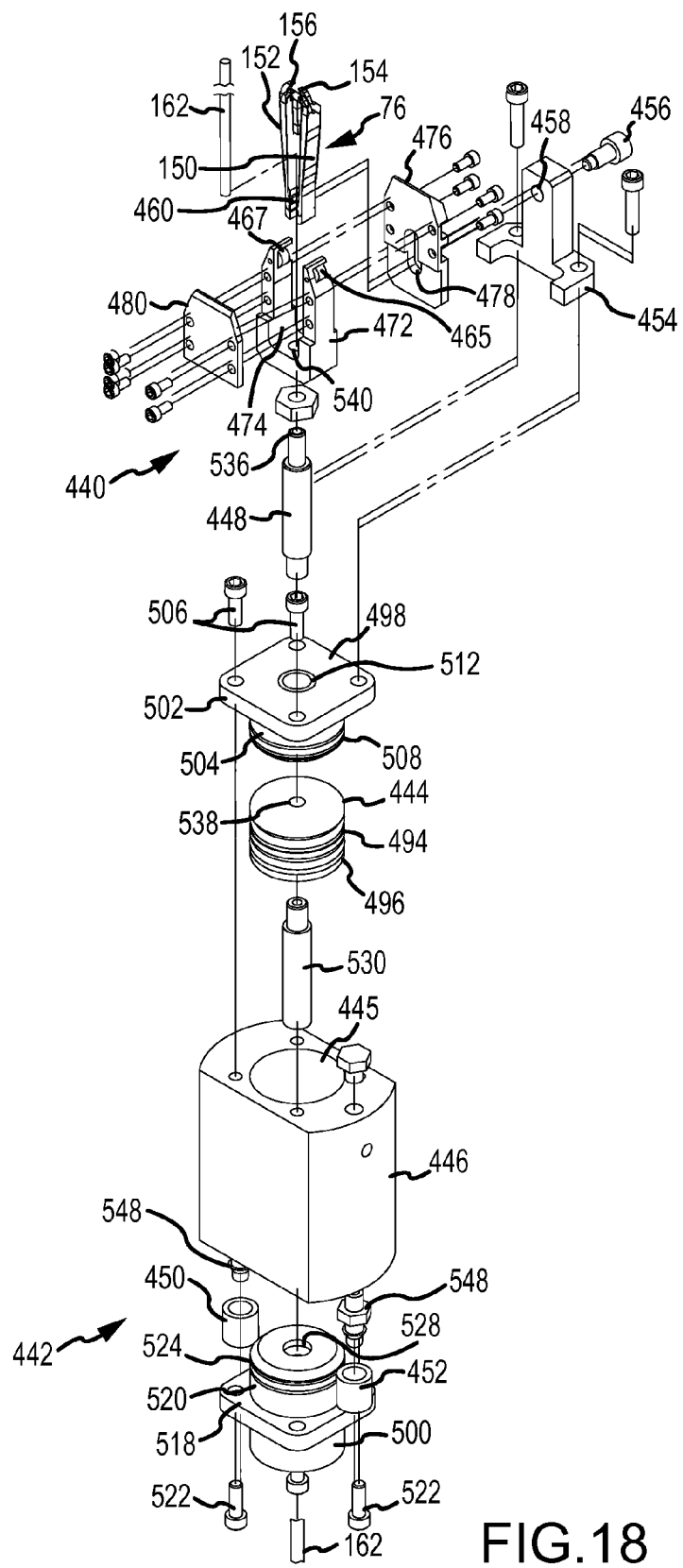
FIG. 18 is an exploded perspective view of the grip and cut subassembly shown in FIGS. 16-17.
Figure 19:
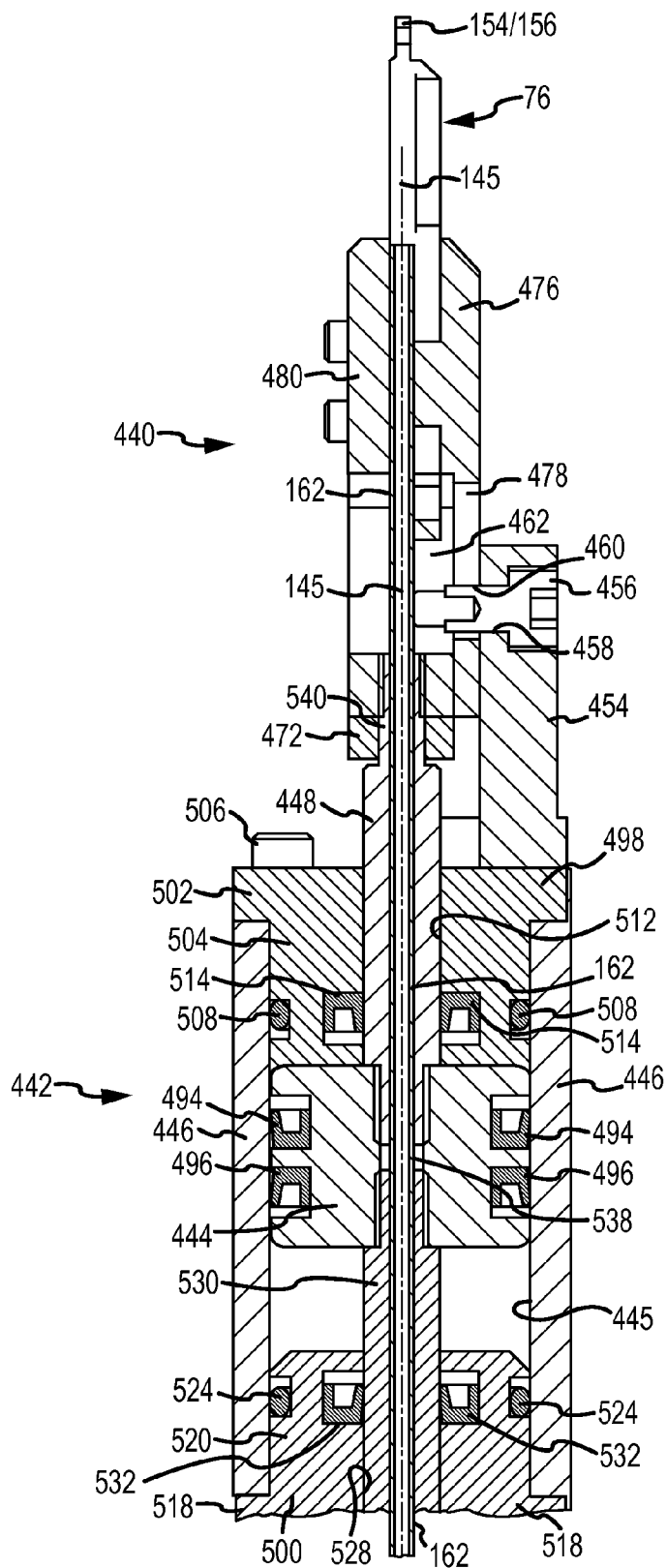
FIG. 19 is an enlarged vertical section view of the grip and cut subassembly shown in FIGS. 16-18.

The blade activator 442 is preferably of a conventional piston and cylinder construction, in which a piston 444 moves longitudinally within a cylinder 445 of a cylinder body 446 of the blade activator 442, as shown in FIGS. 18 and 19. A hollow connection rod 448 is connected at a rear end to the piston 444, and a front end of the connection rod 448 is connected to the blade deflecting mechanism 440. The connections are preferably threaded connections. Pressurized gas is delivered through hoses 450 and 452 to the blade activator 442 to move the piston 444 longitudinally forward and backward within the cylinder 445 of the cylinder body 446, respectively. The movement of the piston 444 is transferred through the connection rod 448 to the blade deflecting mechanism 440. The pinch and cut blade 76 is positioned stationarily, and the forward and backward movement of the blade deflecting mechanism 440 relative to the blade 76 moves the jaw members 150 and 152 into and between the opened, closed and partially closed positions shown in FIGS. 21, 23 and 22, respectively.

A blade support bracket 454 connects to and extends longitudinally forward from the cylinder body 446. A retainer pin 456 extends though a hole 458 in a front end of the support bracket 454. A reduced-diameter portion of the pin 456 extends through the hole 458 beyond the support bracket 454 and fits into a hole 460 in a rear end web portion 462 of the blade 76. In this manner, the blade 76 is connected to a forward end of the blade support bracket 454 in a stationary longitudinal position relative to the cylinder body 446. However, the pin 456 permits the blade 76 to pivot in a plane perpendicular to an axis through the pin 456.

As shown in FIGS. 21-23, the pinch and cut blade 76 is formed as an integral single-piece structure, preferably of resilient spring steel or high-speed (tool) steel. The web portion 462 joins the jaw members 150 and 152 at a rear end of the blade 76. The retainer pin 456 in the hole 460 holds the pinch and cut blade 76 stationary. The jaw members 150 and 152 are generally symmetrically positioned on opposite sides of the center axis 145. The jaw members 150 and 152 extend longitudinally forward and transversely outwardly from the web portion 462 and the axis 145. The jaw members 150 and 152 are separate from one another except where they integrally join the blade 76 at the web portion 462. The web portion 462 is transversely offset from the center axis 145 to avoid contacting the conduction tube 162 (FIG. 19).

Exterior surfaces 464 and 466 of the jaw members 150 and 152, respectively, are smooth and generally symmetrical with respect to the center axis 145. The exterior surfaces 464 and 466 are contacted by roller bearings 465 and 467, respectively, of the blade deflecting mechanism 440 to cause the jaw members 150 and 152 to deflect toward and away from one another. The strength and resiliency of the material from which the blade 76 is made causes the jaw members 150 and 152 to rebound back away from one another when the force from the blade deflecting mechanism 440 is relieved.

Shoulders 468 and 470 extend integrally from the inside surfaces of the jaw members 150 and 152, respectively, along a portion of the length of each jaw member 150 and 152. The shoulders 468 and 470 extend toward one another across the space between the jaw members 150 and 152. The shoulders 468 and 470 reinforce each of the jaw members 150 and 152 and contact one another to prevent the cutting wedges 154 and 156 from being overdriven into contact with one another when the jaw members are moved to the closed position (FIG. 23). The overdrive protection from the shoulders 468 and 470 prevent chipping and premature wear of the cutting wedges 154 and 156. The shoulders 468 and 470 are also transversely displaced from the center axis 145 (FIG. 19) to avoid interfering with the leader 64 or the conduction tube 162, when the jaw members 150 and 152 are closed.

The forward ends of the jaw members 150 and 152 curve longitudinally forward and transversely inward toward one another and terminate at the cutting wedges 154 and 156. The cutting wedges 154 and 156 are made of hardened sharpened material. The jaw members 150 and 152 bring the cutting wedges 154 and 156 toward one another to sever the leader 64 (FIG. 10G) or to pinch the leader 64 without severing it (FIGS. 10C-10E) whenever a transverse inward force is applied by the roller bearings 465 and 467 of the blade deflecting mechanism 440 to force the jaw members 150 and 152 toward one another.

As shown in FIGS. 18, 19, 21-23, the blade deflecting mechanism 440 includes a clevis 472 which is connected to the forward end of the connection rod 448. The U-shaped body which defines the clevis 472 projects forward away from the connection rod 448, and defines an open space 474 in the center of the clevis 472. The pinch and cut blade 76 is positioned within the open space 474. A bearing plate 476 is connected to the clevis 472 on one transverse side of the open space 474. An elongated slot 478 (FIG. 18) is formed in the bearing plate 476 to receive the retainer pin 456. The elongated slot 478 permits the bearing plate 476 and the clevis 472 to move forward and backward with respect to the stationary retainer pin 456 as the blade deflecting mechanism 440 moves forward and backward. A wedge plate 480 is connected to the clevis 472 on the opposite transverse side of the open space 474 from the bearing plate 476. The bearing plate 476 and the wedge plate 480 support and retain the pinch and cut blade 76 between their opposing facing surfaces within the open space 474.

The roller bearings 465 and 467 connect to the forward ends of the clevis 472 at forward locations in the space 474. The roller bearings 465 and 467 contact the exterior surfaces 464 and 466 of the jaw members 150 and 152, respectively. The exterior surfaces 464 and 466 extend forward and transversely outward. The exterior surfaces 464 and 466 are symmetrical about the center axis 145. Forward longitudinal movement of the clevis 472 forces the roller bearings 465 and 467 to roll forward along the exterior surfaces 464 and 466 of the jaw members 150 and 152, respectively. The jaw members 150 and 152 deflect more closely together as the roller bearings 465 and 467 move forward along the exterior surfaces 464 and 466. In a similar manner, rearward longitudinal movement of the clevis 472 moves the roller bearings 465 and 467 rearward along the exterior surfaces 464 and 466, and the resiliency of the material from which the blade 76 is formed moves the jaw members 150 and 152 outwardly away from one another. With the blade deflecting mechanism 440 moved to its most rearward position, a slight clearance exists between the exterior surfaces 464 and 466 and the roller bearings 465 and 467, allowing the jaw members 150 and 152 to separate fully in the open position (FIG. 21).

More details concerning the blade activator 442 are shown in FIGS. 18 and 19. The cylinder body 446 defines the cylinder 445 within which the piston 444 moves. The cylinder 445 extends from a front end of the cylinder body 446 to a rear end of the body 446. The piston 444 has an exterior diameter that allows it to fit within the cylinder 445. Longitudinally spaced annular grooves in the piston 444 receive sealing rings 494 and 496 which seal the piston 444 within the cylinder 445. A front cylinder cap 498 is attached to the front end of the cylinder body 446, and a rear cylinder cap 500 is attached to the rear end of the cylinder body 446. The piston 444 moves within the cylinder 445 between the front and rear cylinder caps 498 and 500.

The front cylinder cap 498 has a generally square connection flange 502 with a rearward extending cylindrical projection 504. The connection flange 502 is attached to the front end of the cylinder body 446 with screws 506. The cylindrical projection 504 has an exterior diameter that is slightly smaller than the interior diameter of the cylinder 445. With the flange 502 attached to the cylinder body 446, the cylindrical projection 504 extends rearwardly into the cylinder 445 from the front end of the cylinder body 446. A sealing O-ring 508 fits within an annular recess formed in the exterior of the cylindrical projection 504, and the sealing O-ring 508 establishes a seal between the front cap 498 and the cylinder body 446 within the cylinder 445.

The front cylinder cap 498 has a front bore 512 through which the connecting rod 448 extends. A front rod seal 514 is positioned within an inside annular groove formed in the front bore 512 and contacts the exterior surface of the connecting rod 448. The front rod seal 514 establishes a seal around the connecting rod 448 where it exits from the front cylinder cap 498. A rear end of the connecting rod 448 connects to the piston 444 within the cylinder 445. In this manner, longitudinal forward and backward movement of the piston 444 within the cylinder 445 is transferred through the connecting rod 448 to the blade deflecting mechanism 440.

The rear cylinder cap 500 has a generally square connection flange 518 with a forward extending cylindrical projection 520. The connection flange 518 is attached to the rear end of the cylinder body 446 with screws 522. The cylindrical projection 520 has an exterior diameter that is slightly smaller than the interior diameter of the cylinder 445. With the flange 518 attached to the cylinder body 446, the cylindrical projection 520 extends forward into the cylinder 445 from the rear end of the cylinder body 446. A sealing O-ring 524 fits within an annular recess formed in the exterior of the cylindrical projection 520, and the sealing O-ring 524 establishes a seal between the rear cap 500 and the cylinder body 446 within the cylinder 445.

The rear cylinder cap 500 has a rear bore 528 through which a hollow rod extension 530 extends. A rear rod seal 532 is positioned within an inside annular groove formed in the rear bore 528 and contacts the exterior surface of the rod extension 530. The rear rod seal 532 establishes a seal around the rod extension 530, where the rod extension 530 exits from the rear cylinder cap 500. A front end of the rod extension 530 connects by threads to the rear side of the piston 444 within the cylinder 445 of the cylinder body 446. In this manner, the rod extension 530 moves longitudinally forward and backward with the corresponding movement of the piston 444 within the cylinder 445. The rear end of the rod extension 530 extends rearwardly from the rear cap 500, is centered generally about the center axis 145 and extends to the cut and pull subassembly 80 into the hollow shaft 420 of the linear/rotational motor 82 (FIG. 16).

The connecting rod 448 is hollow, and thereby defines an interior passageway through the rod 448. A central hole 538 is formed through the piston 444 in alignment with the hollow interior of the connecting rod 448. The rod extension 530 is hollow, and thereby defines an interior passageway through the rod extension 530. The clevis 472 has a hole 540 formed through it in alignment with the hollow interior of the connecting rod 448. In this manner, an unobstructed internal passageway extends through the hole 540 in the clevis 472, the hollow interior of the connecting rod 448, the central hole 538 of the piston 444, and hollow interior of the rod extension 530. This unobstructed internal passageway is coaxial with the axis 145, and the conduction tube 162 is located therein.

The conduction tube 162 conducts the severed leaders 64 away from the cut and pinch blade 76 of the grip and cut subassembly 74. A forward end of the conduction tube 162 is positioned concentric with the center axis 145 in the space between the jaw members 150 and 152. The forward end of the conduction tube 162 is slightly flared to direct the leading end 78 of the leader 64 into the conduction tube 162, to ensure that the severed leader 64 enters and is transported through the conduction tube 162. The conduction tube 162 is connected to move in unison with the blade deflecting mechanism 440, the connection rod 448, the piston 444 and the rod extension 530, by an adhesive applied between the conduction tube 162 and the inside the hollow connection rod 440.

Figure 20:
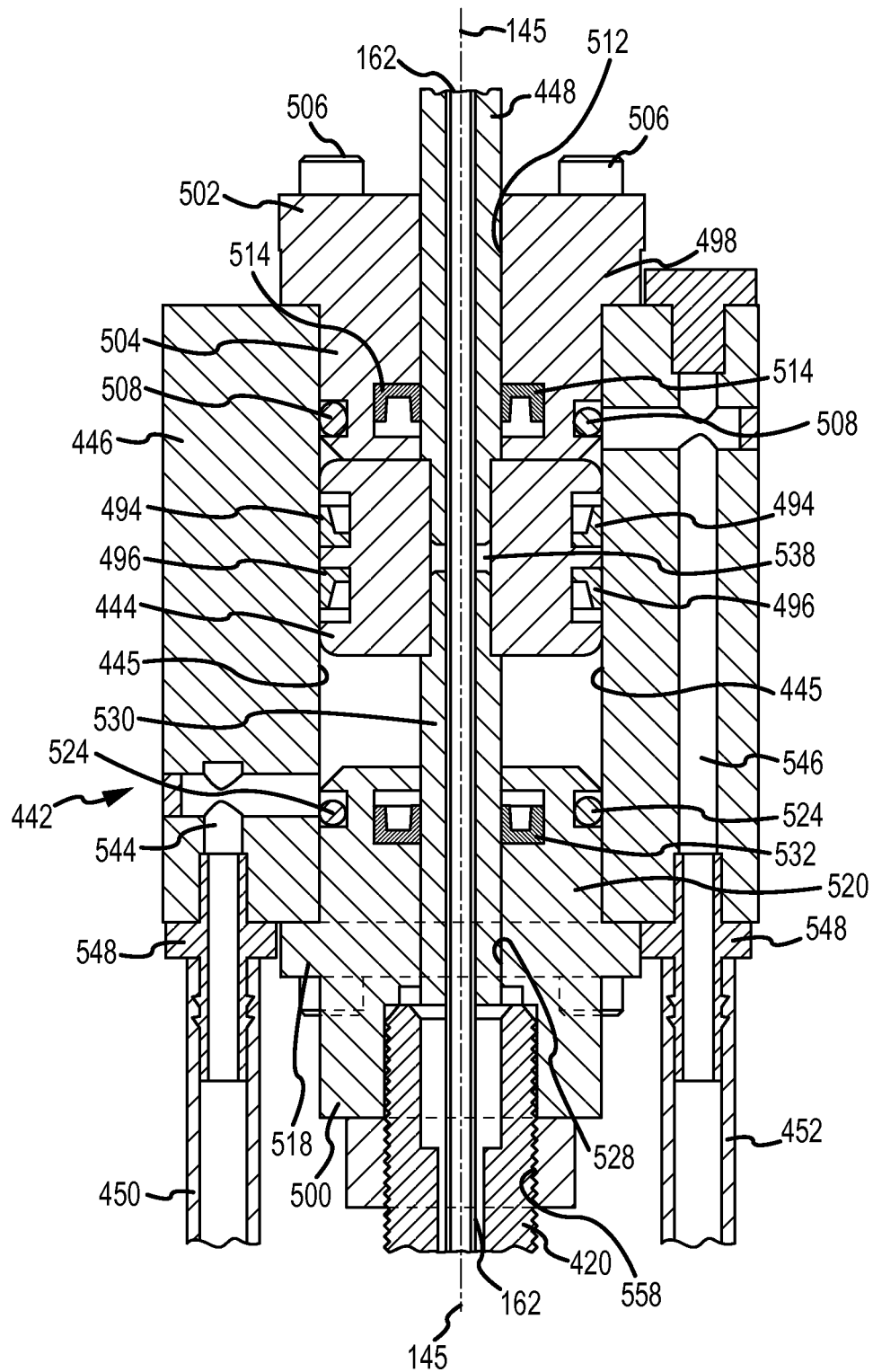
FIG. 20 is a further enlarged vertical section view of a blade activator portion of the grip and cut subassembly shown in FIG. 19, in which the plane of the view is rotated 90° with respect to the plane of view of FIG. 19.

Fluid passageways 544 and 546 are formed forward from the rear end of the cylinder body 446, and the passageways 544 and 546 open into the cylinder 445 at positions which are at the rear and front of the piston 444, respectively, as shown in FIG. 20. The passageways 544 and 546 provide a sealed path through the cylinder body 446 and into the cylinder 445. Conventional hose fittings 548 are attached to the rear end of the cylinder body 446 at positions which surround the fluid passageways 544 and 546. The hoses 450 and 452 connect to the fittings 458.

Pressurized gas is supplied through the hoses 450 and 452 and into the fluid passageways 544 and 546, respectively, to move the piston 444 longitudinally within the cylinder 445. Pressurized gas in the fluid passageway 544 enters the portion of the cylinder 445 between the piston 444 and the rear cylinder cap 500. The pressurized gas admitted through the passageway 544 forces the piston 444 to move longitudinally forward within the cylinder 445. The longitudinal forward movement of the piston moves the blade deflecting mechanism 440 forward relative to the stationary pinch and cut blade 76, thereby moving the jaw members 150 and 152 toward one another, to establish the closed and partially closed positions of the jaw members (FIGS. 22 and 23). Applying pressurized gas at a relatively higher pressure through the fluid passageway 544 creates a relatively greater forward force on the piston 444, resulting in greater deflecting force on the jaw members, which results in severing the leader 64 from the remaining portion of the twist pin 34 (FIG. 10G) as a result of the cutting wedges 154 and 156 moving into contact with one another as the jaw members 150 and 152 move to the fully closed position (FIG. 23). Applying pressurized gas at a relatively lower pressure through the fluid passageway 544 creates relatively lesser forward force on the piston 444, resulting in lesser deflecting force on the jaw members, which results in gripping the leader 64 (FIGS. 10C and 22) as a result of the cutting wedges 154 and 156 moving toward but not into contact with one another in the partially closed position.

Pressurized gas supplied through the fluid passageway 546 enters the portion of the cylinder 445 between the piston 444 and the front cylinder cap 498. The pressurized gas admitted through the passageway 546 forces the piston 444 to move longitudinally rearwardly within the cylinder 445. The longitudinal rearward movement of the piston 444 causes the blade deflecting mechanism 440 to move rearward relative to the stationary pinch and cut blade 76, thereby allowing the jaw members 150 and 152 to move away from one another and establish the open position of the jaw members (FIG. 21).

Longitudinal Movement Subassembly

The principal function of the longitudinal movement subassembly 80 is to move the grip and cut subassembly 74 longitudinally along the axis 145 in the machine 30. Doing so pulls the gripped twist pin 34 into the final desired position (FIG. 10E). Thereafter, the grip and cut subassembly 74 is returned to a position where the pinch and cut blade 76 severs the leader 64 (FIG. 10G) at the cutoff end 88 leaving the remaining bulged portion of the twist pin 34 in place and connected to the vias 60 in the circuit boards 32 of the modules 36 (FIGS. 7 and 10H). The secondary function of the longitudinal movement subassembly 80 is to rotate the grip and cut subassembly 74 relative to the axis 145. Because the shape of the grip and cut subassembly 74 is not uniform around the axis 145, it is sometimes desirable to turn the grip and cut subassembly 74 to obtain more clearance when gripping, pulling and cutting the twist pins and extracting the severed leaders. Among other reasons, rotation of the grip and cut subassembly 74 may be necessary when the column 58 of vias 60 is closely adjacent to a circuit component 40 (FIG. 17) attached to the lower surface of the lower circuit board 32.

The extension, retraction and rotating functions of the longitudinal movement subassembly 80 are accomplished by the linear/rotational motor 82. The linear/rotational motor 82 is a conventional item, available commercially from SMAC of Carlsbad, Calif., USA. The grip and cut subassembly 74 is connected to the end of the shaft 420 of the linear/rotational motor 82, as shown in FIGS. 16 and 17. The end of the shaft 420 is threaded and then screwed into a threaded receptacle 558 formed in the rear cylinder cap 500 coaxial with the axis 145 (FIG. 20). When connected, an interior passageway in the hollow shaft 420 is therefore aligned with the previously described interior passage formed through the grip and cut subassembly 74, as shown in FIGS. 19 and 20.

Details of the linear motor are shown in FIGS. 16 and 17. The linear/rotational motor 82 is located in a housing 566. The housing 566 is connected to the upright piece 424 of the bracket 442. When operated, the linear/rotational motor 82 extends and retracts the shaft 420 relative to the housing 566. Extension of the shaft 420 moves the grip and cut subassembly 74 upward toward the lower circuit board 32 of the circuit module 36. Retraction of the shaft 420 moves the grip and cut subassembly 74 in an opposite direction. The linear/rotational motor 82 also has the capability to rotate the shaft 420 in any extended or retracted position.

Inside the housing 566 of the linear/rotational motor 82, a main body 568 is connected to the shaft 420. A moving electromagnetic coil 570 is connected to the main body 568 and surrounds a linear permanent magnet 572. Current conducted through the coil 570 creates a magnetic field within the coil 570 which interacts with the magnetic force from the permanent magnet 572. This force is transferred to the main body 568 which moves the shaft 420. The force created is directly related to the current conducted by the coil 570. It is in this manner that the electrical signals applied to the motor 82 cause the shaft 420 to extend and retract.

The extent of movement of the shaft 420 is determined by a linear encoder 574. The linear encoder 574 includes a linear measurement track 576 and a sensor 578 connected to the main body 568. The linear measurement track 576 has markings or indications formed at precise and definite intervals along its length. The markings or indications of the track 576 are sensed by the sensor 578, and the signals from the sensor 578 indicate the position of the sensor 578 relative to the track 576. The position of the sensor 578 relative to the track 576 establishes the position of the shaft 420. The position of the shaft 420 is correlated to the position of the grip and cut subassembly 74, and specifically the location of the cutting wedges 154 and 156 of the pinch and cut blade 76 (FIGS. 21-23).

Based on the information available from the linear encoder 574, the upward and downward movement of the grip and cut subassembly 74 allows the cutting wedges 154 and 156 to be positioned relative to the lower printed circuit board 32 of the circuit module 36 (FIG. 17). Locating the cutting wedges 154 and 156 at a predetermined position relative to the lower printed circuit board establishes the desired location of the cutoff end 88 where the leader 64 is severed. Locating the cutoff end 88 too close to the lower printed circuit board 32 makes it difficult or impossible to grip the twist pin above the cutoff end 88 and remove it if it becomes necessary to disassemble the circuit module 36 or to replace the previously assembled twist pin with a new twist pin. A cutoff distance which is too long from the lower printed circuit board 32 consumes additional space and creates unintended electrical problems.

The vertical height or location of the lower printed circuit board 32 of the circuit module 36 is established by use of the linear/rotational motor 82. This position is established with each circuit module 36 into which twist pins are inserted, because there may be slight differences in the location of the lower circuit board of each circuit module 36, according to the manner in which it is connected to the pallet 146 (FIG. 17). Signals supplied to the linear/rotational motor 82 cause it to retract the grip and cut subassembly 74 to a lowermost position, where the upper end of the pinch and cut blade 76 will clear the lower printed circuit board 32 of the module 36 and any electronic circuit components 40 connected to the lower printed circuit board. Thereafter, the linear/rotational motor 82 extends the shaft 420, causing the grip and cut subassembly 74 to move upward. The upward movement starts at a relatively rapid rate but decreases. When the cutting wedges 154 and 156 of the pinch and cut blade 76 contact the lower printed circuit board 32 of the module 36, the current drawn by the coil 570 increases because additional magnetic force is required in response to the added physical resistance caused by contacting the pinch and cut blade 76 with the lower printed circuit board of the circuit module. The increase in current is correlated to a decrease in the axial movement of the shaft 420, and that relationship is then correlated to the position sensed by the linear encoder 374. This position sensed by the linear encoder 374 defines the lower surface of the lower circuit board of the circuit module. This height parameter or distance information is thereafter used in reference to the location of the lower surface of the lower circuit board of the circuit module, to assure that the grip and cut subassembly 74 is moved to the desired position to cut off the leader 64 at the cutoff end 88.

Rotational movement of the shaft 420 is created by a servo motor 106 which is an internal part of the linear/rotational motor 82. The servo motor 106 is connected at the lower end of the shaft 420 and to the main body 568 of the motor 82. The servo motor 106 rotates the shaft 420 relative to the main body 568. The shaft 420 is rotationally connected within the main body 568 by a conventional rotational bearing assembly (not shown) which does not introduce a significant axial or radial mechanical tolerance in the position of the shaft 420 relative to the main body 568 and the axis 145.

A conventional rotational position encoder 582 is also connected to the main body 568. The rotational encoder 582 determines the rotational position of the shaft 420 established by the servo motor 106. The information supplied by the rotational encoder 582 is used by the control system 120 (FIGS. 25A and 25B) to energize the servo motor 106 and establish the desired rotational position of the grip and cut subassembly 74 connected to the shaft 420. The rotational position of the grip and cut subassembly 74, as sensed by the rotation encoder 582, is used by the control system to avoid circuit components 40 connected to the lower surface of the lower printed circuit board 32 of the circuit module 36. In general, changing the rotational position of the grip and cut subassembly 74 will not be required if no components or other obstructions are present on the lower surface of the lower printed circuit board during assembly of the twist pins in the circuit module.

Rapid extension, retraction and rotational movement of the grip and cut subassembly 74 by the linear/rotational motor 82 creates reactive forces. These reactive forces are resisted by the bracket 422 (FIGS. 16 and 17) which is rigidly connected to the granite slab 174. This rigid connection to the granite slab 174 and the inertia of the granite slab keep these reactive forces from adversely affecting the position of the cutting wedges 154 and 156 relative to the leader 64.

With the upper end of the shaft 420 connected to the grip and cut subassembly 74, as shown in FIGS. 16 and 17, the lower end of the rod extension 530 aligns with and fits within the hollow interior of the shaft 420 (FIG. 20). The conduction tube 162 extends substantially through the grip and cut subassembly 74 and through the full length of the hollow shaft 420, past the rotational encoder 582 and the servo motor 106, and out of the bottom of the housing 566. As explained previously, the conduction tube 162 extends from the space between the jaw members 150 and 152, through the hole 540 in the clevis 472, through the grip and cut subassembly 74, through the interior passageways in the connection rod 448 and the piston 444 and the extension rod 530 (all shown in FIG. 19). Thus, the conduction tube 162 establishes a continuous pathway to conduct the severed leaders 64 from the location where the leader 64 is cut off from the remaining bulged portion of the twist pin 34 in contact with the vias 60 of the column 58 (FIG. 10G) to the collection chamber 96 of the leader collection subassembly 90.

Leader Collection Subassembly

The leader collection subassembly 90 is shown in FIGS. 3 and 24. The principal function of the leader collection subassembly 90 is to extract and segregate the severed leaders 64 so that they do not interfere with the operation of the machine 30. The operations of the leader collection subassembly 90 are achieved primarily by the venturi device 92, shown in FIG. 24.

The venturi device 92 creates vacuum or negative pressure within the conduction tube 162 to extract and draw the severed leader away from the grip and cut subassembly 74 and the longitudinal movements subassembly 80 and to propel each severed leader into the collection chamber 96. The severed leaders accumulate in the collection chamber 96, out of contact and interaction with the other components of the machine 30. Periodically, the severed leaders are removed from the collection chamber 96 by the machine operator.

As shown in FIG. 24, the venturi device 92 comprises a housing 590 connected to the lower end of the conduction tube 162, below the location where the conduction tube 162 extends from the housing 566 of the linear/rotational motor 92 (FIG. 17). Pressurized gas is delivered from a hose 592 through an input fitting 600 into an annular chamber 594 formed in the housing 590. The annular chamber 594 surrounds a center bore 596 formed in the housing 590. The center bore 596 is concentric and coaxially aligned with the axis 145. The center bore 596 smoothly continues the internal passageway from the conduction tube 162 through the housing 590. Orifices 598 extend from the annular chamber 594 into the center bore 596. The orifices extend inwardly toward the center bore 596 in the same direction that the severed leaders are propelled through the center bore 596. The cross-sectional sizes of the orifices 598 are relatively small. The reduced cross-sectional sizes of the orifices 598 increase the speed of the gas substantially when it exits the orifices 598 into the center bore 596.

The increased speed of the gas from the orifices 598 as it enters the center bore 596 reduces the pressure within the center bore 596 relative to ambient pressure. The reduced gas pressure or partial vacuum is communicated through the conduction tube 162 to its upper end. The reduced pressure causes a downward force (as shown) on the leader 64 of the twist pin 34 when it is severed (FIG. 10G), and the severed leader 64 is pulled through the conduction tube 162 and is delivered from the center bore 596 into the collection chamber 96 by the low pressure created in the venturi device 92.

The successful extraction of a severed leader is detected by the optical sensor 112. Detecting the removal of severed leaders is important in determining the continued proper functionality of the machine 30. The failure to detect a severed leader under circumstances where the control system 120 (FIGS. 25A and 25B) expects a leader to be cut and extracted, indicates a problem with the continued functionality of the machine 30. Under such circumstances, the operation of the machine 30 must be suspended until the source of the problem is corrected. Sources of such a problem would include an incomplete attempt to cut the leader or a severed leader which has become jammed or hung up in the conduction tube 162. Detecting the successful extraction of a severed leader is therefore an important condition for the continued operation of the machine 30.

The optical sensor 112, like the other optical sensors 108 (FIG. 13) and 110 (FIG. 14), is formed by a plurality of individual light conducting optical fibers 626 and 628. The optical fibers 626 and 628 form a conventional optic fiber bundle 630. The optical fibers 626 and 628 are formed of conventional light transmissive material with an index of refraction which confines the light to pass along the length of those fibers. The optical fiber 626 is a center fiber in the bundle 630, and the other optical fibers 628 become exterior fibers which surround the center fiber 626. An end 632 of the fiber bundle 630 is inserted and held in a receptacle 634 which has been formed transversely into the housing 590 to intersect the center bore 596. The optical fibers 626 and 628 are exposed at the end 632, and are therefore capable of transmitting and receiving light at their exposed ends. Light from a light source (not shown) is transmitted through the center optical fiber 626, and that light exits from the center optical fiber 626 at the end 632 to illuminate the center bore 596. Light is reflected within the center bore 596 and is picked up and transmitted back to an optical transducer (746, FIG. 25B) connected to the exterior optical fibers 628.

When the severed leader moves past the end 632 of the fiber bundle 630, the light received by the exterior fibers 628 at the end 632 is changed as a result of the passage of the severed leader. The changed characteristics of the light are evaluated by the optical transducer connected to the fiber 628, to detect the passage of the severed leader. It is in this manner that the control system 120 (FIGS. 25A and 25B) uses the optical sensor 112 to detect the passage of a severed leader from the venturi device 92.

The collection chamber 96 is formed as a canister 640 having an upper removable lid 642, as shown in FIG. 24. With the lid 642 attached to the canister 640, the venturi device 92 is located entirely within the interior of the canister 642. With the venturi device 92 inside the canister 640, the severed leaders are confined in the collection chamber 96. The lid 642 prevents the severed leaders from bouncing out of the collection chamber.

A slot 644 extends radially from an outside edge to a center location of the lid 642. The slot 644 allows the lid 642 to be placed around the conduction tube 162. The optic bundle 630 and the hose 592 also extend through the slot 644. The vertical depth of the canister 640 is sufficient to permit the venturi device 92 to move vertically upward and downward along the axis 145 due to the vertical movement of the conduction tube 162 by the longitudinal movement subassembly 80. The optic bundle 630 and the hose 592 have sufficient flexibility and enough space exists in the slot 644 to avoid inhibiting the upward and downward movement of the venturi device 92.

The canister 640 is attached by a conventional mounting bracket (not shown) to the frame 42 of the machine 30. The machine operator detaches the canister 640 from the lid 642, and removes the canister 640 from the mounting bracket to clear the accumulated severed leaders from the canister. Thereafter, the empty canister 640 is reconnected to the mounting bracket and to the lid 640. Sensors, not shown, prevent operation of the machine 30 by the control system when the canister is removed for emptying.

Control System

The control system 120 of the machine 30 is shown in FIGS. 25A and 25B. The primary function of the control system 120 is to control and establish the sequence or process flow of operations performed by the machine subassemblies, as described and shown in FIGS. 26A, 26B and 26C. To do so, the control system 120 utilizes a computer controller 660 which has a memory 662 that contains programmed instructions for operating the machine 30. The memory 662 also contains additional information necessary to carry out the operating instructions, such as the optical recognition program used for locating the fiducials 144, determining the precise position of each column 58 of vias and potential obstructions and alignment in the columns 58 by the pattern and intensity of light received by the optical camera 116. Other information in the memory 662 includes the hole drilling map information by which to initially establish the locations of the columns 58 of vias, parameter information which defines the characteristics of the twist pins 34 (such as length) to be inserted in particular columns 58 of vias and the location and orientation of electronic components 40 which may be attached to the upper and lower surfaces of the upper and lower printed circuit boards 32 of the circuit modules 36.

A keyboard 664 and a screen display 666 (FIG. 1) are connected to the computer controller 660. The keyboard 664, which may include a joystick (not shown), allows the machine operator to supply control information to the computer controller 660, including manual information for manually advancing the position of the cartridge 50 on the XY positioning device 98 of the twist pin pickup subassembly 44 and the position of the circuit modules 36 connected to the pallet 146 on the XY positioning table 70 of the circuit module positioning subassembly 68. If desired, the optical information derived from use of the optical recognition program can be presented on the screen display 666, as well as operating status information regarding the machine 30. At least one status annunciator 668 (FIG. 1) is also connected to the computer controller 660. Signals are supplied to the status annunciator 668 to indicate the operational status of the machine 30. For example, if the operation of the machine 30 is halted, the annunciator 668 may deliver both a visual and an aural signal to alert the machine operator. The status annunciator 668 is preferably connected in plain view of the machine operator, such as on one or both of the vertically extending upright beams of the frame 72 (FIG. 1).

When the computer controller 660 executes the operating instructions, it generates control signals 670 and 672 for controlling the X position stepper motor 102 and the Y position stepper motor 104, respectively, of the XY positioning device 98 of the twist pin pickup subassembly 44 (FIGS. 1 and 2). The control signals 670 and 672 are applied to motor controllers 674 and 676, respectively, and the motor controllers 674 and 676 electrically control the X and Y position stepper motors 102 and 104 in accordance with the control signals 670 and 672, to establish the location of the pickup head 46 relative to the receptacles 240 of the cartridge 50 (FIG. 2).

The computer controller 660 also supplies a control signal 678 to a motor controller 680 which controls the movement of the linear motor 72 connected to the insertion head 56 of the twist pin insertion subassembly 54 (FIG. 15). The extent of movement of the insertion head 56 is determined by the linear position encoder 372 associated with the motor 72 (FIG. 15). Signals 682 from the encoder 372 are supplied to the computer controller 660, where the signals 682 are used to establish and verify the position of the twist pin insertion subassembly 54. The signals 682 are also used to establish the location of the upper surface of the upper circuit board of the circuit module, from which to obtain the necessary information to determine the position of the insertion nozzle 57 relative to the upper circuit board.

Signals 684 and 686 are supplied by the computer controller 660 to control the motors 100 and 101 of the circuit module positioning table 70 of the circuit module positioning subassembly 68. The control signals 684 and 686 are supplied to motor controllers 688 and 690, respectively, and the motor controllers 688 and 690 supply energizing signals to the motors 100 and 101 which control the position of the intermediate table structure 394 and the upper movement table 390 (FIG. 3) in accordance with the control signals 684 and 686. The motors 100 and 101 utilize position encoders (not shown) which supply feedback signals to the computer controller 660 for use in establishing and verifying the exact positions of the upper movement table 390 and intermediate table structure 394. Alternatively, such feedback may be achieved internally within the motors 100 and 101, or within the motor controllers 688 and 690.

The computer controller 660 also supplies control signals 692 and 694 for controlling the axial and rotational movement, respectively, of the linear/rotational motor 82 of the longitudinal movement subassembly 80 which is connected to the grip and cut subassembly 74. The control signal 692 controls the extension and retraction of the shaft 420 of the linear/rotational motor 82, while the control signal 694 controls the rotational position of the shaft 420 (FIG. 16). The signals 692 and 694 are respectively applied to motor controllers 696 and 698, and the motor controllers 696 and 698 establish the extension and retraction and rotation of the shaft of the linear/rotational motor 82 in accordance with the control signals 692 and 694. The linear position encoder 574 (FIG. 16) supplies a signal 700 indicative of the position of the extension or retraction of the shaft of the linear/rotational motor 82. The rotational position encoder 582 (FIG. 16) supplies a signal 702 indicative of the rotational position of the shaft of the linear/rotational motor 82. The signals 700 and 702 are used by the computer controller 660, or alternatively by the motor controllers 696 and 698, to establish and verify the linear and rotational positions of the grip and cut subassembly 74. The signal 700 is also used to establish the location of the lower surface of the lower circuit board of the circuit module (FIG. 17), from which to obtain the necessary information to determine the position to cut off the leader 64 and establish the position of the cutoff end 88 of the twist pin remaining in the circuit module. The signal 702 is used to establish and verify the rotational position of the grip and cut subassembly 74 to avoid contact with circuit components 40 that may be attached to the lower printed circuit board 32 (FIG. 17).

In addition, the computer controller 660 receives input signals 704 from the optical camera 116 of the twist pin insertion subassembly 54. The input signals 704 are employed in the optical recognition program executed by the computer controller 660 to establish the precise positions, obstructions and alignments of the columns 58 of vias 60.

The control system 120 also controls the application of the pressurized gas to the grip and cut subassembly 74, to the pickup head 46 of the twist pin pickup subassembly 44, and to the venturi device 92 of the leader collection subassembly 90. Pressurized gas or air from a source 706 is supplied through a filter 730 to a controllable pressure regulator 739. The pressure of the gas from the source 706 is regulated to a level established by the controllable regulator 739 in a distribution manifold 708 connected to the regulator 739. Controllable pressure regulators 736 and 738 are connected to the distribution manifold 708. The controllable pressure regulators 736 and 738 regulate and adjust the pressure of the gas delivered from those regulators 736 and 738. The pressure of the gas delivered from the regulators 739, 736 and 738 is established in accordance with control signals 731, 733 and 735 supplied by the computer controller 660. The control signals 731, 733 and 735 establish the pressure of the gas delivered from those regulators 736, 738 and 739, respectively. Alternatively, the controllable regulator 739 may be manually adjustable, in which case it does not utilize or respond to the control signal 735.

Gas flow at the pressure established by the controllable regulators 738 and 736 is conducted to electrically controlled pneumatic solenoid valves 710 and 712, respectively. Gas flow at the pressure established by the controllable regulator 739 in the manifold 708 is delivered to electrically controlled pneumatic solenoid valves 714, 716 and 718. The electrically controlled pneumatic solenoid valves 710, 712, 714, 716 and 718 assume and change flow rates in response to solenoid control signals 720, 722, 724, 726 and 728 from the computer controller 660. The control signals 720, 722, 724, 726 and 728 cause the solenoids 710, 712, 714, 716 and 718 to conduct the pressurized gas through the hoses 450, 452, 285 and 592. The control signals 720, 722, 724, 726, 728, 731 and 733 (and 735, if the regulator 739 responds to a control signal) are supplied by the computer controller 660 in response to executing the system operating instructions (FIG. 25A).

The pressure regulator 738 reduces the gas pressure from the manifold 708 to a level suitable for causing sufficient force on the piston 444 to move the blade actuator 442 (FIG. 20) to cause the pinch and cut blade 76 to pinch the leader 64 (FIGS. 10C and 22). The solenoid valve 710 connected to the pressure regulator 738 is therefore designated as a grip solenoid valve. The pressure regulator 736 reduces the gas pressure from the manifold 708 to a level which is greater than the pressure from the regulator 738 but less than the pressure in the manifold 708. The pressure from the regulator 736 is sufficient to force the pinch and cut blade 76 to cut the leader 64 (FIGS. 10G and 23). The solenoid valve 712 connected to the pressure regulator 736 is therefore designated as a cut solenoid valve. The pressure in the manifold 708 is conducted by the solenoid valve 714 to the grip and cut subassembly 74 to move the pinch and cut blade 76 to the open position (FIG. 21). The pressure in the manifold 708 is also conducted by the solenoid valve 716 to the pickup head 46 for removing the twist pins from the receptacles in the cartridge 50 (FIG. 13). In addition, the pressure in the manifold 708 is conducted by the solenoid valve 718 to the venturi device 92 for extracting severed leaders into the collection chamber 96 (FIG. 24). The solenoid valves 714, 716 and 718 connected to the manifold 708 are designated as an open solenoid valve, a pickup solenoid valve and a venturi solenoid valve, respectively.

The grip and cut solenoid valves 710 and 712 control the flow of pressurized gas through the hose 450 to the blade activator 442. The open solenoid valve 714 controls the flow of pressurized gas through the hose 452 to the blade activator 442. The pickup and venturi solenoid valves 716 and 718 control the flow of pressurized gas through the hoses 285 and 592 to the pickup head 46 and the venturi device 92. The assertion of the control signals 720, 722, 724, 726 and 728 to the pneumatic solenoid valves 710, 712, 714, 716 and 718 cause those solenoid valves to conduct the gas flow. The de-assertion of the control signals 720, 722, 724, 726 and 728 cause the pneumatic solenoid valves 710, 712, 714, 716 and 718 to cease conducting the gas flow. Turning on and turning off the grip, cut and open solenoid valves 710, 712 and 714 control the movement of the piston 444 within the cylinder 445 of the blade activator 442 (FIGS. 18-23) to create the open, partially closed and closed positions of the pinch and cut blade 76 (FIGS. 21-23, respectively). Turning on and off the pickup and venturi solenoid valves 716 and 718 control the application of low and high pressure in the pickup head 46 and the venturi device 92.

The solenoid valves 710-718 each have two pneumatic input ports and a single pneumatic output port. The two input ports are shown in FIG. 25B on the left-hand side of the solenoid valves 710-718, and the single output port is shown in FIG. 25B on the right-hand side of the solenoid valves 710-718. The upper ones of the two input ports of the solenoid valves 710 and 712 (as shown) are directly connected to the regulators 738 and 736, respectively, to receive gas flow at the pressure established by those regulators. The upper ones of the two input ports of the solenoid valves 714, 716 and 718 (as shown) are directly connected to the manifold 708 to receive gas flow at the pressure established by the regulator 739. The lower ones of the two input ports of the solenoid valves 710-718 (as shown) are directly connected to ambient pressure.

Connected in the manner described in the preceding paragraph, turning on the solenoid valve 710 causes it to conduct gas flow at the pressure established by the regulator 738. The gas flow from the solenoid valve 10 is applied to one input port of a check valve 740. Turning off the solenoid valve 710 causes it to conduct atmospheric pressure to the input port of the check valve 740. Turning on the solenoid valve 712 causes it to conduct gas flow at the pressure established by the regulator 736 to another input port 70 of the check valve 740. Turning off the solenoid valve 712 causes it to conduct atmospheric pressure to the other input port of the check valve 740. Turning on the solenoid valve 714 causes it to conduct gas flow at the pressure in the manifold 708 to the hose 452. Turning off the solenoid valve 714 causes it to conduct atmospheric pressure to the hose 452. Turning on the solenoid valve 716 causes it to conduct gas flow at the pressure in the manifold 708 to the hose 285. Turning off the solenoid valve 716 causes it to conduct atmospheric pressure to the hose 285. Turning on the solenoid valve 718 causes it to conduct gas flow at the pressure in the manifold 708 to the hose 592. Turning off the solenoid valve 718 causes it to conduct atmospheric pressure to the hose 592.

The check valve 740 directs the higher of two different pressures applied to its two input ports to its single output port. The lower of the two different pressures applied to one input port has no influence on conducting the higher pressure from the other input port to the single output port. The check valve 740 conducts the higher input pressure and the accompanying gas flow to its output port. Thus, in the circumstance where the turned on solenoid valve 710 applies the pressure from the regulator 738 to one input port and the turned off solenoid valve 712 applies ambient pressure to the other input port, the check valve 740 conducts the pressure from the regulator 738 to the hose 450. In the circumstance where the turned on solenoid valve 712 applies the pressure from the regulator 736 to one input port, and the turned off solenoid valve 710 applies ambient pressure to the other input port, the check valve 740 conducts the gas flow from the regulator 736 to the hose 450.

The pressurized gas from the source 706 is filtered by the filter 730 before the gas is delivered to the regulator 739 and conducted into the manifold 708. The filter 730 removes particles that may be present in the pressurized gas from the source 706. A pressure switch 732 is connected to sense the pressure of the gas conducted from the filter 730 to the regulator 739. If the pressure drops below a predetermined minimum threshold, the pressure switch 732 sends a control signal 734 to the computer controller 660 (FIG. 25A) and the controller ceases operation of the machine 30. The operation of the machine 30 ceases until adequate pressure is re-established, as determined by the signal 734.

To execute the assembly cycles for the circuit module, the computer controller 660 delivers the control signals 731, 733 and 735 to the regulators 738, 736 and 739, to establish the appropriate level of pressure for assembling the twist pins into the via columns. The computer controller 660 also delivers the solenoid control signals 720, 722 and 724 to the grip, cut and open solenoid valves 710, 712 and 714. The control signal 720 turns on the grip solenoid valve 710 to conduct the gas flow at the pressure from the regulator 738 to one input port of the check valve 740. The control signal 722 turns off the cut solenoid valve 712 and causes it to supply ambient pressure to the other input port of the check valve 740. The control signal 724 turns off the open solenoid valve 714 and causes it to supply ambient pressure through the hose 452. Under these conditions, the pressure from the regulator 738 is supplied through the hose 450 into the portion of the cylinder 445 below the piston 444, and ambient pressure is supplied through the hose 452 into the portion of the cylinder 445 above the piston 444 (FIG. 20). The higher pressure from the hose 450 and the lower ambient pressure from the hose 452 establish a pressure differential across the piston 444 which moves the piston partially forward in the cylinder 445. The connection rod 448, which is connected to the piston 444, moves the blade deflecting mechanism 440 forward with only enough force to deflect the jaw members 150 and 152 so that the cutting wedges 154 and 156 pinch and grip the leader 64 of the twist pin 34 without severing it (FIG. 22). The output pressure from the regulator 738 is adjustable to control the extent to which the cutting wedges 154 and 156 pinch into the leader 64 without severing it. Adjusting the amount of the relatively lower pressure gas in this manner is useful to accommodate twist pins having different thicknesses.

To cut the leader 64, the computer controller 660 delivers the solenoid control signals 720, 722 and 724 to the grip, cut and open solenoid valves 710, 712 and 714. The control signal 722 turns on the cut solenoid valve 712 to conduct the gas at the pressure established by the regulator 736 to one input port of the check valve 740. The control signal 720 turns off the grip solenoid valve 710 and causes it to apply ambient pressure to the other input port of the check valve 740. The relatively higher pressure gas conducted through the cut solenoid valve 712 is conducted by the check valve 740 through the hose 450. The control signal 724 turns off the open solenoid valve 714 and causes it to conduct ambient pressure gas through the hose 452. The relatively higher pressure gas from the hose 450 and the ambient pressure from the hose 452 create a relatively greater pressure differential across the piston 444 in the cylinder 445, compared to the pressure differential across the piston 444 when gripping the leader 64. The relatively greater pressure differential moves the piston 444 forward in the cylinder 445 with enough force to deflect the jaw members 150 and 152 so that the cutting wedges 154 and 156 sever the leader 64 from the remaining portion of the twist pin 34 (FIG. 23). The output pressure from the regulator 736 is adjustable to obtain sufficient force on the cutting wedges 154 and 156 to sever the leader 64. Adjusting the amount of the relatively higher pressure gas in this manner is useful to accommodate twist pins having different thicknesses.

To retract the grip and cut subassembly 74, the computer controller 660 delivers the solenoid control signals 720, 722 and 724 to the grip, cut and open solenoid valves 710, 712 and 714. The control signal 724 turns on the open solenoid valve 714 to conduct the gas at the pressure established by the regulator 739 to the hose 452. The control signals 720 and 722 turn off the grip and cut solenoid valves 710 and 712 and cause them to apply ambient pressure to the input ports of the check valve 740. Ambient pressure is conducted through the check valve 742 and into the hose 450. The relatively higher pressure gas from the hose 452 and the ambient pressure from the hose 450 create a pressure differential across the piston 444 in the cylinder 445, which moves the piston 444 downward in the cylinder 445 and allows the jaw members 150 and 152 to move apart and separate the cutting wedges 154 and 156 to the open position (FIG. 21). The output pressure from the regulator 736 is adjustable to open the pinch and cut blade 76 quickly enough to avoid delaying the execution of an assembly cycle, although the more critical factor is usually obtaining gas flow from the regulator 739 at a sufficient pressure to remove the twist pins from the receptacles in the cartridge and to extract the severed leader.

To remove a twist pin from a receptacle in the cartridge, the computer controller 660 applies the control signal 726 to the pickup solenoid 716. The flow of high-pressure gas through the hose 285 into the venturi chamber 280 of the pickup head 46 causes the low pressure or partial vacuum to remove a twist pin from a receptacle 240 in the cartridge 50 (FIG. 13). The flow of high-pressure gas to the pickup head 46 also conducts the extracted twist pin through the delivery tube 52 to the insertion head 56, as discussed in connection with FIG. 14. Pulsing the control signal 726 to the pickup solenoid 716 creates the pulses of pressurized gas in the delivery tube 52 which may be used to attempt to move a twist pin lodged in the delivery tube 52 or to reseat a twist pin which has not been inserted and seated properly, as described above.

To extract a severed leader, the computer controller applies the control signal 728 to the venturi solenoid 718. The flow of high-pressure gas through the hose 592 to the venturi device 92 causes a low pressure to extract the severed leader 64 and convey it through the conduction tube 162 within the grip and cut subassembly 74 and the linear/rotational motor 82.

The control system 120 also responds to signals from the optical sensors 108, 110 and 112 to monitor the movement of the twist pins 34 and the severed leaders 64 within the machine 30. The movement of the twist pins and the severed leaders, and the position of the inserted twist pins is determined by light conducted in the exterior optic fibers 292, 332 and 628 (FIGS. 13, 14 and 24) of the optical sensors 108, 110 and 112, respectively. The reflected light conducted through the exterior optic fibers from the optical sensors 108, 110 and 112 is conducted to optical transducers 742, 744 and 746. The optical transducers 742, 744 and 746 convert the received light intensity and pattern into electrical signals 750, 752 and 754, and the electrical signals 750, 752 and 754 are supplied to the computer controller 660. The computer controller 660 executes the optical recognition program based on the signals 750, 752 and 754 to determine the information relating to the passage and movement of the twist pins and severed leaders, and the proper seated position of the inserted twist pin, and any obstructions in the column 58 of vias and the alignment of the vias in the columns, as described above.

As shown in FIG. 25A, the computer controller 660 also receives signals 758 from the light curtain receivers 118a, 118b and 118c of the light curtain 117 (FIG. 1). Should any of the beams extending from the light curtain emitters 119a, 119b and 119c to the light curtain receivers 118a, 118b and 118c be broken in the manner discussed above, the broken beam(s) of light will result in the assertion of the control signal 758. The computer controller 660 will recognize the assertion of the control signal 758, and will immediately cease operation of the machine 30. When all of the light beams between the light emitters and the light receivers are established and not interrupted, the control signal 758 will be de-asserted, and the computer controller 660 will control the machine 30 to execute its automated operations. Alternatively, the signal 758 could represent the signals from all of the light curtain receivers 118a, 118b and 118c, and the computer controller 660 could execute a program to determine when any one of the light beams between the light curtain receivers 118a, 118b and 118c to the light curtain emitters 119a, 119b and 119c is broken.

Operation Flow Sequence

The functionality of the computer controller 660 in causing the machine 30 to execute the automated operations of removing, inserting, gripping, pulling and cutting the twist pin 34 and extracting the severed leader 64 while assembling the circuit module 66 our illustrated in FIGS. 26A, 26B and 26C. The operations are preferably executed in a flow sequence 800. The sequence 800 is described in conjunction with the control system 120 shown in FIGS. 25A and 25B, and the other aspects of the machine shown in FIGS. 1-25. Each of the operations of the sequence 800 is identified by a reference number for convenience of description.

The process flow 800 starts at 802 and progresses to 804. At 804, the XY positioning device 98 of the twist pin pickup subassembly 44, the XY positioning table 70 of the circuit module positioning subassembly 68, the insertion head 56 of the twist pin insertion subassembly 54, the grip and cut subassembly 74, and the longitudinal movement subassembly 80, are moved to an initialized position. These initialized positions allow all of the movements required to execute all of the assembly cycles for one circuit module. In addition, the solenoid valves 710-718 are operated to move the pinch and cut blade 76 to the open position, and to eliminate any supply of pressurized gas to the pickup head 46 of the twist pin pickup subassembly 44 and to the venturi device 92 of the leader collection subassembly 90. Further, all the optical sensors 108, 110 and 112 evaluate whether a twist pin, a severed leader or some other type of obstruction is sensed at this time. No such twist pin, severed leader or the obstruction should be sensed. The functionality of the camera 116, the light curtain 117 and the pressure of the gas from the source 706 are also confirmed.

A determination is then made at 806 whether both the circuit module 36 and the cartridge 50 have been loaded onto the XY positioning table 70 of the circuit module positioning subassembly 68 and XY positioning device 98 of the twist pin pickup subassembly 44. Optical sensors, such as the camera 116, and others (not shown) associated with the XY positioning device 98 supply a signal to the control system 120 which indicates that the circuit module 36 and the cartridge 50 have been loaded. The control system 120 will alert the machine operator from the annunciator 668 if one or both of the circuit module 36 or the cartridge 50 have not been loaded. If the determination at 806 is negative, then the process flow 800 loops back to 806 and the determination is repeated until the circuit module 36 and the cartridge 50 have been loaded. When the determination at 806 is affirmative, the process flow 800 continues to 808.

At 808, the operational information and parameters that are specific to assembling the circuit module 36, the printed circuit board hole drilling map information, the information describing the locations of the receptacles 240 in the cartridge 50 and the type and characteristics of the twist pins located in each of the receptacles 240, information describing the location and orientation of any circuit components 40 attached to the upper and lower printed circuit boards 32 of the circuit module 36, the optical recognition program, the light curtain operating program, electric motor operating and control programs, and the other information necessary to control the machine 30 in the manner previously described, is then loaded or accessed in the memory 662 for use by the computer controller 660. Some of this information may be supplied by the machine operator through the keyboard 664.

Next, the location of the fiducials 144 of the circuit module 36 within the XY coordinate system of the XY positioning table 70 are identified, at 810. The fiducials 144 are located by the machine operator manually moving the XY positioning table 70 with input commands from the keyboard 664 or a joystick, and viewing the position and images on the screen 666 viewed by the camera 116. By manual movement in this manner, the fiducials 144 are precisely located. The machine operator registers the exact location of the fiducials 144 by input signals that the keyboard 664, and the exact location of those fiducials is established by the computer controller 660 based on the positions of the motors 100 and 101 of the XY positioning table 70 at that time. Locating three fiducials 144 in this manner establishes the complete orientation by which the hole drilling map information is then correlated to the locations of the vias 60 in the upper circuit board 32 of the circuit module 36.

An ordered list of XY coordinates or positions of the XY positioning device 98 corresponding to the locations of the receptacles 240 in the cartridge 50 is then established at 812. The ordered list of receptacle coordinates may be contained within or established from the information and parameters loaded at 808.

At 814, the precise vertical height or location of the upper circuit board 32 of the circuit module 36 is identified. The location of the upper circuit board 32 is measured on the Z-axis coordinate with the insertion head 56 and the insertion nozzle 57. The height of the upper circuit board 32 is established by moving the insertion head 56 toward the upper circuit board until the insertion nozzle 57 physically contacts the top circuit board, as described above. The contact position is determined by the linear encoder 372, and that position is thereafter employed to establish the optimal distance between the insertion nozzle 57 and the upper circuit board for inserting the twist pins, as described previously.

It is desirable to establish the height of the upper printed circuit board in at least three different desired contact points, to determine whether the upper surface of the upper circuit board deviates from a plane parallel to the plane defined by the XY positioning table 70. Information regarding the amount of planar deviation of the upper circuit board is derived from the three measurement points and is thereafter used to interpolate the actual precise height or location of the upper surface of the upper circuit board at the location of each via 60, or to alert the operator that the circuit module 36 should be reset in the pallet 146 to achieve the desired coplanar orientation.

At 816, the distance to the lower circuit board 32 of the circuit module 36 is established. The linear/rotational motor 82 of the longitudinal movement subassembly 80 moves the grip and cut subassembly 74 upward until the pinch and cut blade 76 physically contacts the lower circuit board 32. The determined position of the lower printed circuit board is established as described above and is used to establish the desired height of the cutoff end 88 and when pulling the leader 64.

Any deviation in the plane of the lower circuit board from the plane of the upper movement table 390 of the XY positioning table 70 is also determined in a manner similar to that described above at 814. Any deviation in the co-planar relationship of the lower printed circuit board is thereafter used to interpolate the height of the lower surface of the printed circuit board, or if the deviation is significant, to alert the machine operator of the necessity to reset the circuit module 36 in the pallet 146 or to utilize another circuit module because an assembly problem may have skewed a generally planar relationship between the upper and lower circuit boards of that module.

It is desirable to establish the height of the lower printed circuit board in at least three different desired contact points, to determine whether the upper surface of the lower circuit board deviates from a plane parallel to the plane defined by the XY positioning table 70. Information regarding the amount of planar deviation of the lower circuit board is derived from the three measurement points and is thereafter used to interpolate the actual precise height or location of the lower surface of the upper circuit board at the location of each via 60, or to alert the operator that the circuit module 36 should be reset in the pallet 146 to achieve the desired coplanar orientation.

An ordered list of the XY positions or coordinates of the columns 58 of vias is then established at 818. The ordered list is established from the hole drilling map information loaded at 808, based on the locations of the fiducials which are located at 810.

The operations 820-828 of the process flow 800 establish and verify the precise location of each via column 58, as well as determine that each via column 58 is not obstructed and not sufficiently misaligned to impede the successful assembly of a twist pin in that column. Establishing the precise location of each column 58 of vias allows the via column 58 to be positioned directly beneath the insertion nozzle 57 coaxially with the axis 145. Any obstruction and misalignment of the via column 58 could impede the proper insertion and seating of the twist pin, as discussed above.

Under conditions where an obstruction or misalignment is recognized, the coordinates of the via column 58 are added to a skip list, at 826. The skip list designates those via columns 58 into which twist pins will not be inserted automatically by the machine 30. The skip list is provided to the machine operator who may manually inspect each via column 58 of the skip list before any twist pins are inserted in the other via columns by the machine 30. The machine operator may inspect the via columns of the skip list and then decide to manually remove some of the via columns from the skip list. Alternatively, the machine operator may elect to have the machine 30 insert twist pins in all of the via columns that are not on the skip list and then determine whether twist pins can be manually assembled in the via columns on the skip list by human action. The operations 820-828 may be executed for less than all of the via columns 58 or not executed altogether depending on the accuracy of the circuit board manufacturing process.

At 820, the first via 58 within the ordered list of via columns 58 is positioned under optical axis 344 of the optical camera 116, using the hole drilling map information. At 822 the precise location of the via column is determined using the optical recognition software. If the via column 58 is precisely centered at the optical axis 344 of the optical camera 116, the optical recognition software will determine that center of the upper via 60 in the column 58 is at the location specified by the hole drilling map information. If the upper via 60 in the column 58 is not precisely centered, the optical recognition software will analyze the light intensity and pattern, and then move the XY positioning table 70 until the light intensity and pattern indicates that the upper via 60 in the column 58 is centered with respect to the optical axis 344. This identified offset or deviation from the hole drilling map information is used to modify the hole drilling map information to later locate the upper via 60 of the column 58 coincident with the axis 145 of the insertion nozzle 57, when a twist pin is inserted. In this manner, any offset detected at 822 is used to update the coordinates for the via column 58 to establish the precise location of the center of the upper via 60 of the column 58.

At 824 a determination is made as to whether the column 58 of vias 60 is obstructed or misaligned. The via column 58 which is evaluated at 824 is the same via column from which the center location of the upper via 60 was determined at 822. If the via column 58 is obstructed, partially obstructed or misaligned, the light intensity and image pattern recognized by the camera 116 will recognize the situation and the coordinates of that via column 58 will be added to the skip list at 826.

If the determination at 824 is negative, or after the via column has been added to the skip list at 826, a determination is made at 828 of whether all of the via columns 58 of the circuit module have been checked for location and obstruction and misalignment. If the determination at 826 is negative, then the next via column 58 of the circuit module in the ordered list of via columns is positioned underneath the optical axis 334, as shown at 830. The process flow returns to 822 where the operations 824, 826 and 828 are repeated. The looping from 828 to 830 to 822 continues until all of the via columns 58 of the circuit module have been evaluated for position, obstructions and misalignment. A complete evaluation results in an affirmative determination at 828, and then the process flow 800 continues to 832.

At 832, the process flow 800 commences operations to assemble a single twist pin 34 into one column 58 of vias 60 in a single assembly cycle. The operations commencing at 832 are made possible as a result of performing the operations 804-830.

At 832, certain counter variables associated with each assembly cycle are reset to zero. The counter values reset to zero at 830 establish the number of repeated operations permitted to successfully assemble each twist pin in each via column 58. The counter values reset at 832 determine the number of pin removal errors, pin seated errors, pin retry errors and pin cut errors permitted during an assembly cycle. The counter values reset at 832 may or may not be different from one another.

At 834, the XY positioning device 98 moves the cartridge 50 to align the next receptacle 240 in the ordered list of receptacles established at 812 with the pickup head 46. If the execution of the operation at 834 is the first execution, the first receptacle 240 in the ordered list of receptacles is aligned with the pickup head 46 at 834.

Next at 836, the XY positioning table 70 moves the pallet 146 and the attached circuit module to make the center location of the first via column 58 within the ordered list of column coordinates established at 818 coincident with the axis 145 of the insertion nozzle 57. If the execution of the operation at 836 is the first execution, the next via column 58 is aligned with the axis 145 of the insertion nozzle 57, at 836.

The pickup solenoid 716 is energized at 838 to remove the twist pin from the receptacle 240 whose position was established at 834. The energized pickup solenoid 716 flows pressurized gas to the pickup head 46, and the resulting low pressure gas removes the twist pin from the receptacle 240 and delivers it into the delivery tube 52. The pressurized gas carries the twist pin through the delivery tube to the insertion nozzle 57, where the precise positioning of the via column 58 coincident with the axis 145 of the insertion nozzle 57 ensures that the leader 64 of the twist pin will enter the column 58 of vias 60 as intended.

At 840, a determination is made whether the twist pin was successfully removed from the receptacle 240 and the cartridge 50. A successful removal of the twist pin will cause it to pass through the passageway 272 of the pickup head 46. The optical sensor 108 optically determines the removal of the twist pin from the cartridge 50 and the passage of the twist pin through the pickup head 46. A successful removal of the twist pin results in an affirmative determination at 840.

If the light from the optical sensor 108 is not of the predetermined expected duration and intensity indicative of a successful pin removal, the determination at 840 is negative, indicating that the twist pin was not successfully removed from the cartridge 50. Under such circumstances, it is assumed that a twist pin was not present in the receptacle aligned with the pickup head at 834, or that the twist pin in the receptacle aligned with the pickup head at 834 is stuck in the receptacle and cannot be removed. Under such circumstances, the process flow 800 undertakes the operations 842-848 to access another receptacle and attempt to remove the twist pin from that other receptacle for insertion. Before doing so, the supply of pressurized gas delivered to the pickup head 46 is terminated, because the previous twist pin removal attempt was not successful.

At 842, the pin removal error count is incremented. At 832, the pin removal error count was set to zero at the commencement of the assembly cycle. Incrementing the pin removal error count therefore represents one attempt to remove a twist pin from the cartridge 50. At 844, a determination is made whether the pin removal error count is equal to a predetermined value. The predetermined value involved at 844 is a predetermined number of permitted retry attempts to remove the twist pin from the cartridge 50. A negative determination at 844 indicates that the predetermined number of retries has not been reached, and permits the XY positioning device 98 to move the cartridge 50 into a position where the next receptacle 240 in the ordered list of receptacles is placed in alignment with the pickup head 46, at 846. Thereafter another attempt to remove the twist pin at 838 occurs, followed by a determination at 840 of whether the pin was successfully removed. A repetition of the operations at 842, 844 and 846, which is initiated by the negative determination at 840, continues until the allowed number of retries is exceeded, as determined by an affirmative determination at 844. Under that circumstance, the pin removal error count is reset to zero at 848 to establish the permitted number of repeated attempts to successfully remove the next twist pin in the next assembly cycle. The machine operator is notified at 850 that manual intervention is required because continuing the automated assembly cycle is no longer possible or advisable. Automated operation of the machine 30 is halted.

The machine operator is notified by visual and aural signals from the annunciator 668. Details concerning the error or type of problem are presented to the machine operator on the display screen 666. After the machine operator determines and corrects the condition which led to the pin removal error count reaching the predetermined maximum number of retries, the machine operator signals the computer controller 660 with the keyboard 664 to continue execution of the process flow 800.

An affirmative determination at 840 indicates that the twist pin has been removed successfully from the cartridge 50 and the process flow 800 continues to 852. At 852, a determination is made whether the twist pin was successfully received by insertion nozzle 57. The optical sensor 110 supplies signals which identify the successful passage of a twist pin through the insertion nozzle 57. Successful receipt of the twist pin by the insertion nozzle 57 results in an affirmative determination at 852. A negative determination at 852 indicates that the twist pin was not received. Under such circumstances, after the twist pin was successfully removed from the cartridge 50 as determined at 840, there is a high likelihood that the twist pin is stuck in the delivery tube 52. The operations at 854, 856 and 858 are thereafter performed in an attempt to dislodge the twist pin from the delivery tube 52.

A negative determination at 852 causes the pin received error count to be incremented at 854. The pin received error count was originally set to zero at 832 to establish the maximum number of permitted retry attempts to receive a twist pin at the insertion nozzle 57. At 856, a determination is made whether the pin received error count is equal to a predetermined value. The predetermined value is the maximum number of permitted attempts to retry delivering the twist pin to the insertion nozzle 57. So long as the maximum number of permitted attempts to retry delivering the twist pin from the delivery tube does not equal the predetermined value, as established by a negative determination at 856, each retry attempt involves creating a single pulse or blast of gas delivered through the delivery tube 52 by applying a pulse control signal 726 to the pickup solenoid 716 at 858. Pulsing the pickup solenoid 716 has the effect of briefly turning on and then turning off the pressurized gas delivered to the pickup head 46. The pulse of gas flows through the delivery tube 52 and may dislodge or otherwise force the twist pin into the insertion nozzle 57.

After the pulse of pressurized gas is delivered at 858, a loop back to 852 occurs where a determination is made of whether the twist pin has been received in the insertion nozzle 57. A negative determination at 852 results in again executing the operations 854, 856 and 858. A repetition of these operations is executed until the pin received error equals the predetermined value, as established by an affirmative determination at 856. Thereafter, the pin received retry count is reset at 860 to establish the permitted number of repeated attempts to successfully deliver the twist pin in each via column 58 during the next assembly cycle. The machine operator is notified of the condition at 850. Operation of the machine 30 is halted.

Details concerning the error or type of problem are presented on the display screen 666. After the machine operator determines and corrects the condition which led to the pin received error count reaching the predetermined maximum number of retries, the machine operator signals the computer controller 660 to continue execution of the process flow 800, by use of the keyboard 664.

An affirmative determination at 852 indicates that the twist pin was received by the insertion nozzle 57. At 862, it is determined whether the twist pin is properly seated in the via column 58 of the circuit module 36. The twist pin 34 may have traveled past the optical sensor 110 enough for the determination at 852 to be affirmative, and yet not be properly seated within the via column 58 as expected. Under proper seating conditions, the tail end 129 of the twist pin is positioned adjacent to optical sensor 110. The resulting optical signal distinguishes the properly seated condition from a condition where no twist pin is detected (which would indicate the failure to receive a twist pin), and the condition where the twist pin is present across from the optical sensor 110 or at least the tail end 129 of the twist pin is higher than the anticipated location (which would indicate an improperly seated condition). Under such circumstances, after the twist pin was successfully received by the insertion nozzle 57, as determined at 852, the operations at 864, 866, 868 are thereafter performed in an attempt to properly seat the twist pin in the via column 58.

When the determination at 862 is negative, indicating an improperly seated twist pin, the pin seated error count is incremented at 864. The pin seated error count value is reset to zero at 830 to establish the permitted number of repeated attempts to successfully seat each twist pin in each via column 58 during the next assembly cycle.

Next at 866, a determination is made whether the pin seated error count is equal to a predetermined value. The predetermined value used at 866 indicates a predetermined number of retries permitted to attempt to properly seat the twist pin. So long as the maximum number of permitted attempts to retry seating the twist pin does not equal the predetermined value, as established by a negative determination at 856, each retry attempt involves creating a single pulse or blast of gas delivered through the delivery tube 52 by applying a pulse control signal 726 to the pickup solenoid 716 at 868. Pulsing the pickup solenoid 716 has the effect of briefly turning on and then turning off the pressurized gas delivered through the pickup head 46. The pulse of gas flows through the delivery tube 52 and the insertion nozzle 57. The pulse of gas may move or otherwise force the twist pin into the properly seated position in the via column 58.

The process flow then reverts to 862 where the signals from the optical sensor 110 are again evaluated to determine whether the twist pin is properly seated. The loop formed by 864, 866 and 868 is repeated until the twist pin is properly seated (represented by an affirmative determination at 862) or the pin seated error count equals the predetermined value of permitted retries (represented by an affirmative determination at 866).

An affirmative determination at 866 institutes a pin clear procedure at 872. The pin clear procedure at 872 involves using the grip and cut subassembly 74 and the longitudinal movement subassembly 80 to attempt to grip the leader 64 and pull the twist pin completely through the via column 58, thereby completely removing the improperly seated twist pin. Of course, if the leading end 78 of the leader 64 of the twist pin does not extend sufficiently below the lower surface of the lower circuit board, it will not be possible to grip and pull the twist pin from the via column 58. In which case, the pin clear procedure 872 cannot be executed.

A determination is made at 874 whether the twist pin 34 was successfully removed from the via column. Successful removal of the twist pin will cause the optical sensor 112 to detect the twist pin 34 passing through the venturi device 92. Of course, when the pin clear procedure at 872 is initiated, the venturi solenoid 718 is turned on to create low pressure for extracting the twist pin through the conduction tube 162. The pin clear procedure 872 may involve repeatedly gripping and pulling the twist pin, without cutting the twist pin. Such repeated gripping and pulling may have the effect of forcing the twist pin into the conduction tube 162. As a further alternative, pieces of the twist pin can be cut off from the remaining portion of the twist pin, and the separate pieces are then extracted. In the circumstance of cutting the twist pin into pieces during the pin clear procedure 872, the number of pieces and the position in which they are cut is recognized by the computer controller 660 to determine when the entire twist pin has been removed from the via column 58.

An affirmative determination at 874 indicates that the twist pin has been successfully removed. Then at 876, the next receptacle in the ordered list of receptacles is positioned beneath the pickup head 46 as previously described at 846 in preparation for another insertion attempt in the current via column 58, and the process flow 800 reverts to 838 where a new twist pin is removed, inserted and assembled.

A negative determination at 874 causes the pin seated error count to reset to zero at 877 to establish the permitted number of repeated attempts to successfully seat the next twist pin in the next assembly cycle. The machine operator is notified at 850 that intervention is required. If the operator is thereafter successful in remedying the problem of the twist pin not being properly seated, and that problem is cleared by the operator, the process flow 800 reverts to 838 where a new twist pin is removed, inserted and assembled as previously described.

An affirmative determination at 862 indicates that the twist pin is properly seated. The properly seated condition indicates that the twist pin is ready to be gripped and pulled to the position where the bulges 84 contact the sidewalls 86 of each via 60.

The twist pin is gripped and pulled in the manner previously described at 880. The gripping and pulling at 880 is accomplished by use of the grip and cut subassembly 74 and the longitudinal movement subassembly 80 in the manner previously described. Immediately thereafter at 882, the leader is cut, again using the grip and cut subassembly 74 and the longitudinal movement subassembly 80 in the manner previously described. Prior to gripping and pulling at 880 and cutting at 882, the venturi solenoid 718 is energized to create a low pressure for extracting the severed leader.

Next at 884, the optical sensor 112 is used to determine whether the leader was extracted. The determination of whether the leader was extracted is established by the optical signals indicative of the severed leader passing through the venturi device 92. The determination of whether the leader was extracted at 884 also indicates whether the leader was cut, because the leader cannot be extracted unless it was cut off from the remaining portion of the twist pin. If the leader portion 64 is successfully cut from the twist pin 34, the leader 64 will pass from the venturi device 92 into the collection chamber 96. The determination at 884 is affirmative when the signal generated from the optical sensor 112 indicates that the leader portion 64 has passed through the venturi device 92; otherwise the determination at 884 is negative.

If the determination at 884 is negative, then the pin cut error count is incremented at 886 and a subsequent determination is made at 888 as to whether the pin cut error count is equal to a predetermined value. The predetermined value involved at 888 is a predetermined number of permitted retry attempts to cut and extract the leader from the remaining portion of the twist pin. If the determination at 888 is negative, indicating that an additional attempt to cut and extract the leader from the remaining portion of the twist pin is permitted, another attempt to cut the leader portion 64 is made at 882. Thereafter, a determination is made at 884 as to whether the leader was cut and extracted.

The sequence of operations represented by 882, 884, 886 and 888 is repeated until the predetermined value is reached at 888. The affirmative determination at 888 results in resetting the pin cut error count at 889. The pin cut error count is reset to zero to establish the permitted number of repeated attempts to successfully cut the leader in the next assembly cycle. The operator is notified at 850. Thereafter, if the operator is successful in remedying the problem of the twist pin not being cut and the leader successfully extracted, and that problem is cleared by the operator (probably by removing the twist pin which was not cut or the leader which was not extracted), the process flow reverts to 838 where a new twist pin is removed, inserted and assembled as previously described.

An affirmative determination at 884 indicates that the leader was cut from the remaining portion of the twist pin assembled in the via column 58 and that the severed leader was extracted from the conduction tube 162 and delivered into the collection chamber 96. The optical sensor 112 provides signals which are evaluated to make the affirmative determination at 884.

An affirmative determination at 890 indicates that the twist pin has been successfully assembled in the via column 58 and that one assembly cycle has been completed. Thereafter at 900, the subassemblies 44, 54, 68, 74, 80 and 90 are prepared for the next assembly cycle in which another twist pin will be successfully inserted into another via column 58.

At 902 a determination is made whether all of the via columns 58 in the ordered list of columns have been filled with twist pins for the circuit module, except for the via columns which are described on the skip list. If the determination at 902 is negative, all of the via columns of the circuit module have not yet been assembled with twist pins. To continue assembling twist pins in the available via columns of the circuit module, the process flow 800 loops back to 832 where the next assembly cycle for the next twist pin is commenced. More twist pins are assembled into the circuit module in subsequent cycles until all of the available and intended via columns 58 of the circuit module have been assembled with twist pins, at which point the determination at 902 is affirmative. The affirmative determination at 902 indicates that the assembly of twist pins in the circuit module has been completed to the extent possible by the automated actions of the machine 30, and then the process flow 800 ends at 904.

If more than one circuit module 36 is located on the pallet 146, the process flow 800 will repeat for the next subsequent circuit module. The repetition for the next subsequent circuit module may not commence at 804, but instead may commence at operation 814, because the operations 804-812 may be applicable to all of the multiple circuit modules 36 located on the pallet.

As has been described above, the machine 30 automatically executes all of the operations necessary to assemble a twist pin or z-axis interconnector in columns 58 of vias 60 in the circuit boards 32 of a three-dimensional circuit module 36. The automation provided by the single machine 30 avoids the need for separate machines, multiple machine operators and constant machine operator attention to assemble the twist pins in the circuit modules. The machine 30 automatically achieves significant precision without operator intervention or control to assemble the twist pins in the circuit modules. The automated nature of the machine 30 allows significant numbers of circuit modules to be assembled relatively quickly, thereby reducing manufacturing expenses while enhancing the quality of the assembly. Many other advantages and improvements will become apparent upon fully appreciating the many aspects of the present invention.

Presently preferred embodiments of the present invention and many of its improvements have been described with a degree of particularity. This description is a preferred example of implementing the invention, and is not necessarily intended to limit the scope of the invention. The scope of the invention is defined by the scope of the following claims.

The invention claimed is:

1. A method of automatically assembling z-axis interconnectors into columns of aligned vias in stacked printed circuit boards of a circuit module in repetitively executed assembly cycles, each assembly cycle comprising:
using an interconnector having a leader portion and a connection portion,
singulating an interconnector from a plurality of the interconnectors;
moving the circuit module and an insertion nozzle relative to one another to align an unoccupied via column with the insertion nozzle;
conveying the singulated interconnector through a delivery tube;
delivering the interconnector from the delivery tube into the insertion nozzle;
delivering the interconnector from the insertion nozzle into the aligned via column;
seating the interconnector in the aligned via column with the leader portion extending through the via column to a position below a lower circuit board of the circuit module;
gripping the leader portion below the lower printed circuit board;
pulling the gripped leader portion until the connection portion moves through the aligned via column into contact with the vias of the column;
severing the leader portion from the connection portion at a cutoff location adjacent to the lower circuit board;
extracting the severed leader portion; and
automatically repeating a next assembly cycle after completing a previous assembly cycle until interconnectors have been assembled into a substantial majority of the via columns of the circuit module.

2. A method as defined in claim 1, further comprising:
sensing conveying of the interconnector into the delivery tube;
sensing delivering of the interconnector from the delivery tube into the insertion nozzle;
sensing proper seating of the interconnector in the aligned via column; and
ceasing automated execution of the assembly cycle if the interconnector does not pass into the delivery tube or if the interconnector does not pass from the delivery tube into the insertion nozzle or if the interconnector is not properly seated.

3. A method as defined in claim 2, further comprising:
gripping and pulling the gripped leader as aforesaid until the connection portion is pulled completely through the aligned via column, upon sensing that the interconnector is not properly seated in the aligned column.

4. A method as defined in claim 1, further comprising:
storing the plurality of interconnectors in a cartridge having a plurality of receptacles with each interconnector in a separate receptacle;
aligning each receptacle with a pickup head to remove the interconnector in the receptacle;
sensing the passage of the interconnector from the receptacle into the delivery tube; and
aligning another receptacle with the pickup head to remove a different interconnector from the other receptacle upon sensing that one interconnector was not removed from the receptacle previously aligned with the pickup head.

5. A method as defined in claim 1, further comprising:
sensing the passage of the severed leader into an extraction tube;
sensing the passage of the severed leader from the extraction tube into a collection chamber; and
ceasing automated execution of the assembly cycle if the severed leader does not pass into the extraction tube or if the interconnector does not pass from the extraction tube into the collection chamber.

6. A method as defined in claim 1, further comprising:
defining a delivery axis through the insertion nozzle along which the interconnectors are delivered for insertion into the via column;
perceiving images along an optical axis parallel to the delivery axis of the insertion nozzle;
moving the circuit module and the insertion nozzle relative to one another to align an unoccupied via column with the optical axis;
establishing a center position of an upper via in the upper circuit board of the via column from the perceived images; and
aligning the upper via in the unoccupied via column with the delivery axis for insertion of the interconnector by using the optically established center position.

7. A method as defined in claim 6, further comprising:
using hole drilling map information which specifies locations of the vias created from holes formed during fabrication of the printed circuit boards and the optically established center position to align the delivery axis with the via column.

8. A method as defined in claim 1, further comprising:
defining a delivery axis through the insertion nozzle along which the interconnectors are delivered for insertion into the via column;
perceiving images along an optical axis parallel to the delivery axis of the insertion nozzle;
moving the circuit module and the insertion nozzle relative to one another to align an unoccupied via column with the optical axis;
identifying any obstruction to the insertion of the interconnector in the via column from the perceived images; and
not executing an assembly cycle on each via column in which an obstruction is identified.

9. A method as defined in claim 1, further comprising:
defining a delivery axis through the insertion nozzle along which the interconnectors are delivered for insertion into the via column;
perceiving images along an optical axis parallel to the delivery axis of the insertion nozzle;
moving the circuit module and the insertion nozzle relative to one another to align an unoccupied via column with the optical axis;
identifying a predetermined amount of misalignment of the vias in the aligned via column from the perceived images; and
not executing an assembly cycle on each via column in which the predetermined amount of misalignment of the vias in the aligned via column is identified.

10. A method as defined in claim 1, further comprising:
establishing the height of the upper circuit board in the circuit module by moving the insertion nozzle vertically to contact the upper circuit board of the circuit module.

11. A method as defined in claim 1, further comprising:
using component location information which defines the location and orientation of electronic components connected to the upper circuit board of the circuit module; and
moving the insertion nozzle vertically toward and away from the upper circuit board during at least some of the assembly cycles executed to avoid contact with the electronic components while assembling the interconnectors in the via columns.

12. A method as defined in claim 1, further comprising:
gripping and cutting the leader portion with a blade member; and
establishing the height of the lower circuit board in the circuit module by moving the blade member vertically to contact the lower circuit board of the circuit module.

13. A method as defined in claim 12, further comprising:
using component location information which defines the location and orientation of electronic components connected to the lower circuit board of the circuit module;
rotating the blade member during at least some of the assembly cycles executed to avoid contact with the electronic components on the lower circuit board while assembling the interconnectors in the via columns.

14. A method as defined in claim 1, wherein each interconnector is a twist pin.

* * * * *